(12) United States Patent
Chen et al.

(10) Patent No.: US 10,763,164 B2
(45) Date of Patent: Sep. 1, 2020

(54) PACKAGE STRUCTURE WITH INDUCTOR AND METHOD OF FORMING THEREOF

(71) Applicant: TAIWAN SEMICONDUCTOR MANUFACTURING CO., LTD., Hsinchu (TW)

(72) Inventors: Chih-Lin Chen, Kaohsiung (TW); Chung-Hao Tsai, Changhua County (TW); Jeng-Shien Hsieh, Kaohsiung (TW); Chuei-Tang Wang, Taichung (TW); Chen-Hua Yu, Hsinchu (TW); Chih-Yuan Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/355,008

(22) Filed: Nov. 17, 2016

(65) Prior Publication Data

US 2018/0138126 A1 May 17, 2018

(51) Int. Cl.
*H01L 23/538* (2006.01)
*H01L 23/48* (2006.01)
(Continued)

(52) U.S. Cl.
CPC ...... *H01L 21/76877* (2013.01); *H01L 21/561* (2013.01); *H01L 21/565* (2013.01); *H01L 23/3121* (2013.01); *H01L 23/49822* (2013.01); *H01L 23/50* (2013.01); *H01L 24/03* (2013.01); *H01L 24/06* (2013.01); *H01L 24/11* (2013.01); *H01L 24/13* (2013.01); *H01F 17/0006* (2013.01); *H01F 2017/0066* (2013.01); *H01F 2017/0086* (2013.01); *H01L 21/568* (2013.01); *H01L 23/3128* (2013.01); *H01L 2224/0231* (2013.01); *H01L 2224/02373* (2013.01);
(Continued)

(58) Field of Classification Search
CPC ............. H01L 23/5386; H01L 41/0233; H01L 21/76877; H01F 27/245; H01F 27/2804; H01F 41/042
See application file for complete search history.

(56) References Cited

U.S. PATENT DOCUMENTS

| | | | |
|---|---|---|---|
| 6,994,650 B2 | 2/2006 | Allen et al. | |
| 7,621,387 B2 | 11/2009 | Lin et al. | |
| 2004/0195647 A1* | 10/2004 | Crawford | H01F 17/0006 257/528 |
| 2007/0205520 A1* | 9/2007 | Chou | H01L 23/3157 257/780 |

(Continued)

FOREIGN PATENT DOCUMENTS

| | | |
|---|---|---|
| CN | 101905690 A | 12/2010 |
| DE | 10 2005 058 821 A1 | 6/2007 |

(Continued)

OTHER PUBLICATIONS

TW Office Action dated Jul. 4, 2017 as received in Application No. 105133353.

*Primary Examiner* — Tucker J Wright
*Assistant Examiner* — Wilner Jean Baptiste
(74) *Attorney, Agent, or Firm* — Maschoff Brennan

(57) ABSTRACT

A package structure includes a first redistribution layer, a molding material, a semiconductor device and an inductor. The molding material is located on the first redistribution layer. The semiconductor device is molded in the molding material. The inductor penetrates through the molding material and electrically connected to the semiconductor device.

20 Claims, 56 Drawing Sheets

(51) Int. Cl.
*H01F 27/245* (2006.01)
*H01L 21/768* (2006.01)
*H01L 23/31* (2006.01)
*H01L 21/56* (2006.01)
*H01L 23/00* (2006.01)
*H01L 23/50* (2006.01)
*H01L 23/498* (2006.01)
*H01F 17/00* (2006.01)

(52) U.S. Cl.
CPC ............ *H01L 2224/0401* (2013.01); *H01L 2224/05024* (2013.01); *H01L 2224/12105* (2013.01); *H01L 2224/1319* (2013.01); *H01L 2224/13023* (2013.01); *H01L 2224/13024* (2013.01); *H01L 2224/13111* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2924/19042* (2013.01); *H01L 2924/19105* (2013.01)

(56) References Cited

U.S. PATENT DOCUMENTS

| | | | | |
|---|---|---|---|---|
| 2008/0246126 | A1* | 10/2008 | Bowles | H01L 23/3114 257/659 |
| 2010/0141370 | A1* | 6/2010 | Lu | H01F 17/0013 336/200 |
| 2013/0122700 | A1* | 5/2013 | Wu | H01L 21/6835 438/613 |
| 2015/0179616 | A1* | 6/2015 | Lin | H01L 25/50 257/773 |
| 2015/0270237 | A1* | 9/2015 | Chi | H01L 23/528 257/737 |
| 2016/0100489 | A1* | 4/2016 | Costa | H01F 27/24 361/764 |
| 2016/0153558 | A1 | 6/2016 | Sten et al. | |
| 2016/0233292 | A1* | 8/2016 | Chen | H01L 28/10 |
| 2017/0221819 | A1* | 8/2017 | Chu | H01L 21/486 |

FOREIGN PATENT DOCUMENTS

| | | |
|---|---|---|
| TW | I293604 B | 2/2008 |
| TW | M525408 U | 7/2016 |

\* cited by examiner

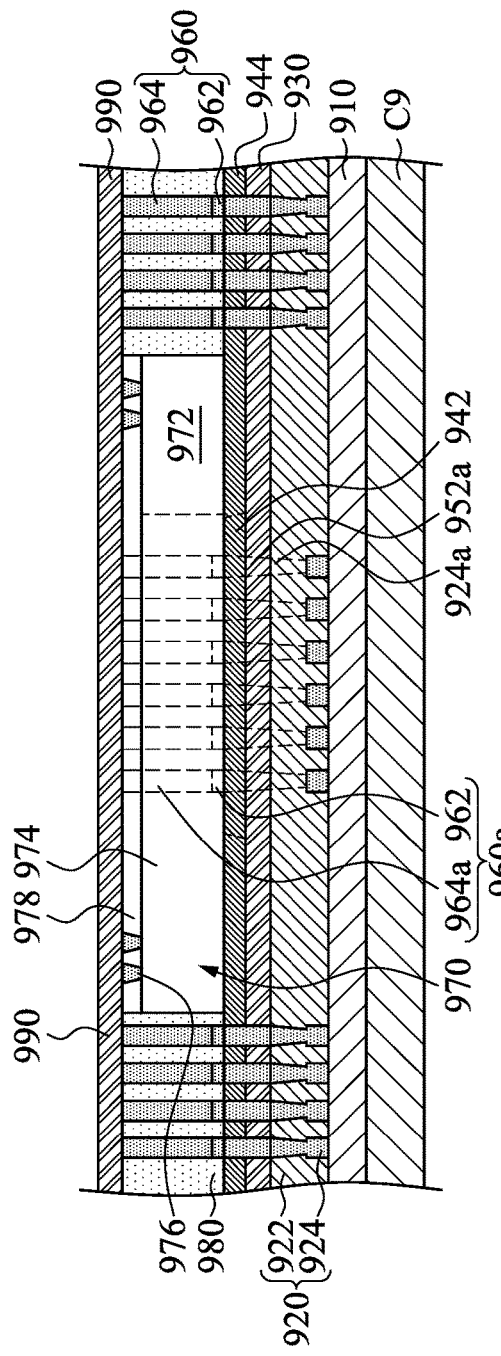
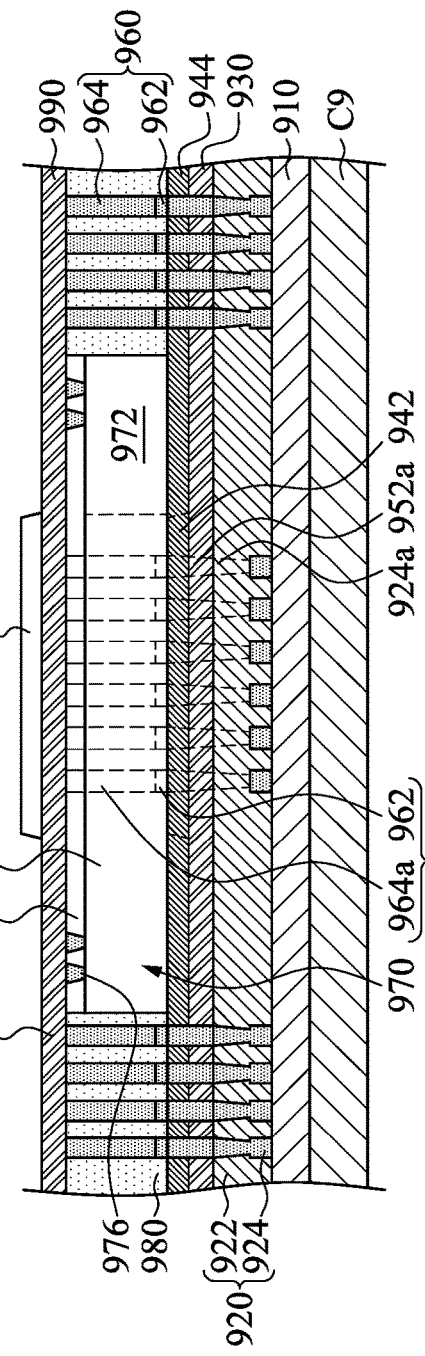
Fig. 83
Fig. 84

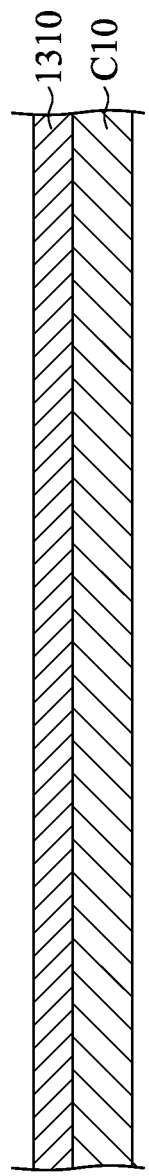
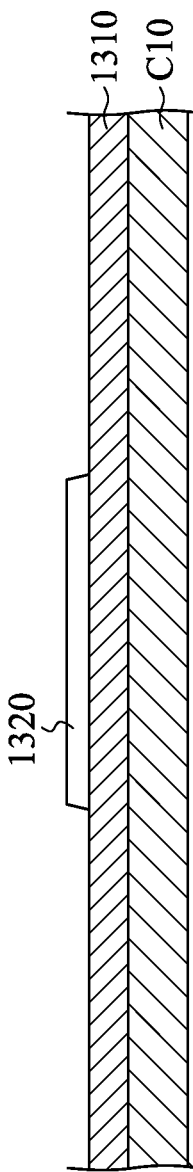
Fig. 90
Fig. 91

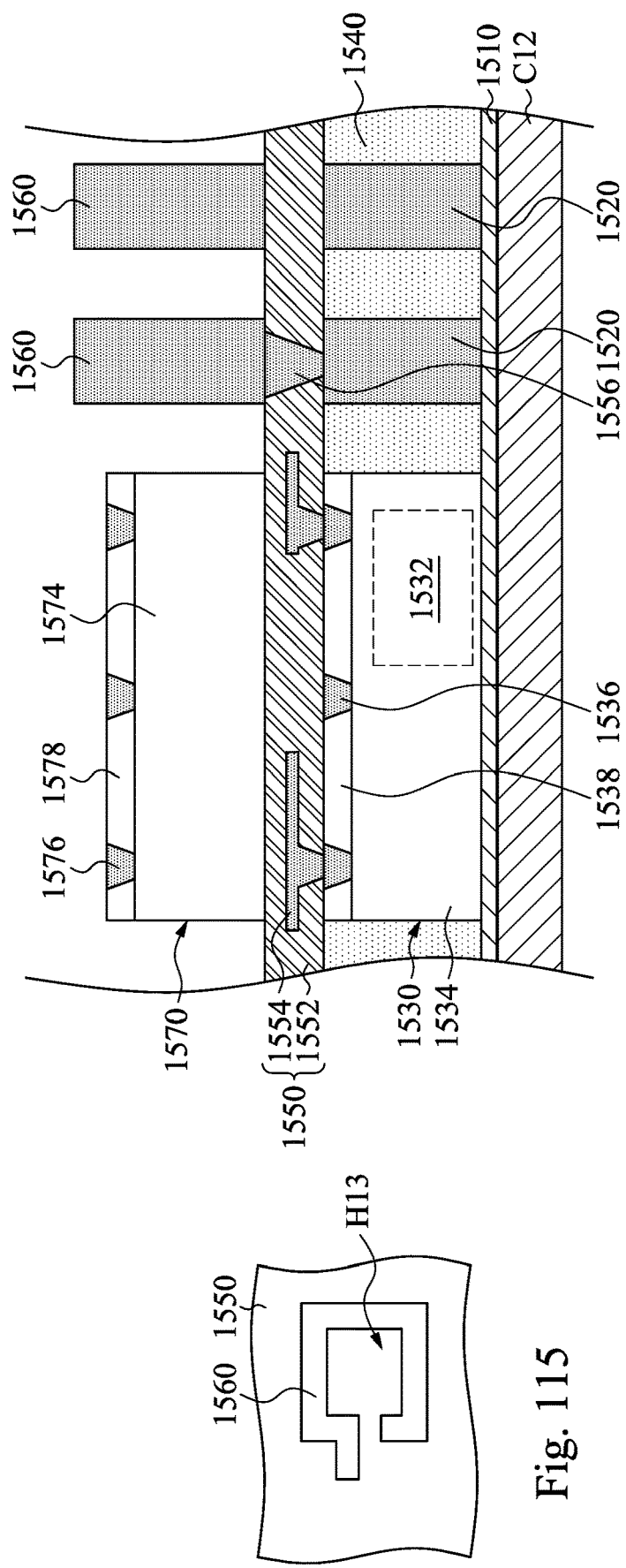

PACKAGE STRUCTURE WITH INDUCTOR AND METHOD OF FORMING THEREOF

BACKGROUND

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications. Some smaller types of packaging for semiconductors include quad flat pack (QFP), pin grid array (PGA), ball grid array (BGA), flip chips (FC), three dimensional integrated circuits (3DICs), wafer level packages (WLPs), bond-on-trace (BOT) packages, and package on package (PoP) structures.

An inductor is a passive electrical component that can store energy in its magnetic field. Inductors are used extensively in analog circuits, signal processing systems, wireless communication systems, and voltage regulator modules of power management IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 70-88 illustrate a method of forming a package structure in accordance with some embodiments of the present disclosure.

FIGS. 90-108 illustrate a method of forming a package structure in accordance with some embodiments of the present disclosure.

FIGS. 109-121 illustrate a method of forming a package structure in accordance with some embodiments of the present disclosure.

DETAILED DESCRIPTION

Figure 1:
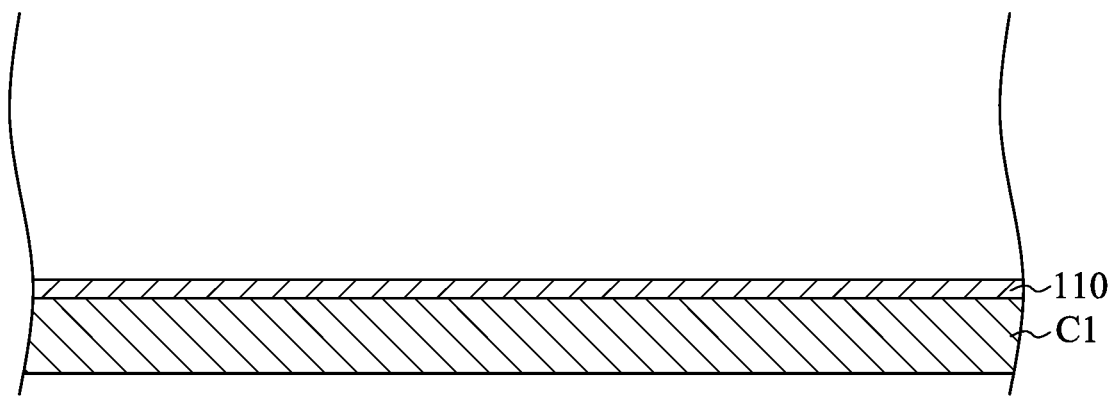
FIGS. 1-14 illustrate a method of forming a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-14 illustrate a method of forming a package structure in accordance with some embodiments of the present disclosure. Referring to FIG. 1, a buffer layer 110 is formed on a carrier C1. The buffer layer 110 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. The buffer layer 110 is a substantially planar layer having a substantially uniform thickness, in which the thickness may be greater than about 2 and may be in a range from about 2 μm to about 40 μm. In some embodiments, top and bottom surfaces of the buffer layer 110 are also substantially planar. The carrier C1 may be a blank glass carrier, a blank ceramic carrier, or the like. In some embodiments, an adhesive layer (not shown) can be formed on the carrier C1, and the buffer layer 110 is formed on the adhesive layer. The adhesive layer may be made of an adhesive, such as ultra-violet (UV) glue, light-to-heat conversion (LTHC) glue, or the like, although other types of adhesives may be used.

Figure 2:
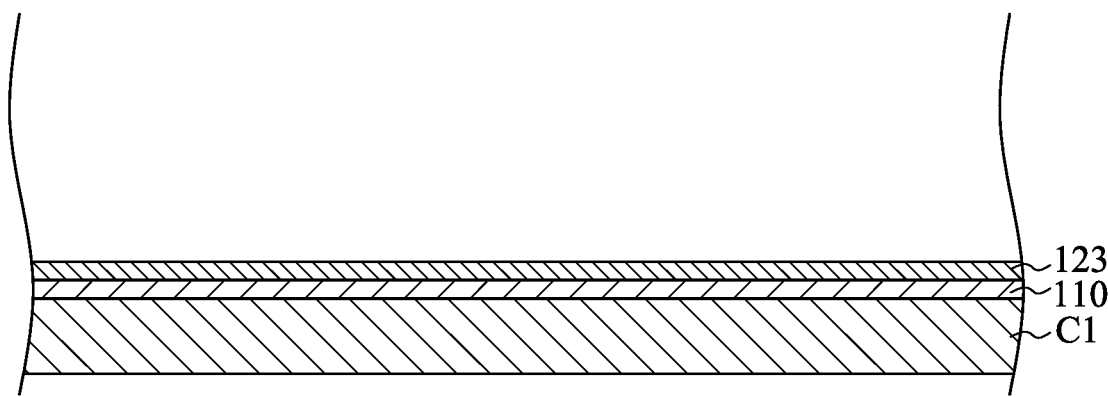

Reference is made to FIG. 2. A seed layer 123 is formed on the buffer layer 110, for example, through physical vapor deposition (PVD) or metal foil laminating. The seed layer 123 may include copper, copper alloy, aluminum, titanium, titanium alloy, or combinations thereof. In some embodiments, the seed layer 123 includes a titanium layer and a copper layer over the titanium layer. In alternative embodiments, the seed layer 123 is a copper layer.

Figure 3:
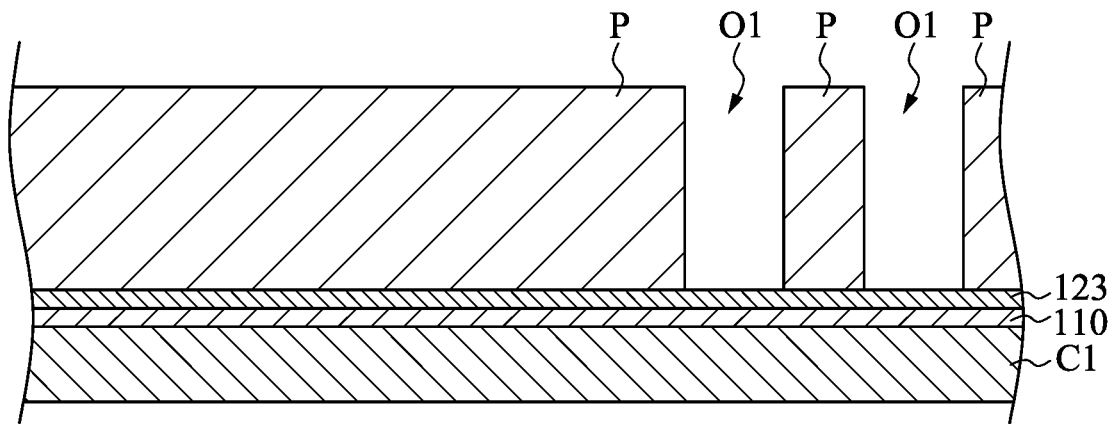
Figure 4:
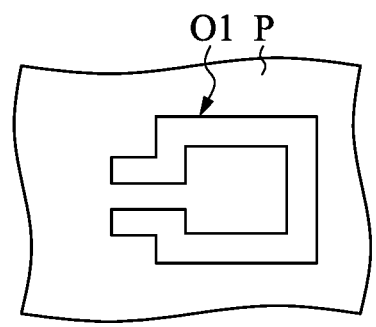

Reference is made to FIG. 3. A photoresist P is applied over the seed layer 123 and is then patterned. As a result, an opening O1 is formed in the photoresist P, through which a portion of the seed layer 123 is exposed. The patterning the photoresist P can create an opening O1 that is formed in a spiral pattern in a top view, as shown in FIG. 4, and such a spiral opening O1 may be beneficial to form a spiral inductor in subsequent processes.

Figure 5:
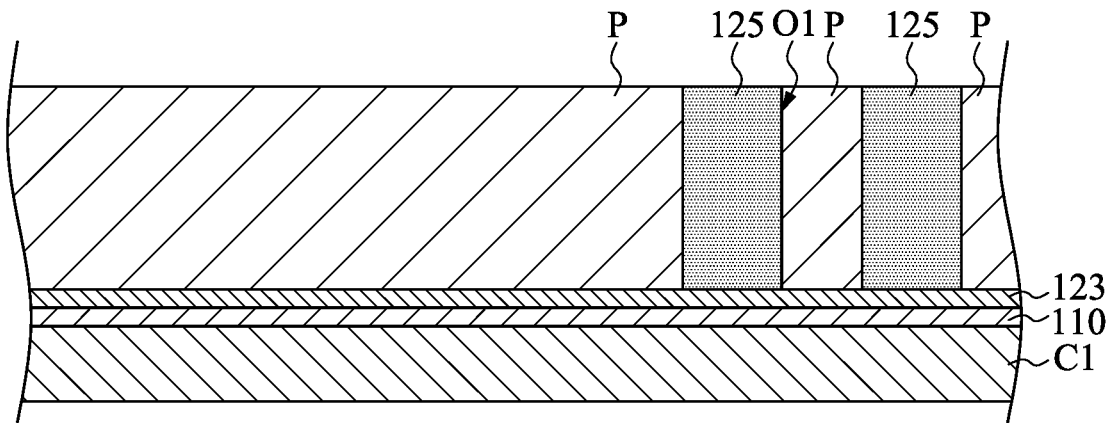
Figure 6:
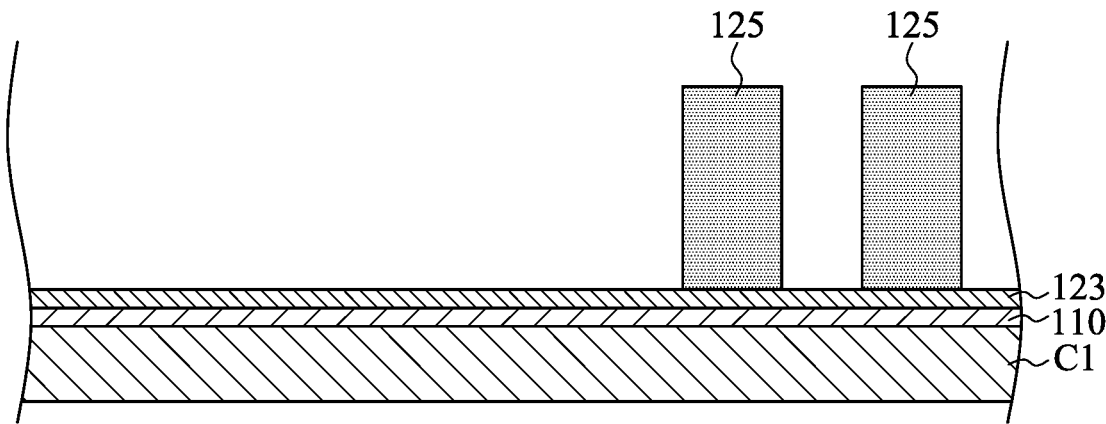

Reference is made to FIG. 5. A conductive feature 125 is formed in opening O1 of the photoresist P through plating, which may be electro plating or electro-less plating. The conductive feature 125 is plated on the exposed portion of the seed layer 123. The conductive feature 125 may include copper, aluminum, tungsten, nickel, solder, or alloys thereof. Height of the conductive feature 125 can be determined by the thickness of the subsequently placed semiconductor device 130 (FIG. 9), with the heights of the conductive feature 125 greater than the thickness of the semiconductor device 130 in some embodiments of the present disclosure. After the plating of the conductive feature 125, the photoresist P is removed, and the resulting structure is shown in FIG. 6. After the photoresist P is removed, some portions of the seed layer 123 are exposed. Although the seed layer 123 is shown as a layer separate from the conductive feature 125, when the seed layer 123 is made of a material similar to or substantially the same as the overlying conductive feature 125, the seed layer 123 may be merged with the conductive feature 125 with no distinguishable interface therebetween. In alternative embodiments, there exist a distinguishable interface between the seed layer 123 and the overlying conductive feature 125.

Figure 7:
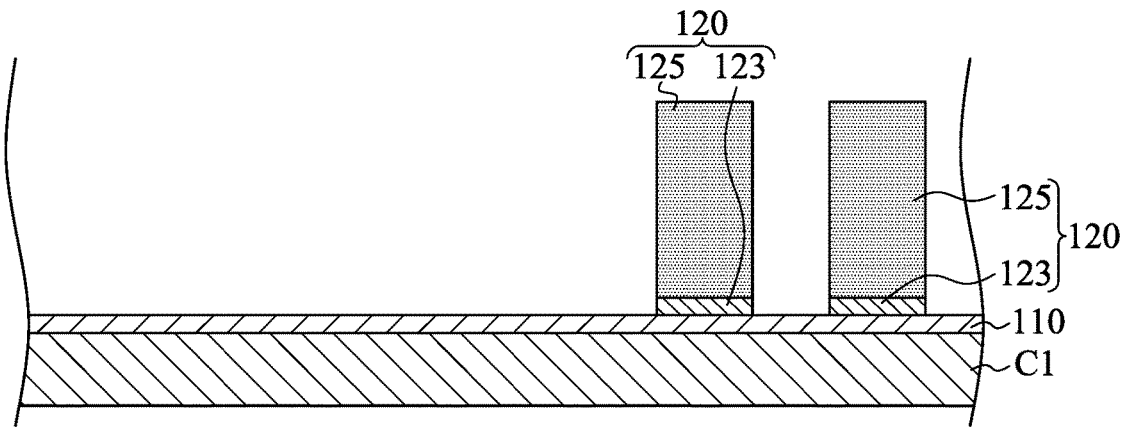

Referring to FIG. 7, an etch step is performed to remove the exposed portions of seed layer 123, wherein the etch step may include an anisotropic etching. A portion of the seed layer 123 that is covered by the conductive feature 125, on the other hand, remains not etched. The conductive feature 125 and the remaining underlying portion of the seed layer 123 are in combination referred to as through integrated fan-out (InFO) via (TIV) 120, which are also referred to as a through-via.

Figure 8:
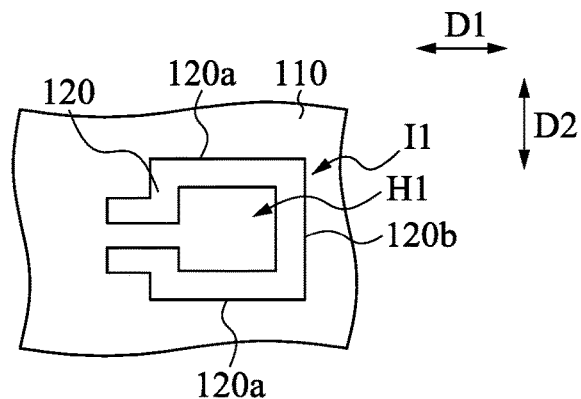

During the patterning the photoresist P (FIGS. 3 and 4), the opening O1 is formed in a spiral pattern in a top view, and therefore, the TIV 120 can be formed in the spiral pattern in top view, as shown in FIG. 8, because the shape of conductive feature 125 can be determined by the spiral opening O1 in the patterned photoresist P. Stated differently, there are TIVs 120a and a conductive feature 120b, which may be a TIV as well, located on the buffer layer 110. The conductive feature 120b extends laterally over a surface of the buffer layer 110 to connect the TIVs 120a, so as to from a spiral pattern. The combined structure of TIVs 120a and conductive feature 120b can be referred to herein as an inductor I1, especially a spiral inductor I1. The TIVs 120a may be formed as walls that stand on the buffer layer 110, and these walls extend substantially in a direction D1. The conductive feature 120b may be formed as a wall that stands on the buffer layer 110 as well, and this wall extends substantially in a direction D2. The directions D1 and D2 are not parallel. That is, the direction D1 intersects the direction D2. The conductive feature 120b is located between the TIVs 120a and connect the TIVs 120a by its opposite ends. The combined structure of TIVs 120a and the conductive feature 120b is formed in a spiral shape in top view and defines a through hole H1 therein, and therefore, the combined structure of TIVs 120a and the conductive feature 120b can be referred to as the spiral inductor I1.

Figure 9:
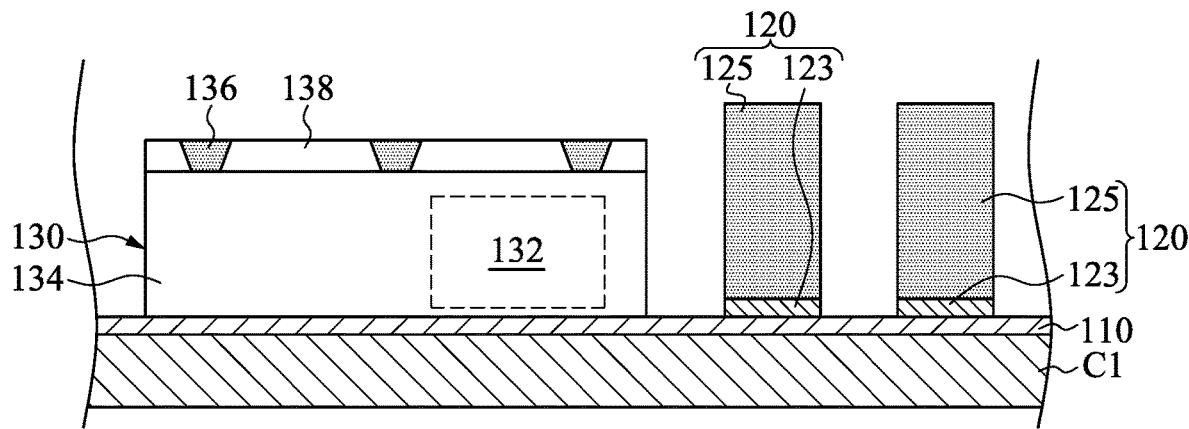

FIG. 9 illustrates placement of a semiconductor device 130 over the buffer layer 110. The semiconductor device 130 may be adhered to the buffer layer 110 through adhesive (not shown). In some embodiments, the semiconductor device 130 includes an unpackaged semiconductor device, i.e. device die. For example, the semiconductor device 130 may be a logic device die including logic transistors therein. In some exemplary embodiments, the semiconductor device 130 may be a central computing unit (CPU) die with a voltage regulator (VR) die 132. The semiconductor device 130 includes a semiconductor substrate 134 (a silicon substrate, for example) that is adhered to the buffer layer 110, wherein the back surface of the semiconductor substrate 134 is in contact with the adhesive on the buffer layer 110.

In some exemplary embodiments, conductive pillars 136 (such as copper posts) are formed as the top portions of the semiconductor device 130, and are electrically coupled to the devices such as transistors (not shown) in the semiconductor device 130. In some embodiments, a dielectric layer 138 is formed on the top surface of the semiconductor device 130, with the conductive pillars 136 having at least lower portions in the dielectric layer 138. The top surfaces of the conductive pillars 136 may be substantially level with the top surface of the dielectric layer 138 in some embodiments. Alternatively, the dielectric layer is not formed, and the conductive pillars 136 protrude from a top dielectric layer (not shown) of the semiconductor device 130.

Figure 10:
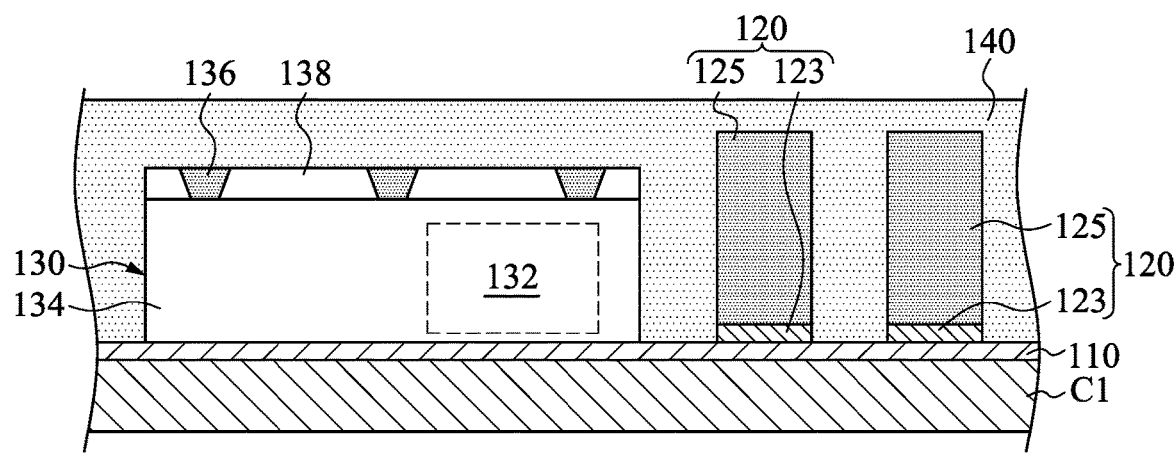

Reference is made to FIG. 10. A molding material 140 is molded on the semiconductor device 130 and the TIV 120. The molding material 140 fills gaps between the semiconductor device 130 and the TIV 120, and may be in contact with the buffer layer 110. Furthermore, the molding material 140 is filled into gaps between the conductive pillars 136 when the conductive pillars 136 are protruding metal pillars (this arrangement is not shown). The top surface of the molding material 140 is higher than the top ends of the conductive pillars 136 and the TIV 120.

In some embodiments, the molding material 140 includes a polymer-based material. The term "polymer" can represent thermosetting polymers, thermoplastic polymers, or any mixtures thereof. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Figure 11:
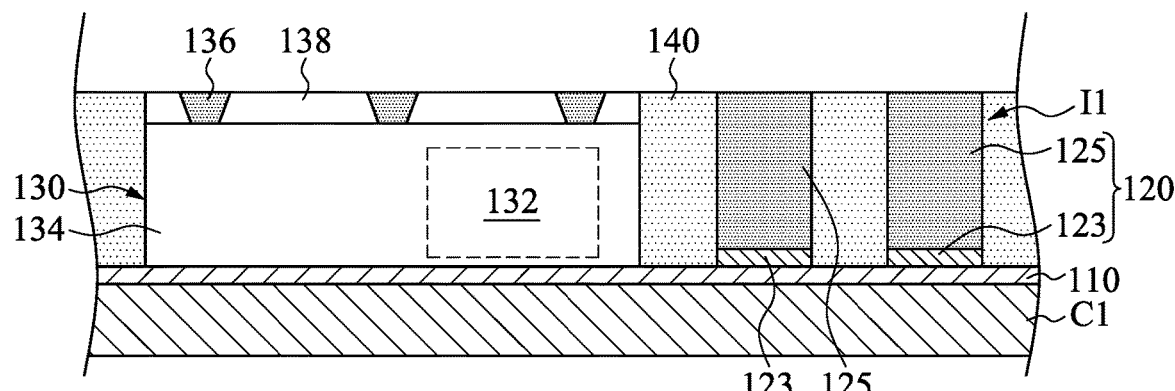

Next, a grinding step is performed to thin the molding material 140, until the conductive pillars 136 and the TIV 120 are exposed. The resulting structure is shown in FIG. 11, in which the molding material 140 is in contact with sidewalls of the semiconductor device 130 and the TIV 120. Due to the grinding, the inductor I1 penetrates through the molding material 140. In other words, the TIVs 120a and the conductive feature 120b shown in FIG. 8 penetrate through the molding material 140. Due to the grinding, a top end of the TIV 120 is substantially level (coplanar) with top ends of the conductive pillars 136, and is substantially level (coplanar) with a top surface of the molding material 140. In other words, a top of the inductor I1 formed by the TIV 120 is substantially level with that of the molding material 140. As a result of the grinding, conductive residues such as metal particles may be generated, and left on the top surface of the structure shown in FIG. 11. Accordingly, after the grinding, a cleaning may be performed, for example, through a wet etching, so that the conductive residues are removed.

Figure 12:
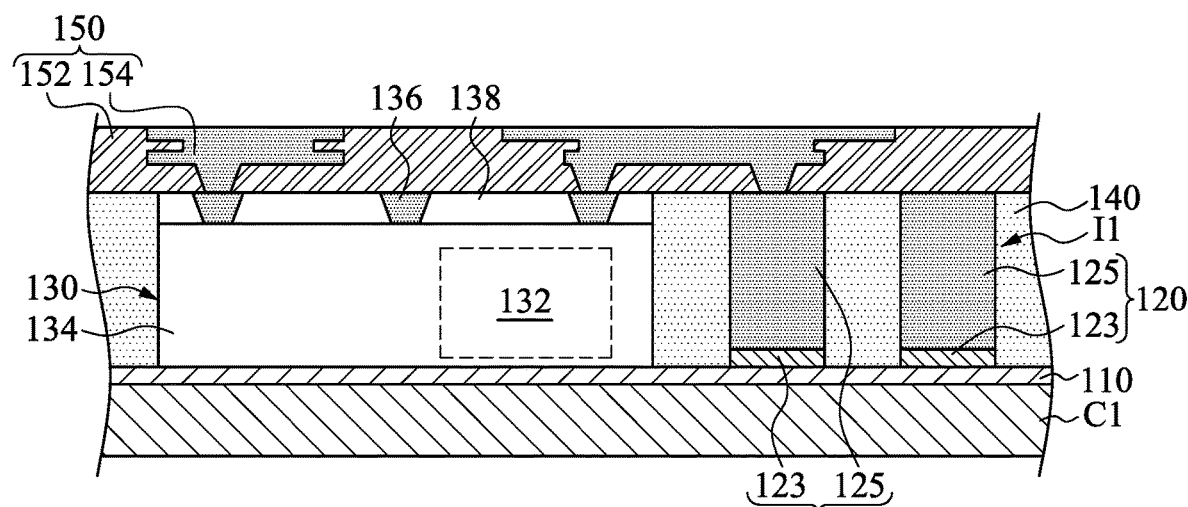

Next, referring to FIG. 12, a redistribution layer (RDL) 150 is formed over the molding material 140. The RDL 150 includes a dielectric structure 152 and a wiring structure 154 located in the dielectric structure 152. The wiring structure 154 is connected to the conductive pillars 136 and the TIV 120. The wiring structure 154 may also interconnect the conductive pillars 136 and the TIV 120. In some embodiments, the formation of one layer of the wiring structure 154 includes forming a blanket copper seed layer, forming and patterning a mask layer over the blanket copper seed layer, performing a plating to form the wiring structure 154, removing the mask layer, and performing a flash etching to remove the portions of the blanket copper seed layer not covered by the wiring structure 154. In alternative embodiments, the RDL 150 is formed by depositing metal layers, patterning the metal layers, and filling gaps between separated portions of the wiring structure 154 with the dielectric structure 152. The wiring structure 154 may include a metal or a metal alloy including aluminum, copper, tungsten, and/or alloys thereof. The dielectric structure 152 in these embodiments may include a polymer such as polyimide, benzocyclobutene (BCB), polybenzoxazole (PBO), or the like. Alternatively, the dielectric structure 152 may include non-organic dielectric materials such as silicon oxide, silicon nitride, silicon carbide, silicon oxynitride, or the like. Amount of the layers of the dielectric structure 152 and the wiring structure 154 can depend on the routing design of the respective package.

Figure 13:
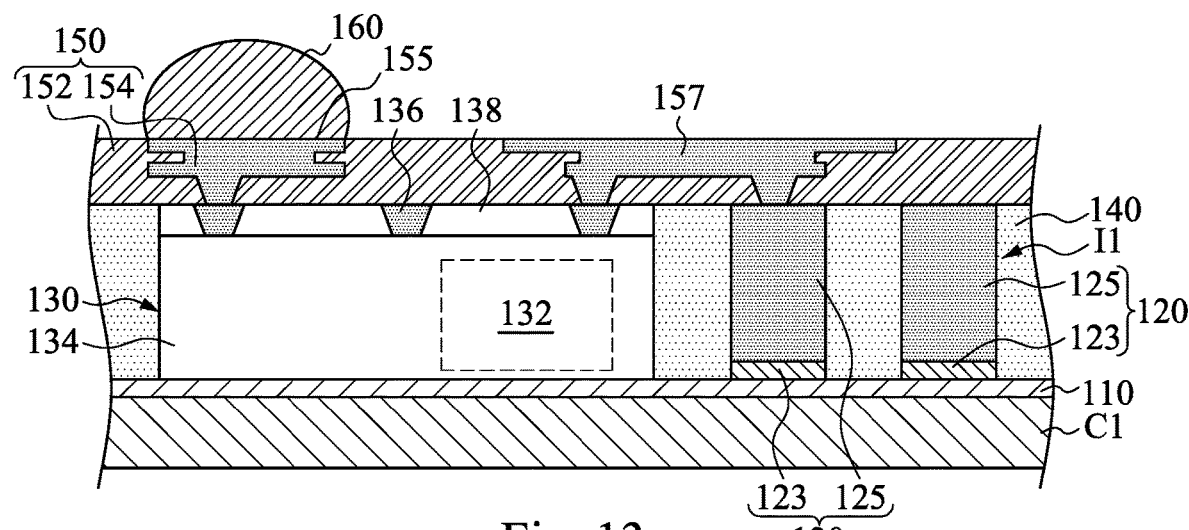

Reference is made to FIG. 13. External connector 160 is formed on a contact pad 155 of the RDL 150. The external connector 160 can include, for example, as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof. In some other embodiments, external connectors 160 may be conductive balls such as solder balls. These solder balls may be arranged in a grid pattern of rows and columns. The external connectors 160 may thus form a ball grid array (BGA). The contact pads 155 of the RDL 150 under the respective external connectors 160 can therefore be referred to as under-ball metallization (UBM) structures. By using the RDL 150, the pitch of conductive pillars 136 of the semiconductor device 130 can be fanned out to the pitch of the external connectors 160. Afterwards, the package structure may be de-bonded from the carrier C1, and the adhesive layer (not shown) between the buffer layer 110 and the carrier C1 is also cleaned from the package structure, and then, the package structure may be sawed into a plurality of package structures. A top view of one resulting structure is shown in FIG. 14.

Figure 14:
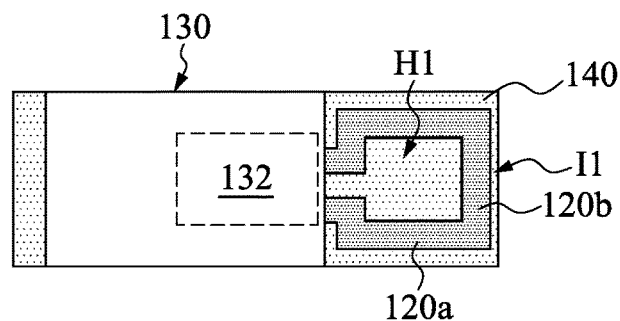

As shown in FIG. 13 and FIG. 14, the inductor I1 penetrates through the molding material 140 and is electrically connected to the semiconductor device 130. For example, the inductor I1 and the conductive pillars 136 can be electrically connected by the wiring structure 154 of the RDL 150. The through hole H1 is filled by the molding material 140 because the inductor I1 is molded in the molding material 140. The conductive feature 120b, which may be a TIV as well, extends laterally over a surface of the RDL 150, so as to connect the TIVs 120a. The combined structure of TIVs 120a and conductive feature 120b forms the spiral inductor I1 that is embedded in the molding material 140 and penetrates through the molding material 140. The inductor I1 and the semiconductor device 130 are together molded in the molding material 140, so this configuration may be beneficial to scale down the package structure incorporating with the inductor I1 therein.

In some embodiments, referring to FIG. 13, the RDL 150 includes a conductive feature 157 electrically connected to the inductor I1. The conductive feature 157 is exposed on one side of the RDL 150 opposite to the molding material 140. For example, the conductive feature 157 is exposed on a top surface of the dielectric structure 152. A top surface of the conductive feature 157 may be substantially level with that of the dielectric structure 152 in some embodiments. The top surface of the conductive feature 157 may protrude with respect to that of the dielectric structure 152 in some other embodiments. Because the conductive feature 157 is exposed on the top surface of the RDL 150, it can be thick enough to reduce a resistance of a current path between the inductor I1 and the semiconductor device 130. That is, the exposed conductive feature 157 can lower the resistance of the current path between the inductor I1 and the semiconductor device 130, and the Q factor of the inductor I1 is thus improved. Moreover, the lower the resistance of the current path between the inductor I1 and the semiconductor device 130 is, the higher the power conversion efficiency of the VR die 132 is. As such, the exposed conductive feature 157 may be also advantageous to increase the power conversion efficiency of the VR die 132.

In some embodiments, the top surface of the conductive feature 157 is lower than a top of the external connector 160, so that the conductive feature 157 can be spatially separated from a device (not shown) attached to the external connector 160. A conductive ball such as the external connector 160 is absent on the conductive feature 157 in some embodiments, so that an electrical connection between the inductor I1 and the device attached to the external connector 160 may not be created.

Figure 15:
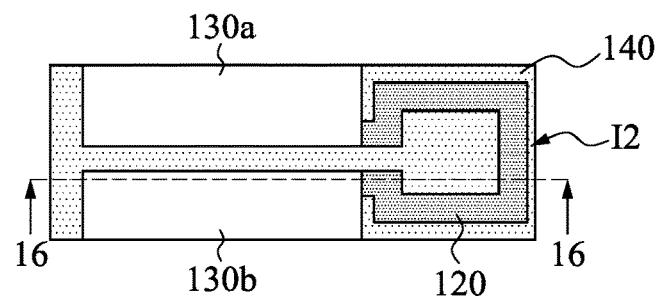
FIG. 15 is a top view of a package structure in accordance with some embodiments of the present disclosure.
Figure 16:
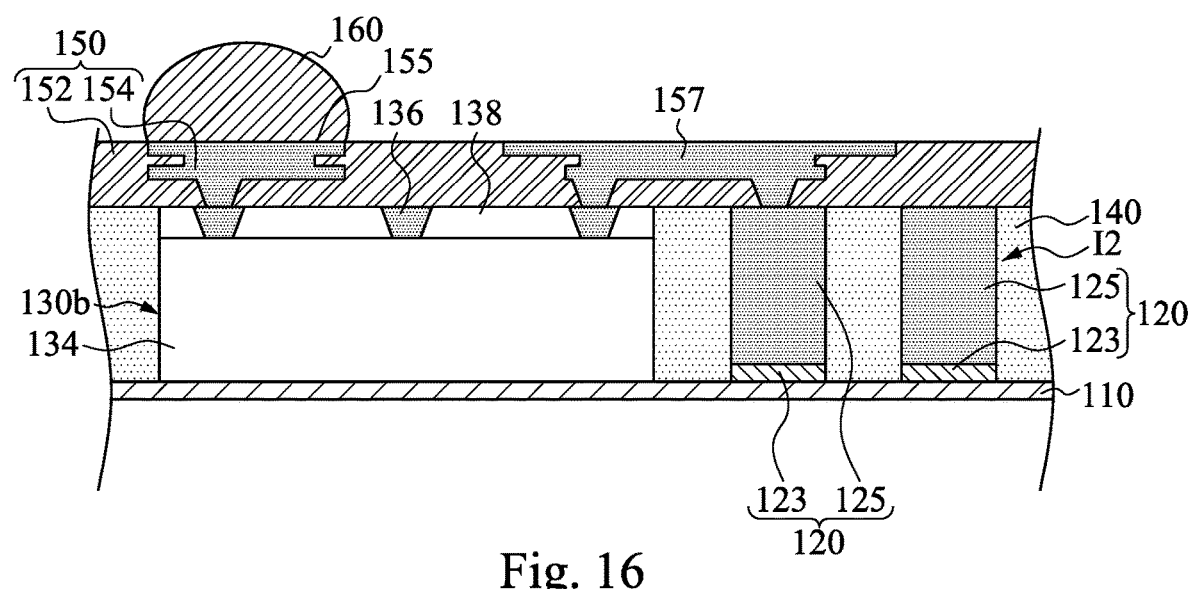
FIG. 16 is a cross-sectional view of the package structure taken along line 16 in FIG. 15.

FIG. 15 is a top view of a package structure in accordance with some embodiments of the present disclosure. FIG. 16 is a cross-sectional view of the package structure taken along line 16 in FIG. 15. As shown in FIG. 15 and FIG. 16, the package structure includes an inductor I2 and semiconductor devices 130a and 130b. The inductor I2 may be a spiral inductor that is molded in the molding material 140 and penetrates through the molding material 140. In other words, the inductor I2 may be formed by the TIV 120 having a spiral pattern. The inductor I2 is connected to the semiconductor devices 130a and 130b. The semiconductor devices 130a and 130b may respectively include, for example, a central computing unit (CPU) die and a voltage regulator (VR) die. In other words, the CPU die and the VR die may be disposed in individual semiconductor devices 130a and 130b in some embodiments.

Figure 17:
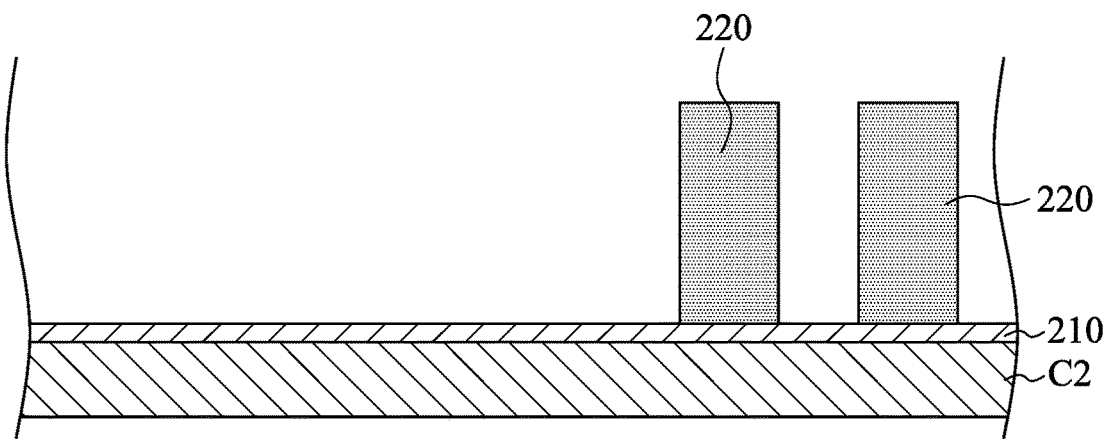
FIGS. 17-24 illustrate a method of forming a package structure in accordance with some embodiments of the present disclosure.

FIGS. 17-24 illustrate a method of forming a package structure in accordance with some embodiments of the present disclosure. Referring to FIG. 17, a buffer layer 210 is formed on a carrier C2. The buffer layer 210 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. The buffer layer 210 is a substantially planar layer having a substantially uniform thickness, in which the thickness may be greater than about 2 μm, and may be in a range from about 2 μm to about 40 μm. In some embodiments, top and bottom surfaces of the buffer layer 210 are also substantially planar. The carrier C2 may be a blank glass carrier, a blank ceramic carrier, or the like. In some embodiments, an adhesive layer (not shown) can be formed on the carrier C2, and the buffer layer 210 is formed on the adhesive layer. The adhesive layer may be made of an adhesive, such as ultra-violet (UV) glue, light-to-heat conversion (LTHC) glue, or the like, although other types of adhesives may be used.

Thereafter, a TIV 220 is formed on the buffer layer 210 and formed in a spiral pattern in a top view, as shown in FIG.

Figure 18:
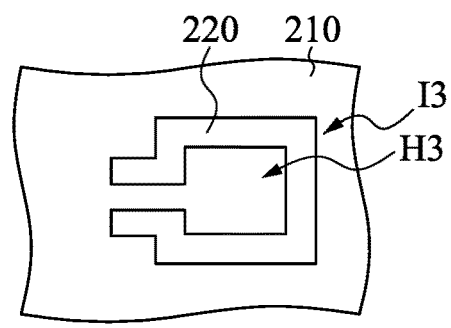

18. The TIV 220 formed in the spiral pattern can be referred to as an inductor I3, especially a spiral inductor I3 having a through hole H3 therein. Formation of the TIV 220 may exemplarily include forming a blanket seed layer on the buffer layer 210, applying a photoresist over the seed layer and patterning the photoresist to form an opening with a spiral pattern, forming a conductive feature in the opening through plating, removing the photoresist to expose portions of the seed layer, and removing the exposed portions of the seed layer using an anisotropic etching. The remaining portion of the seed layer and the overlying conductive feature can be collectively referred to as the TIV 220. The resulting structure is shown in FIGS. 17 and 18.

Figure 19:
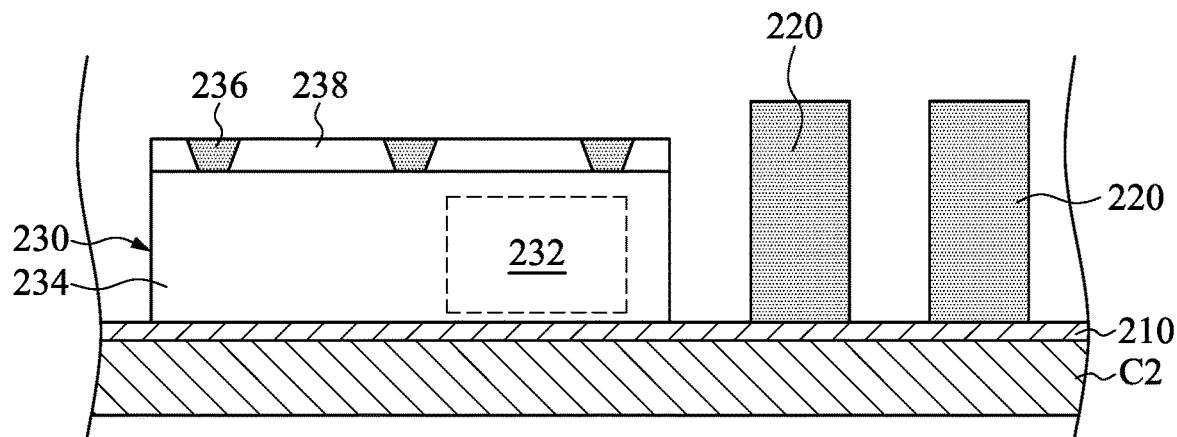

FIG. 19 illustrates placement of a semiconductor device 230 over the buffer layer 210. The semiconductor device 230 may be adhered to the buffer layer 210 through adhesive (not shown). In some embodiments, the semiconductor device 230 includes an unpackaged semiconductor device, i.e. device die. For example, the semiconductor device 230 may be a logic device die including logic transistors therein. In some exemplary embodiments, the semiconductor device 230 may be a central computing unit (CPU) die with a voltage regulator (VR) die 232. In some other embodiments, the CPU die and the VR die may be disposed in individual semiconductor devices. The semiconductor device 230 includes a semiconductor substrate 234 (a silicon substrate, for example) that is adhered to the buffer layer 210, wherein the back surface of the semiconductor substrate 234 is in contact with the adhesive on the buffer layer 210.

In some exemplary embodiments, conductive pillars 236 (such as copper posts) are formed as the top portions of the semiconductor device 230, and are electrically coupled to the devices such as transistors (not shown) in the semiconductor device 230. In some embodiments, a dielectric layer 238 is formed on the top surface of the semiconductor device 230, with the conductive pillars 236 having at least lower portions in the dielectric layer 238. The top surfaces of the conductive pillars 236 may be substantially level with the top surface of the dielectric layer 238 in some embodiments. Alternatively, the dielectric layer is not formed, and the conductive pillars 236 protrude from a top dielectric layer (not shown) of the semiconductor device 230.

Figure 20:
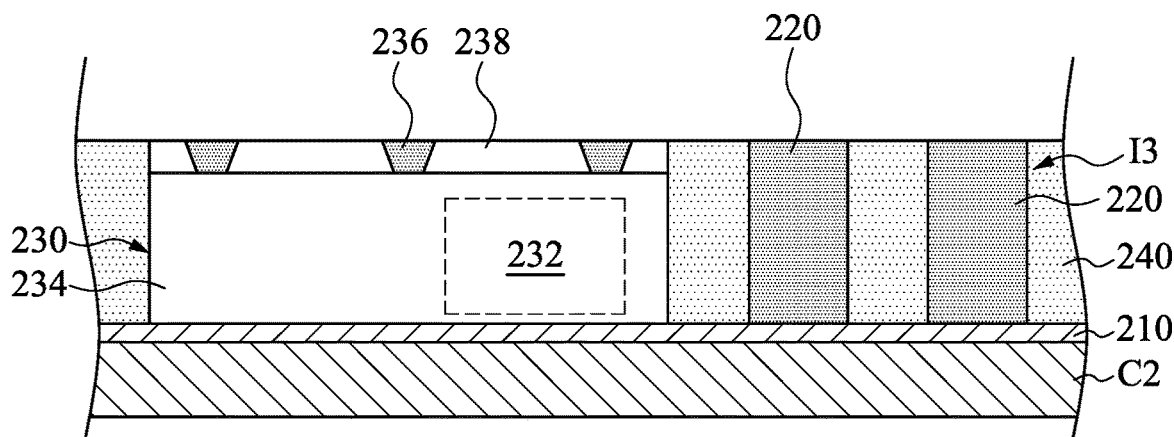

Reference is made to FIG. 20. A molding material 240 is molded on the semiconductor device 230 and the TIV 220. Thereafter, a grinding step is performed to thin the molding material 240, until the conductive pillars 236 and the TIV 220 are exposed, and the resulting structure is shown in FIG. 20. The molding material 240 fills gaps between the semiconductor device 230 and the TIV 220, and may be in contact with the buffer layer 210. Furthermore, the molding material 240 is filled into gaps between the conductive pillars 236 when the conductive pillars 236 are protruding metal pillars (this arrangement is not shown). In some embodiments, the molding material 240 includes a polymer-based material. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Due to the grinding, the inductor I3 penetrates through the molding material 240. Further, due to the grinding, the top end of the TIV 220 is substantially level (coplanar) with the top ends of the conductive pillars 236, and is substantially level (coplanar) with the top surface of the molding material 240. In other words, a top of the inductor I3 formed by the TIV 220 is substantially level with that of the molding material 240. As a result of the grinding, conductive residues such as metal particles may be generated, and left on the top surface of the structure shown in FIG. 20. Accordingly, after the grinding, a cleaning may be performed, for example, through a wet etching, so that the conductive residues are removed.

Figure 21:
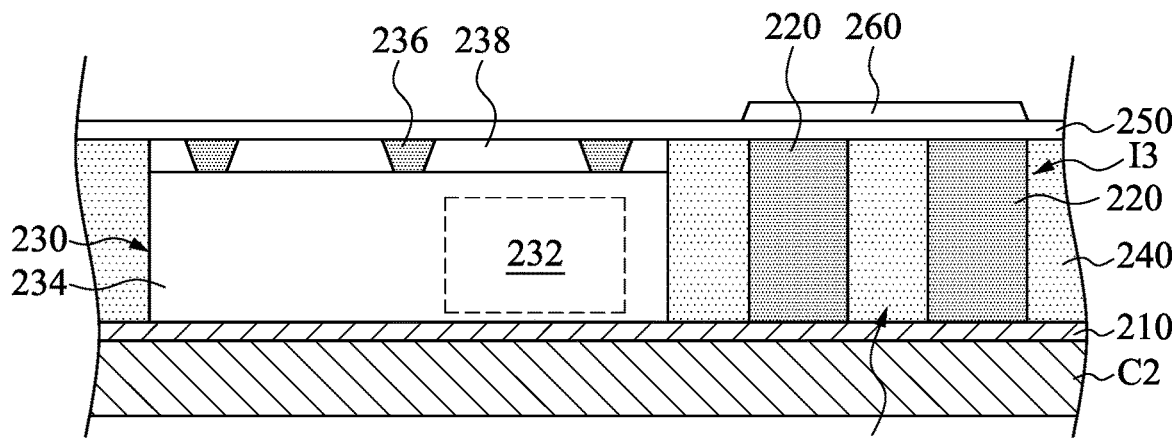

Reference is made to FIG. 21. A dielectric layer 250 is formed on the structure shown in FIG. 20. That is, a blanket dielectric layer 250 caps the TIV 220, the semiconductor device 230 and the molding material 240. Formation of the dielectric layer 250 may exemplarily include deposition, such as physical vapor deposition (PVD) or chemical vapor deposition (CVD). In some embodiments, the dielectric layer 250 is a low temperature silicon nitride layer.

Next, a magnetic film 260 is formed on at least a portion of the dielectric layer 250, and this portion of the dielectric layer 250 overlies the TIV 220. That is, the inductor I3 underlies the magnetic film 260, and they are spaced apart by the dielectric layer 250, so that the magnetic film 260 is arranged projectively over the through hole H3 of the inductor I3 and is electrically insulated there-from by the dielectric layer 250. This magnetic film 260 can serve as a magnetic core for the inductor I3 to increase the magnetic field and thus enhance the inductance of the inductor I3. Accordingly, the inductor I3 can be effectively scaled down due to that the inductance can be increased by the magnetic film 260 located over the through hole H3. Exemplarily formation method of the magnetic film 260 may include forming a blanket magnetic layer over the dielectric layer 250, applying a photoresist over the magnetic layer, patterning the photoresist to expose some portions of the magnetic layer, and performing an etch process on the magnetic layer to remove the exposed portions of the magnetic layer, wherein an etching solution used in the etching process may include HF, $HNO_3$ and water, and the etch process may be operated at a temperature in a range from about 15° C. to about 40° C., as examples.

In some embodiments, the magnetic film 260 includes cobalt (Co), zirconium (Zr), tantalum (Ta), niobium (Nb), rhenium (Re), neodymium (Nd), praseodymium (Pr), nickel (Ni), or dysprosium (Dy). In some embodiments, the magnetic film 260 includes an amorphous cobalt (Co) alloy including cobalt (Co) and zirconium (Zr). Zirconium (Zr) helps make cobalt (Co) amorphous. In some embodiments, the magnetic film 260 includes a cobalt-zirconium (CoZr) alloy having one or more additional elements, such as tantalum (Ta) and niobium (Nb). For example, the magnetic film 260 may be made of CoZrTa (CZT) alloy. In some other embodiments, the magnetic film 260 includes a cobalt-zirconium (CoZr) alloy having one or more additional elements, such as a rare earth element, that help increase the ferromagnetic resonance of the cobalt-zirconium (CoZr) alloy. Rare earth elements include rhenium (Re), neodymium (Nd), praseodymium (Pr), or dysprosium (Dy). In some embodiments, the magnetic film 260 may include other alloys such as permalloy ($Ni_8OFe_2O$), orthnol ($Ni_5OFe_5O$), amorphous CoFeCu, supermalloy (NiFeMo), polymer ferrite materials or other suitable magnetic materials. Polymide filled NiZn and MnZn may also be used to form the magnetic film 260. Although one magnetic film 260 is shown in FIG. 21, there may be multiple magnetic films 260 formed on the dielectric layer 250 depending on a predetermined or desired inductance.

Figure 22:
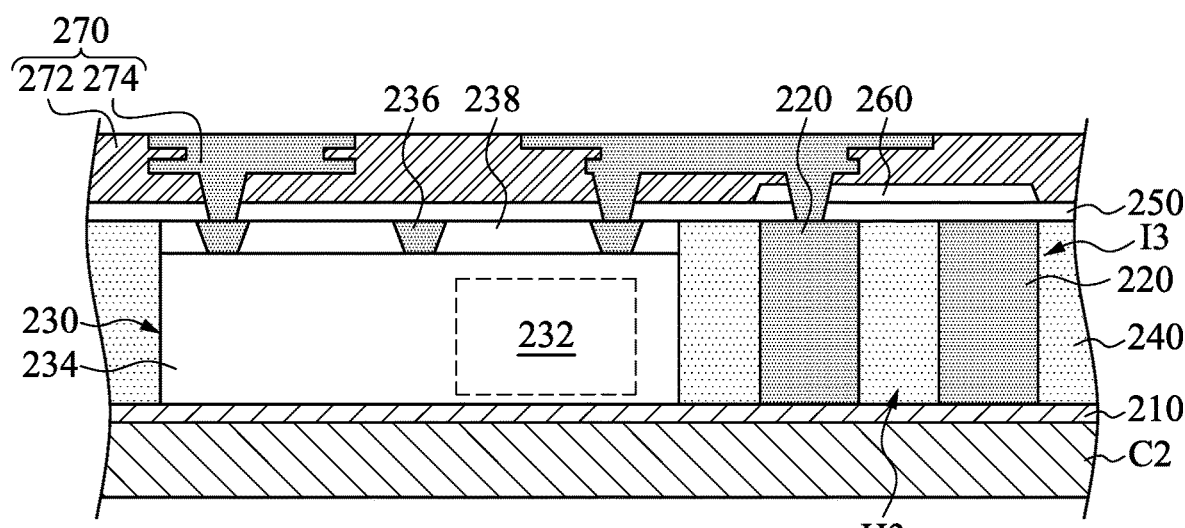

Reference is made to FIG. 22. A redistribution layer (RDL) 270 is formed over the magnetic film 260 and the dielectric layer 250, and after the forming the RDL 270, the magnetic film 260 is located in the RDL 270. The RDL 270 includes a dielectric structure 272 and a wiring structure 274 located in the dielectric structure 272. The wiring structure 274 is connected to the conductive pillars 236 and the TIV 220. The wiring structure 274 may also interconnect the conductive pillars 236 and the TIV 220. In the embodiments where the dielectric layer 250 is a blanket capping layer, the blanket dielectric capping layer 250 is patterned to expose some conductive pillars 236 and some portions of the TIV 220, and then, the RDL 270 is formed, wherein some portions of the wiring structure 274 penetrate through the dielectric layer 250 to connect to the exposed conductive pillars 236 and the exposed portions of the TIV 220. The blanket dielectric capping layer 250 is patterned using a photolithography and etch process, as examples.

In some embodiments, the formation of one layer of the wiring structure 274 includes forming a blanket copper seed layer, forming and patterning a mask layer over the blanket copper seed layer, performing a plating to form the wiring structure 274, removing the mask layer, and performing a flash etching to remove the portions of the blanket copper seed layer not covered by the wiring structure 274. In alternative embodiments, the RDL 270 is formed by depositing metal layers, patterning the metal layers, and filling gaps between separated portions of the wiring structure 274 with the dielectric structure 272. The wiring structure 274 may include a metal or a metal alloy including aluminum, copper, tungsten, and/or alloys thereof. The dielectric structure 272 in these embodiments may include a polymer such as polyimide, benzocyclobutene (BCB), polybenzoxazole (PBO), or the like. Alternatively, the dielectric structure 272 may include non-organic dielectric materials such as silicon oxide, silicon nitride, silicon carbide, silicon oxynitride, or the like. Amount of the layers of the dielectric structure 272 and the wiring structure 274 can depend on the routing design of the respective package.

Figure 23:
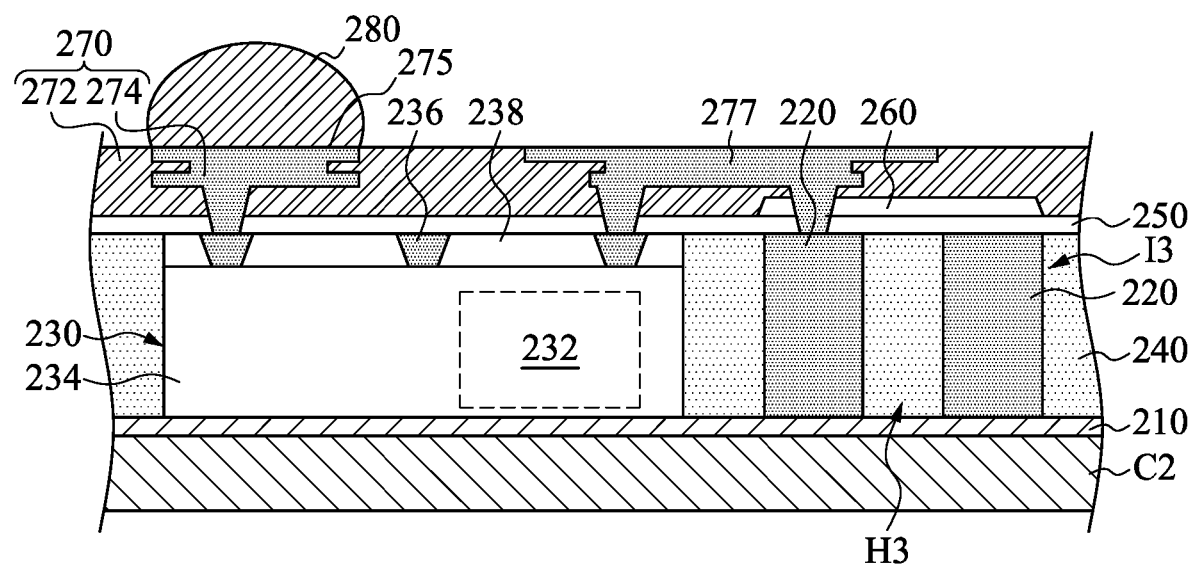

Reference is made to FIG. 23. External connector 280 is formed on a contact pad 275 of the RDL 270. The external connector 280 can include, for example, as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof. In some other embodiments, external connectors 280 may be conductive bumps such as solder balls. These solder balls may be arranged in a grid pattern of rows and columns. The external connectors 280 may thus form a ball grid array (BGA). The contact pads 275 of the RDL 270 under the respective external connectors 280 can therefore be referred to as under-ball metallization (UBM) structures. By using the RDL 270, the pitch of conductive pillars 236 of the semiconductor device 230 can be fanned out to the pitch of the external connectors 280. Afterwards, the package structure may be de-bonded from the carrier C2, and the adhesive layer (not shown) between the buffer layer 210 and the carrier C2 is also cleaned from the package structure, and then, the package structure may be sawed into a plurality of package structures. A top view of one resulting structure is shown in FIG. 24.

Figure 24:
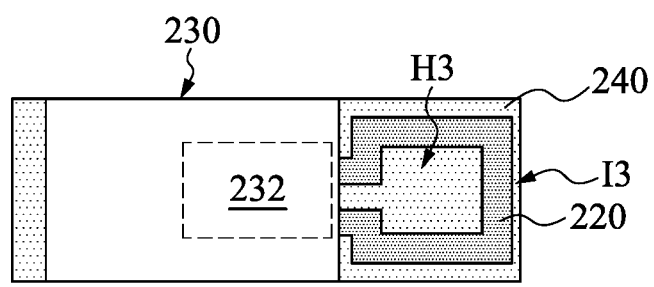

As shown in FIG. 23 and FIG. 24, the inductor I3 penetrates through the molding material 240 and is electrically connected to the semiconductor device 230. For example, the inductor I3 and the conductive pillars 236 can be electrically connected by the wiring structure 274 of the RDL 270. The through hole H3 is filled by the molding material 240 because the inductor I3 is molded in the molding material 240. The inductor I3 and the semiconductor device 230 are together molded in the molding material 240, so that it is beneficial to scale down the package structure incorporating with the inductor I3 therein.

In some embodiments, referring to FIG. 23, the RDL 270 includes a conductive feature 277 electrically connected to the inductor I3. The conductive feature 277 is exposed on one side of the RDL 270 opposite to the molding material 240. For example, the conductive feature 277 is exposed on a top surface of the dielectric structure 272. A top surface of the conductive feature 277 may be substantially level with or may protrude with respect to that of the dielectric structure 272 in some embodiments. Because the conductive feature 277 is exposed on the top surface of the RDL 270, it can be thick enough to reduce a resistance of a current path between the inductor I3 and the semiconductor device 230. That is, the exposed conductive feature 277 can lower the resistance of the current path between the inductor I3 and the semiconductor device 230, and the Q factor of the inductor I3 is thus improved. Moreover, the lower the resistance of the current path between the inductor I3 and the semiconductor device 230 is, the higher the power conversion efficiency of the VR die 232 is. As such, the exposed conductive feature 277 may be also advantageous to increase the power conversion efficiency of the VR die 232.

In some embodiments, the top surface of the conductive feature 277 is lower than a top of the external connector 280, so that the conductive feature 277 can be spatially separated from a device (not shown) attached to the external connector 280. A conductive ball such as the external connector 280 is absent on the conductive feature 277 in some embodiments, so that an electrical connection between the inductor I3 and the device attached to the external connector 280 may not be created.

Figure 25:
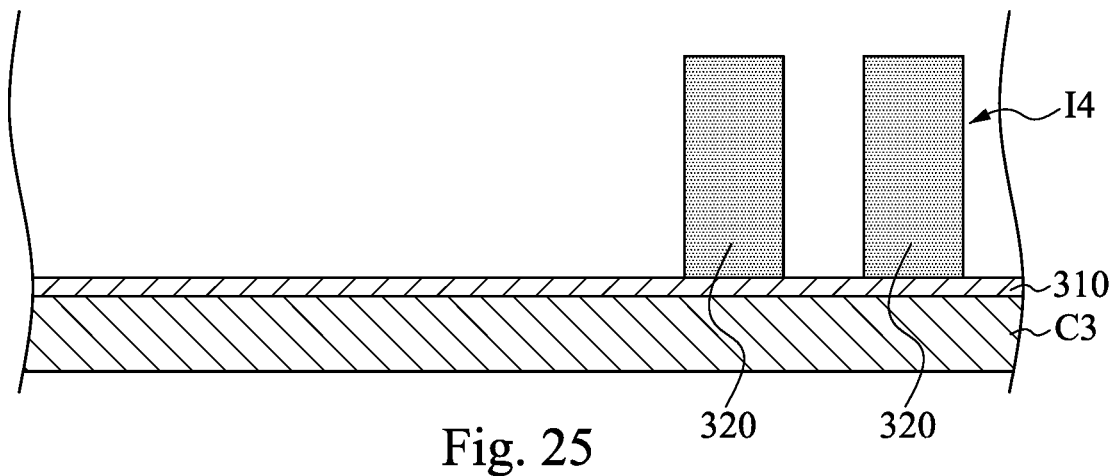
FIGS. 25-31 illustrate a method of forming a package structure in accordance with some embodiments of the present disclosure.

FIGS. 25-31 illustrate a method of forming a package structure in accordance with some embodiments of the present disclosure. Referring to FIG. 25, a buffer layer 310 is formed on a carrier C3. The buffer layer 310 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. The buffer layer 310 is a substantially planar layer having a substantially uniform thickness, in which the thickness may be greater than about 2 μm, and may be in a range from about 2 μm to about 40 μm. In some embodiments, top and bottom surfaces of the buffer layer 310 are also substantially planar. The carrier C3 may be a blank glass carrier, a blank ceramic carrier, or the like. In some embodiments, an adhesive layer (not shown) can be formed on the carrier C3, and the buffer layer 310 is formed on the adhesive layer. The adhesive layer may be made of an adhesive, such as ultra-violet (UV) glue, light-to-heat conversion (LTHC) glue, or the like, although other types of adhesives may be used.

Figure 26:
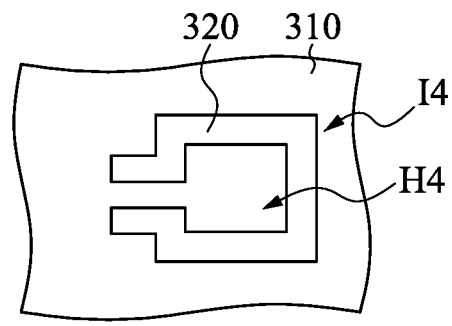

Thereafter, a TIV 320 is formed on the buffer layer 310 and formed in a spiral pattern in a top view, as shown in FIG. 26. The TIV 320 formed in the spiral pattern can be referred to as an inductor I4, especially a spiral inductor I4 having a through hole H4 therein. Formation of the TIV 320 may exemplarily include forming a blanket seed layer on the buffer layer 310, applying a photoresist over the seed layer and patterning the photoresist to form an opening with a spiral pattern, forming a conductive feature in the opening through plating, removing the photoresist to expose portions of the seed layer, and removing the exposed portions of the seed layer using an anisotropic etching. The remaining portion of the seed layer and the overlying conductive feature can be collectively referred to as the TIV 320. The resulting structure is shown in FIGS. 25 and 26.

Figure 27:
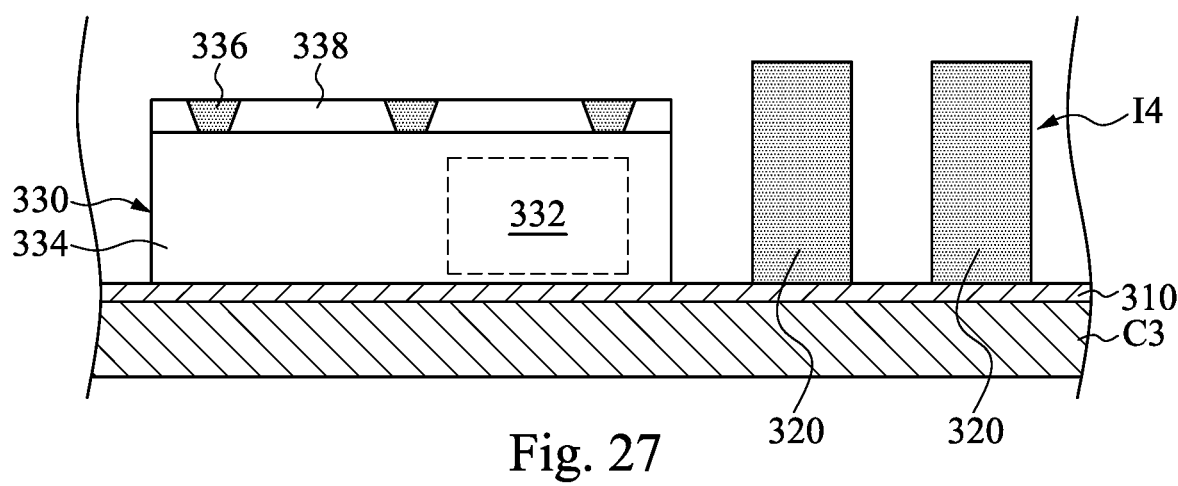

FIG. 27 illustrates placement of a semiconductor device 330 over the buffer layer 310. The semiconductor device 330 may be adhered to the buffer layer 310 through adhesive (not shown). In some embodiments, the semiconductor device 330 includes an unpackaged semiconductor device, i.e. device die. For example, the semiconductor device 330 may be a logic device die including logic transistors therein. In some exemplary embodiments, the semiconductor device 330 may be a central computing unit (CPU) die with a voltage regulator (VR) die 332. In some other embodiments, the CPU die and the VR die may be disposed in individual semiconductor devices. The semiconductor device 330 includes a semiconductor substrate 334 (a silicon substrate, for example) that is adhered to the buffer layer 310, wherein the back surface of the semiconductor substrate 334 is in contact with the adhesive on the buffer layer 310.

In some exemplary embodiments, conductive pillars 336 (such as copper posts) are formed as the top portions of the semiconductor device 330, and are electrically coupled to the devices such as transistors (not shown) in the semiconductor device 330. In some embodiments, a dielectric layer 338 is formed on the top surface of the semiconductor device 330, with the conductive pillars 336 having at least lower portions in the dielectric layer 338. The top surfaces of the conductive pillars 336 may be substantially level with the top surface of the dielectric layer 338 in some embodiments. Alternatively, the dielectric layer is not formed, and the conductive pillars 336 protrude from a top dielectric layer (not shown) of the semiconductor device 330.

Figure 28:
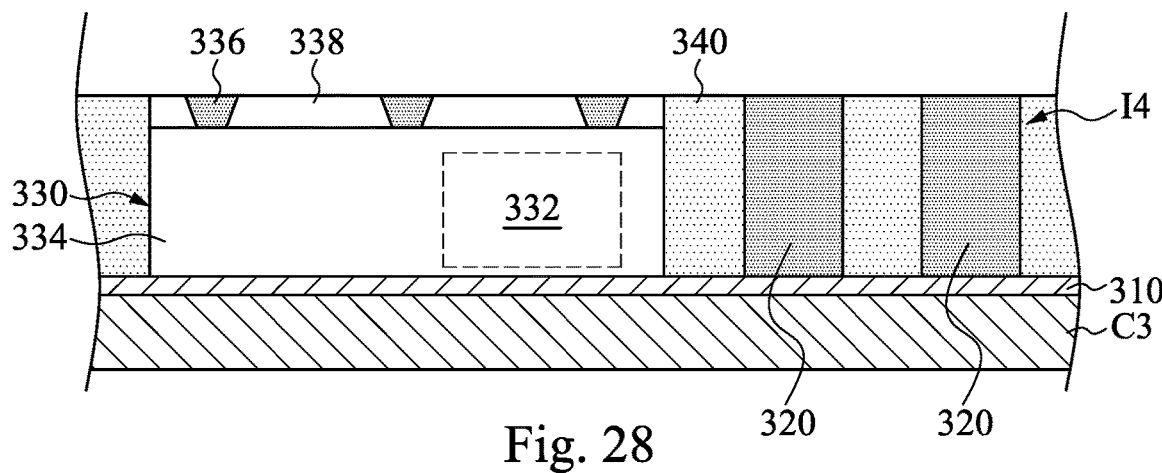

Reference is made to FIG. 28. A molding material 340 is molded on the semiconductor device 330 and the TIV 320. Thereafter, a grinding step is performed to thin the molding material 340, until the conductive pillars 336 and the TIV 320 are exposed, and the resulting structure is shown in FIG. 28. The molding material 340 fills gaps between the semiconductor device 330 and the TIV 320, and may be in contact with the buffer layer 310. Furthermore, the molding material 340 is filled into gaps between the conductive pillars 336 when the conductive pillars 336 are protruding metal pillars (this arrangement is not shown). In some embodiments, the molding material 340 includes a polymer-based material. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Due to the grinding, the inductor I4 penetrates through the molding material 340. Further, due to the grinding, the top end of the TIV 320 is substantially level (coplanar) with the top ends of the conductive pillars 336, and is substantially level (coplanar) with the top surface of the molding material 340. In other words, a top of the inductor I4 formed by the TIV 320 is substantially level with that of the molding material 340. As a result of the grinding, conductive residues such as metal particles may be generated, and left on the top surface of the structure shown in FIG. 28. Accordingly, after the grinding, a cleaning may be performed, for example, through a wet etching, so that the conductive residues are removed.

Figure 29:
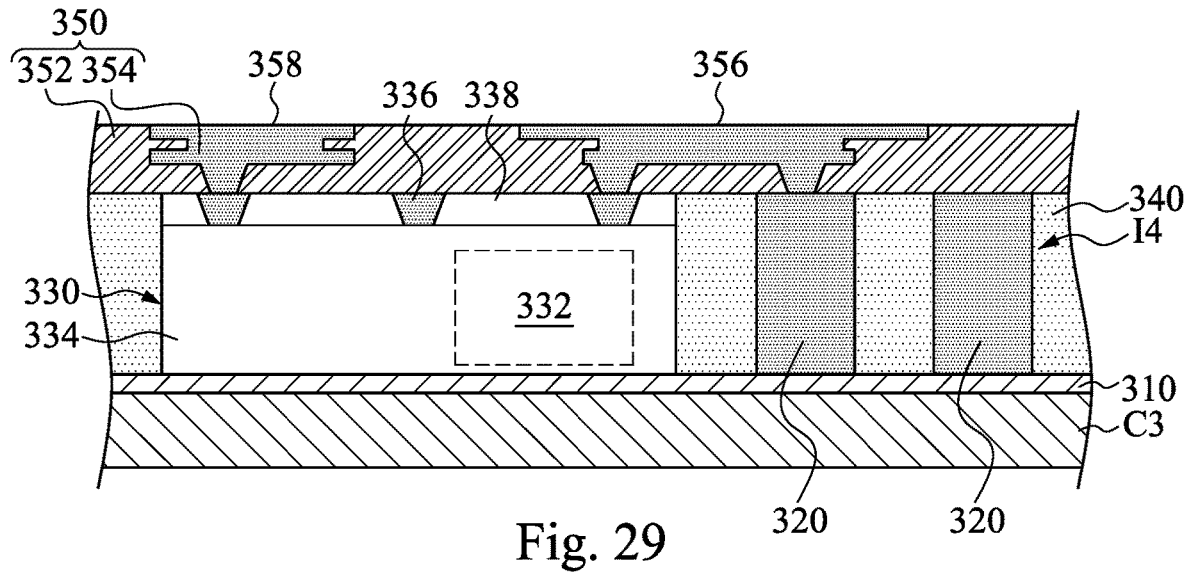

Next, referring to FIG. 29, a redistribution layer (RDL) 350 is formed over the molding material 340. The RDL 350 includes a dielectric structure 352 and a wiring structure 354 located in the dielectric structure 352. The wiring structure 354 is connected to the conductive pillars 336 and the TIV 320. The wiring structure 354 may also interconnect the conductive pillars 336 and the TIV 320. The RDL 350 further includes a first contact pad 356 and a second contact pad 358. The first and second contact pads 356 and 358 are located on one side of the RDL 350 opposite to the molding material 340. The first contact pad 356 is electrically connected to the inductor I4 by the wiring structure 354. The second contact pad 358 is electrically connected to the semiconductor device 330 by the wiring structure 354. The first contact pad 356 has an area greater than that of the second contact pad 358. For example, the first and second contact pads 356 and 358 respectively have surfaces exposed by the dielectric structure 352, and the exposed surface of the first contact pad 356 has an area greater than that of the second contact pad 358. This area difference may be beneficial to make conductive features subsequently formed on the first and second contact pads 356 and 358 have different thicknesses.

In some embodiments, the formation of one layer of the wiring structure 354 includes forming a blanket copper seed layer, forming and patterning a mask layer over the blanket copper seed layer, performing a plating to form the wiring structure 354, removing the mask layer, and performing a flash etching to remove the portions of the blanket copper seed layer not covered by the wiring structure 354. In alternative embodiments, the RDL 350 is formed by depositing metal layers, patterning the metal layers, and filling gaps between separated portions of the wiring structure 354 with the dielectric structure 352. The wiring structure 354 may include a metal or a metal alloy including aluminum, copper, tungsten, and/or alloys thereof. The first and second contact pads 356 and 358 may be under-ball metallization (UBM) structures formed on the wiring structure 354. The wiring structure 354 and first and second contact pads 356 and 358 may have substantially the same material. For example, the first and second contact pads 356 and 358 may also include a metal or a metal alloy including aluminum, copper, tungsten, and/or alloys thereof. The dielectric structure 352 in these embodiments may include a polymer such as polyimide, benzocyclobutene (BCB), polybenzoxazole (PBO), or the like. Alternatively, the dielectric structure 352 may include non-organic dielectric materials such as silicon oxide, silicon nitride, silicon carbide, silicon oxynitride, or the like. Amount of the layers of the dielectric structure 352 and the wiring structure 354 can depend on the routing design of the respective package.

Figure 30:
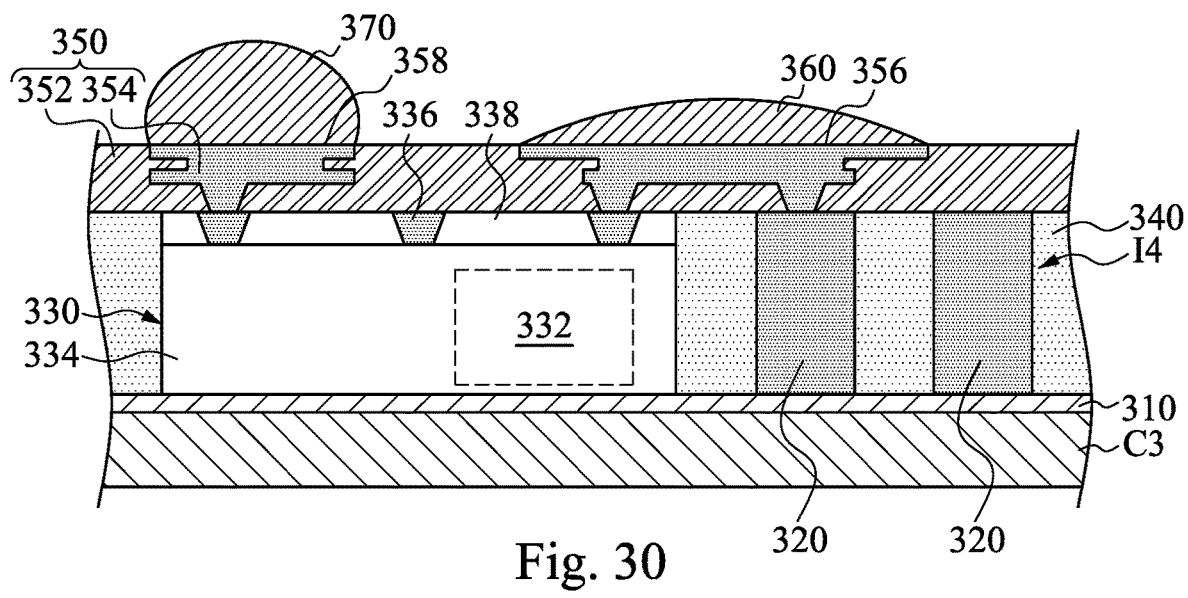

Reference is made to FIG. 30. First and second conductive features 360 and 370 are respectively formed on the first and second contact pads 356 and 358 of the RDL 350. The first and second conductive features 360 and 370 are at least partially located outside the dielectric structure 352. Moreover, the first and second conductive features 360 and 370 protrude with respect to the dielectric structure 352 at different heights. The first conductive feature 360 is electrically connected to the inductor I4 by the underlying first contact pad 356 and the wiring structure 354, so as to reduce a resistance of a current path between the inductor I4 and the semiconductor device 330, and the Q factor of the inductor I4 can be thus improved. Furthermore, the lower the resistance in the current path between the inductor I4 and the semiconductor device 330 is, the higher the power conversion efficiency of the VR die 332 is. As such, the first conductive feature 360 may contribute to the increase of power conversion efficiency of the VR die 332.

The first and second conductive features 360 and 370 may include substantially the same material in some embodiments. The first and second conductive features 360 and 370 can include, for example, as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof. In some other embodiments, the first and second conductive features 360 and 370 may be conductive balls such as solder balls. The formation of the first and second conductive features 360 and 370 may include placing solder balls respectively on the first and second contact pads 356 and 358, and then reflowing the solder balls. As noted previously, the solder ball on the second contact pad 358 is thicker than that on the first contact pad 356 because the second contact pad 358 provides an area less than that that of the first contact pad 356 for placing the solder ball. That is, the second conductive feature 370 is thicker than the first conductive feature 360 due to the area difference between the first and second contact pads 356 and 358. The second conductive feature 370 can serve as an external connector, to which a device (not shown) is attached. Because the second conductive feature 370 is thicker than the first conductive feature 360, a top of the first conductive feature 360 is lower than that of the second conductive feature 370, and the first conductive feature 360 can thus be spatially separated from the device that is attached to the second conductive feature 370, so that an electrical connection between the inductor I4 and the device attached to the second conductive feature 370 may not be created.

The second conductive features 370 may be arranged in a grid pattern of rows and columns and thus form a ball grid array (BGA). By using the RDL 350, the pitch of conductive pillars 336 of the semiconductor device 330 can be fanned out to the pitch of the second conductive features 370. Afterwards, the package structure may be de-bonded from the carrier C3, and the adhesive layer (not shown) between the buffer layer 310 and the carrier C3 is also cleaned from the package structure, and then, the package structure may be sawed into a plurality of package structures. A top view of one resulting structure is shown in FIG. 31.

Figure 31:
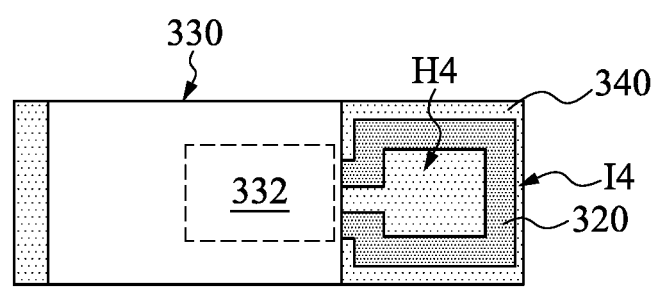

As shown in FIG. 30 and FIG. 31, the inductor I4 penetrates through the molding material 340 and is electrically connected to the semiconductor device 330. For example, the inductor I4 and the conductive pillars 336 can be electrically connected by the wiring structure 354 of the RDL 350. The through hole H4 is filled by the molding material 340 because the inductor I4 is molded in the molding material 340. The inductor I4 and the semiconductor device 330 are together molded in the molding material 340, so it may be beneficial to scale down the package structure incorporating with the inductor I4 therein.

Figure 32:
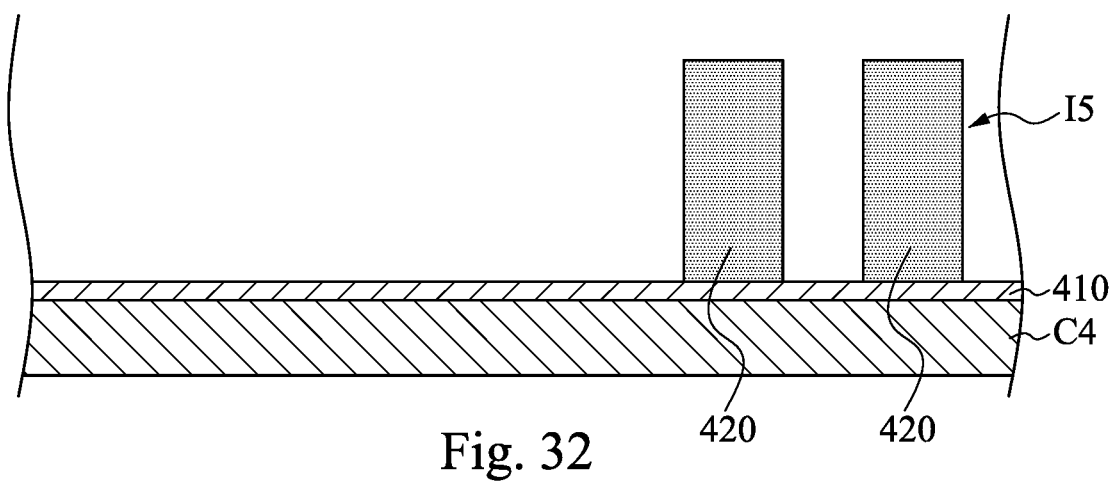
FIGS. 32-39 illustrate a method of forming a package structure in accordance with some embodiments of the present disclosure.

FIGS. 32-39 illustrate a method of forming a package structure in accordance with some embodiments of the present disclosure. Referring to FIG. 32, a buffer layer 410 is formed on a carrier C4. The buffer layer 410 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. The buffer layer 410 is a substantially planar layer having a substantially uniform thickness, in which the thickness may be greater than about 2 μm, and may be in a range from about 2 μm to about 40 μm. In some embodiments, top and bottom surfaces of the buffer layer 410 are also substantially planar. The carrier C4 may be a blank glass carrier, a blank ceramic carrier, or the like. In some embodiments, an adhesive layer (not shown) can be formed on the carrier C4, and the buffer layer 410 is formed on the adhesive layer. The adhesive layer may be made of an adhesive, such as ultra-violet (UV) glue, light-to-heat conversion (LTHC) glue, or the like, although other types of adhesives may be used.

Figure 33:
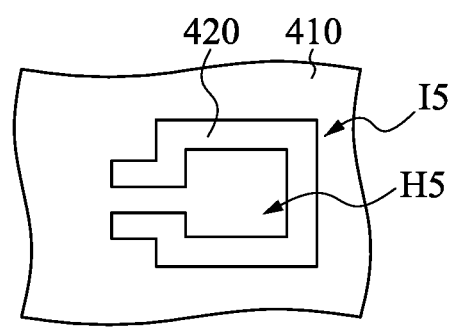

Thereafter, a TIV 420 is formed on the buffer layer 410 and formed in a spiral pattern in a top view, as shown in FIG. 33. The TIV 420 formed in the spiral pattern can be referred to as an inductor I5, especially a spiral inductor I5 having a through hole H5 therein. Formation of the TIV 420 may exemplarily include forming a blanket seed layer on the buffer layer 410, applying a photoresist over the seed layer and patterning the photoresist to form an opening with a spiral pattern, forming a conductive feature in the opening through plating, removing the photoresist to expose portions of the seed layer, and removing the exposed portions of the seed layer using an anisotropic etching. The remaining portion of the seed layer and the overlying conductive feature can be collectively referred to as the TIV 420. The resulting structure is shown in FIGS. 32 and 33.

Figure 34:
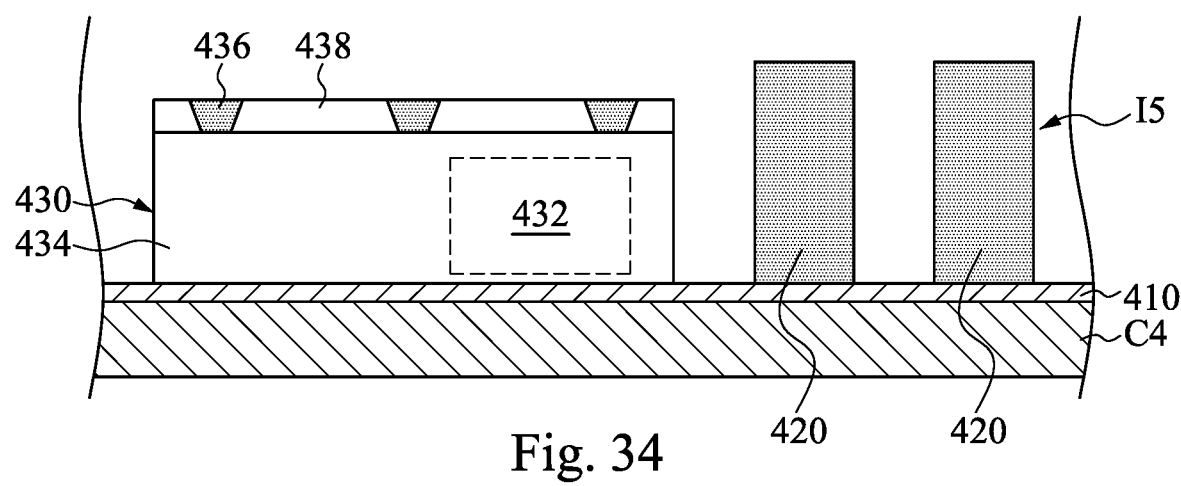

FIG. 34 illustrates placement of a semiconductor device 430 over the buffer layer 410. The semiconductor device 430 may be adhered to the buffer layer 410 through adhesive (not shown). In some embodiments, the semiconductor device 430 includes an unpackaged semiconductor device, i.e. device die. For example, the semiconductor device 430 may be a logic device die including logic transistors therein. In some exemplary embodiments, the semiconductor device 430 may be a central computing unit (CPU) die with a voltage regulator (VR) die 432. In some other embodiments, the CPU die and the VR die may be disposed in individual semiconductor devices. The semiconductor device 430 includes a semiconductor substrate 434 (a silicon substrate, for example) that is adhered to the buffer layer 410, wherein the back surface of the semiconductor substrate 434 is in contact with the adhesive on the buffer layer 410.

In some exemplary embodiments, conductive pillars 436 (such as copper posts) are formed as the top portions of the semiconductor device 430, and are electrically coupled to the devices such as transistors (not shown) in the semiconductor device 430. In some embodiments, a dielectric layer 438 is formed on the top surface of the semiconductor device 430, with the conductive pillars 436 having at least lower portions in the dielectric layer 438. The top surfaces of the conductive pillars 436 may be substantially level with the top surface of the dielectric layer 438 in some embodiments. Alternatively, the dielectric layer is not formed, and the conductive pillars 436 protrude from a top dielectric layer (not shown) of the semiconductor device 430.

Figure 35:
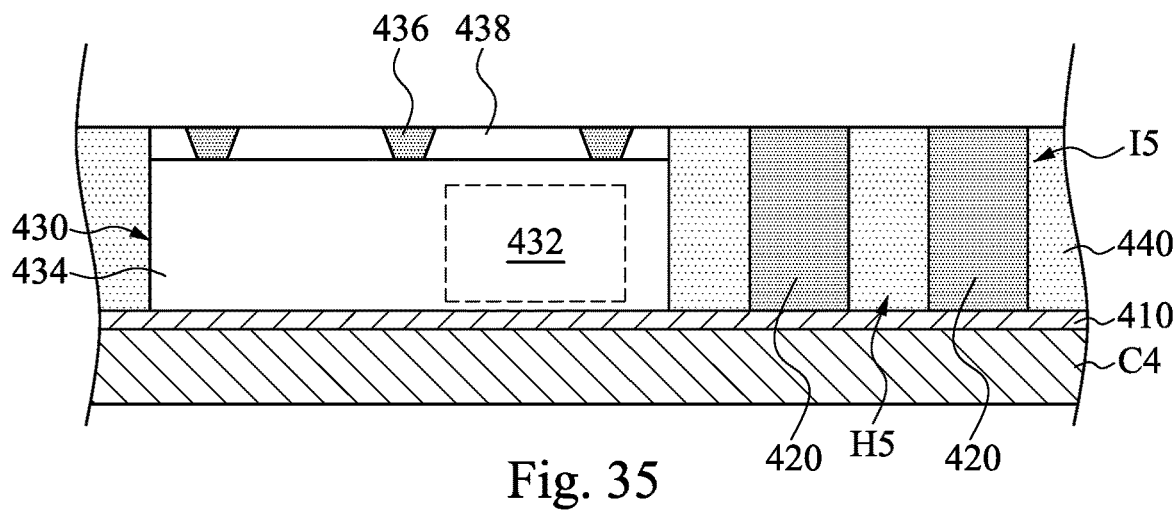

Reference is made to FIG. 35. A molding material 440 is molded on the semiconductor device 430 and the TIV 420. Thereafter, a grinding step is performed to thin the molding material 440, until the conductive pillars 436 and the TIV 420 are exposed, and the resulting structure is shown in FIG. 35. The molding material 440 fills gaps between the semiconductor device 430 and the TIV 420, and may be in contact with the buffer layer 410. Furthermore, the molding material 440 is filled into gaps between the conductive pillars 436 when the conductive pillars 436 are protruding metal pillars (this arrangement is not shown). In some embodiments, the molding material 440 includes a polymer-based material. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Due to the grinding, the inductor I5 penetrates through the molding material 440. Further, due to the grinding, the top end of the TIV 420 is substantially level (coplanar) with the top ends of the conductive pillars 436, and is substantially level (coplanar) with the top surface of the molding material 440. In other words, a top of the inductor I5 formed by the TIV 420 is substantially level with that of the molding material 440. As a result of the grinding, conductive residues such as metal particles may be generated, and left on the top surface of the structure shown in FIG. 35. Accordingly, after the grinding, a cleaning may be performed, for example, through a wet etching, so that the conductive residues are removed.

Figure 36:
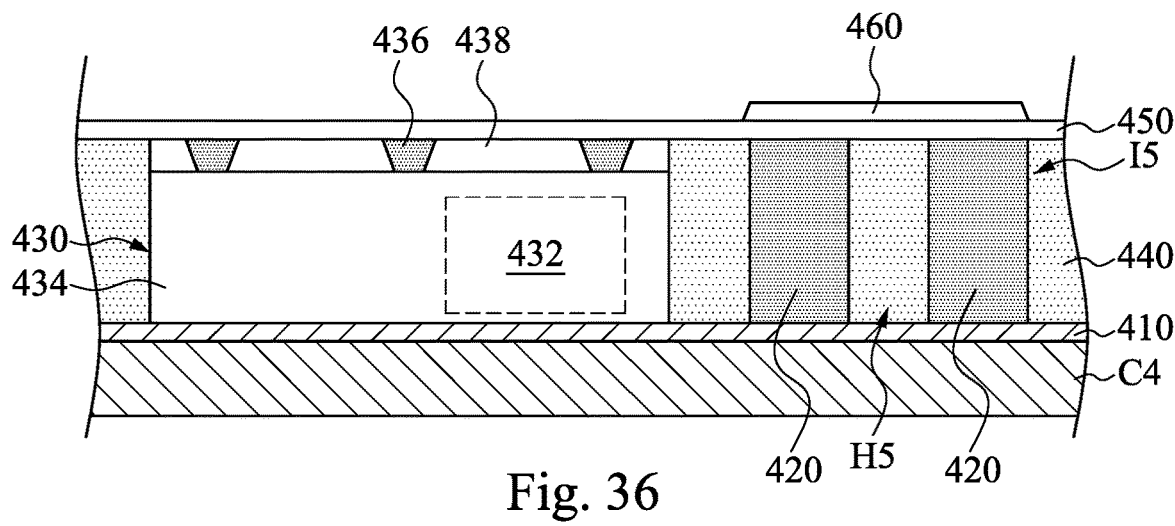

Reference is made to FIG. 36. A dielectric layer 450 is formed on the structure shown in FIG. 35. That is, a blanket dielectric layer 450 caps the TIV 420, the semiconductor device 430 and the molding material 440. Formation of the dielectric layer 450 may exemplarily include deposition, such as physical vapor deposition (PVD) or chemical vapor deposition (CVD). In some embodiments, the dielectric layer 450 is a low temperature silicon nitride layer.

Next, a magnetic film 460 is formed on at least a portion of the dielectric layer 450, and this portion of the dielectric layer 450 overlies the TIV 420. That is, the inductor I5 underlies the magnetic film 460, and they are spaced apart by the dielectric layer 450, so that the magnetic film 460 is located on the through hole H5 of the inductor I5 and is electrically insulated from the inductor I5 by the dielectric layer 450. This magnetic film 460 can serve as a magnetic core for the inductor I5 to increase the magnetic field and thus improve the inductance of the inductor I5. Moreover, the inductor I5 can be scaled down due to that the inductance can be increased by the magnetic film 460 located on the through hole H5. In other words, the TIV 420 can be formed in a scaled down spiral pattern, which may be advantageous to scale down the package structure. Exemplarily formation method of the magnetic film 460 may include forming a blanket magnetic layer over the dielectric layer 450, applying a photoresist over the magnetic layer, patterning the photoresist to expose some portions of the magnetic layer, and performing an etch process on the magnetic layer to remove the exposed portions of the magnetic layer, wherein an etching solution used in the etching process may include HF, $HNO_3$ and water, and the etch process may be operated at a temperature in a range from about 15° C. to about 40° C., as examples.

In some embodiments, the magnetic film 460 includes cobalt (Co), zirconium (Zr), tantalum (Ta), niobium (Nb), rhenium (Re), neodymium (Nd), praseodymium (Pr), nickel (Ni), or dysprosium (Dy). In some embodiments, the magnetic film 260 includes an amorphous cobalt (Co) alloy including cobalt (Co) and zirconium (Zr). Zirconium (Zr) helps make cobalt (Co) amorphous. In some embodiments, the magnetic film 460 includes a cobalt-zirconium (CoZr) alloy having one or more additional elements, such as tantalum (Ta) and niobium (Nb). For example, the magnetic film 460 may be made of CoZrTa (CZT) alloy. In some other embodiments, the magnetic film 460 includes a cobalt-zirconium (CoZr) alloy having one or more additional elements, such as a rare earth element, that help increase the ferromagnetic resonance of the cobalt-zirconium (CoZr) alloy. Rare earth elements include rhenium (Re), neodymium (Nd), praseodymium (Pr), or dysprosium (Dy). In some embodiments, the magnetic film 460 may include other alloys such as permalloy ($Ni_8OFe_2O$), orthnol ($Ni_5OFe_5O$), amorphous CoFeCu, supermalloy (NiFeMo), polymer ferrite materials or other suitable magnetic materials. Although one magnetic film 460 is shown in FIG. 36, there may be multiple magnetic films 460 formed on the dielectric layer 450 depending on a predetermined or desired inductance.

Figure 37:
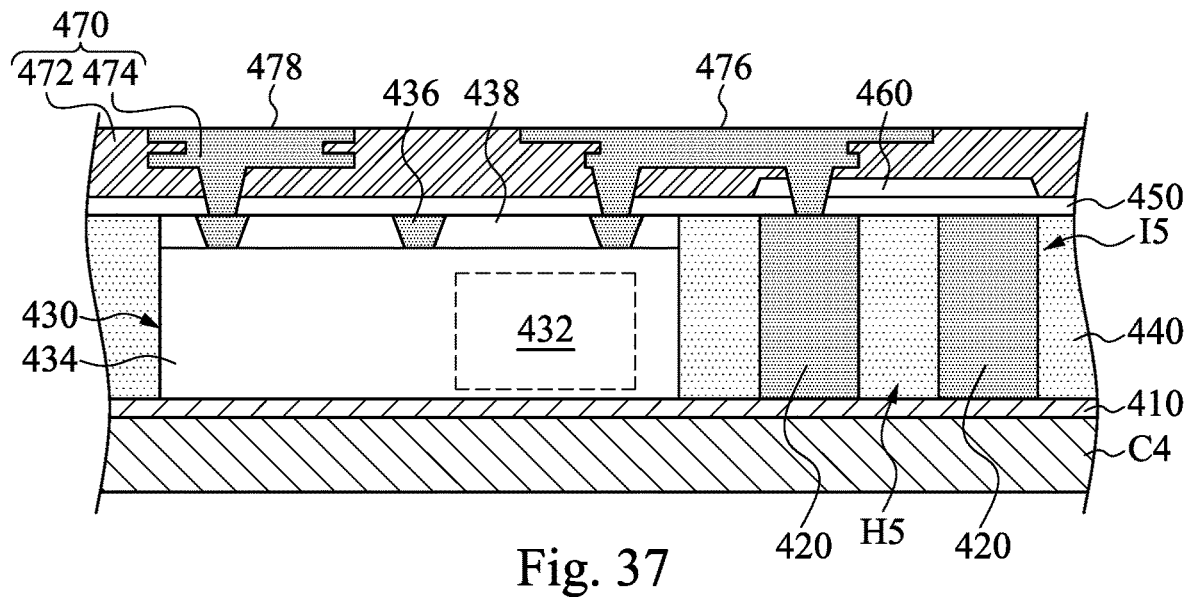

Reference is made to FIG. 37. A redistribution layer (RDL) 470 is formed over the magnetic film 460 and a dielectric layer 450, and after the forming the RDL 470, the magnetic film 460 is located in the RDL 470. The RDL 470 includes a dielectric structure 472 and a wiring structure 474 located in the dielectric structure 472. The wiring structure 474 is connected to the conductive pillars 436 and the TIV 420. The wiring structure 474 may also interconnect the conductive pillars 436 and the TIV 420. In the embodiments where the dielectric layer 450 is a blanket capping layer, the blanket dielectric capping layer 450 is patterned to expose some conductive pillars 436 and some portions of the TIV 420, and then, the RDL 470 is formed, wherein some portions of the wiring structure 474 penetrate through the dielectric layer 450 to connect to the exposed conductive pillars 436 and the exposed portions of the TIV 420. The blanket dielectric capping layer 450 is patterned using a photolithography and etch process, as examples.

The RDL 470 further includes a first contact pad 476 and a second contact pad 478. The first and second contact pads 476 and 478 are located on one side of the RDL 470 opposite to the molding material 440. The first contact pad 476 is electrically connected to the inductor I5 by the wiring structure 474. The second contact pad 478 is electrically connected to the semiconductor device 430 by the wiring structure 474. The first contact pad 476 has an area greater than that of the second contact pad 478. For example, the first and second contact pads 476 and 478 respectively have surfaces exposed by the dielectric structure 472, and the exposed surface of the first contact pad 476 has an area greater than that of the second contact pad 478. This area difference may be beneficial to make conductive features subsequently formed on the first and second contact pads 476 and 478 have different thicknesses.

In some embodiments, the formation of one layer of the wiring structure 474 includes forming a blanket copper seed layer, forming and patterning a mask layer over the blanket copper seed layer, performing a plating to form the wiring structure 474, removing the mask layer, and performing a flash etching to remove the portions of the blanket copper seed layer not covered by the wiring structure 474. In alternative embodiments, the RDL 470 is formed by depositing metal layers, patterning the metal layers, and filling gaps between separated portions of the wiring structure 474 with the dielectric structure 472. The wiring structure 474 may include a metal or a metal alloy including aluminum, copper, tungsten, and/or alloys thereof. The first and second contact pads 476 and 478 may be under-ball metallization (UBM) structures formed on the wiring structure 474. The wiring structure 474 and first and second contact pads 476 and 478 may have substantially the same material. For example, the first and second contact pads 476 and 478 may also include a metal or a metal alloy including aluminum, copper, tungsten, and/or alloys thereof. The dielectric structure 472 in these embodiments may include a polymer such as polyimide, benzocyclobutene (BCB), polybenzoxazole (PBO), or the like. Alternatively, the dielectric structure 472 may include non-organic dielectric materials such as silicon oxide, silicon nitride, silicon carbide, silicon oxynitride, or the like. Amount of the layers of the dielectric structure 472 and the wiring structure 474 can depend on the routing design of the respective package.

Figure 38:
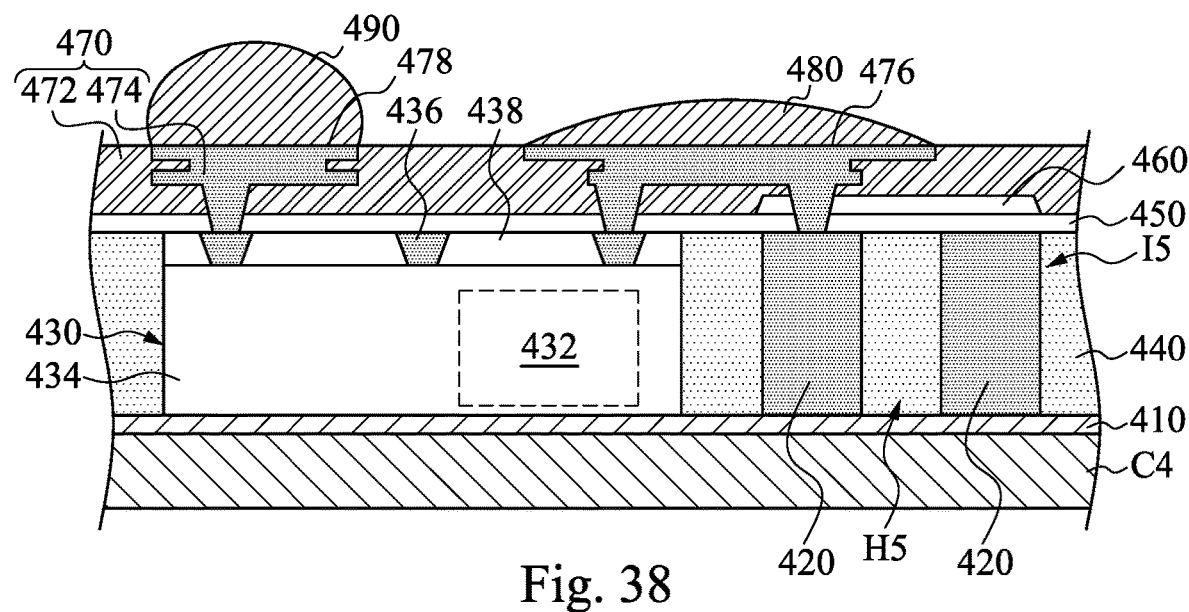

Reference is made to FIG. 38. First and second conductive features 480 and 490 are respectively formed on the first and second contact pads 476 and 478 of the RDL 470. The first and second conductive features 480 and 490 protrude with respect to the dielectric structure 472. Stated differently, the first and second conductive features 480 and 490 are at least partially located outside the dielectric structure 472. The first conductive feature 480 is electrically connected to the inductor I5 by the underlying first contact pad 476 and the wiring structure 474, so as to reduce a resistance of a current path between the inductor I5 and the semiconductor device 430, and the Q factor of the inductor I5 can be thus improved. Furthermore, the lower the resistance of the current path between the inductor I5 and the semiconductor device 430 is, the higher the power conversion efficiency of the VR die 432 is. As such, the first conductive feature 480 may be also advantageous to increase the power conversion efficiency of the VR die 432.

The first and second conductive features 480 and 490 may include substantially the same material in some embodiments. The first and second conductive features 480 and 490 can include, for example, as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof. In some other embodiments, the first and second conductive features 480 and 490 may be conductive balls such as solder balls. The formation of the first and second conductive features 480 and 490 may include placing solder balls respectively on the first and second contact pads 476 and 478, and then reflowing the solder balls. The solder ball on the second contact pad 478 is thicker than that on the first contact pad 476 because the second contact pad 478 provides an area less than that that of the first contact pad 476 for placing the solder ball. That is, the second conductive feature 490 is thicker than the first conductive feature 480 due to the area difference between the first and second contact pads 476 and 478. The second conductive feature 490 can serve as an external connector, to which a device (not shown) is attached. Because the second conductive feature 490 is thicker than the first conductive feature 480, a top of the first conductive feature 480 is lower than that of the second conductive feature 490, and the first conductive feature 480 can thus be spatially separated from the device that is attached to the second conductive feature 490, so that an electrical connection between the inductor I5 and the device attached to the second conductive feature 490 may not be created.

The second conductive features 490 may be arranged in a grid pattern of rows and columns and thus form a ball grid array (BGA). By using the RDL 470, the pitch of conductive pillars 436 of the semiconductor device 430 can be fanned out to the pitch of the second conductive features 490. Afterwards, the package structure may be de-bonded from the carrier C4, and the adhesive layer (not shown) between the buffer layer 410 and the carrier C4 is also cleaned from the package structure, and then, the package structure may be sawed into a plurality of package structures. A top view of one resulting structure is shown in FIG. 39.

Figure 39:
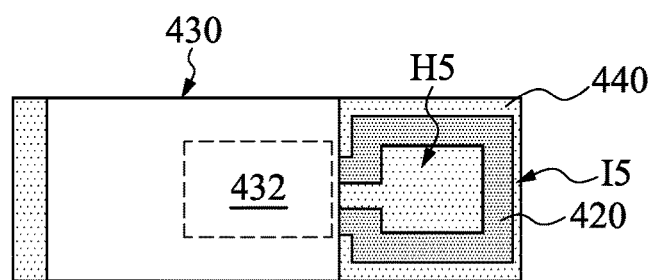

As shown in FIG. 38 and FIG. 39, the inductor I5 penetrates through the molding material 440 and is electrically connected to the semiconductor device 430. For example, the inductor I5 and the conductive pillars 436 can be electrically connected by the wiring structure 474 of the RDL 470. The through hole H5 is filled by the molding material 440 because the inductor I5 is molded in the molding material 440. The inductor I4 and the semiconductor device 430 are together molded in the molding material 440, so it may be beneficial to scale down the package structure incorporating with the inductor I5 therein.

Figure 40:
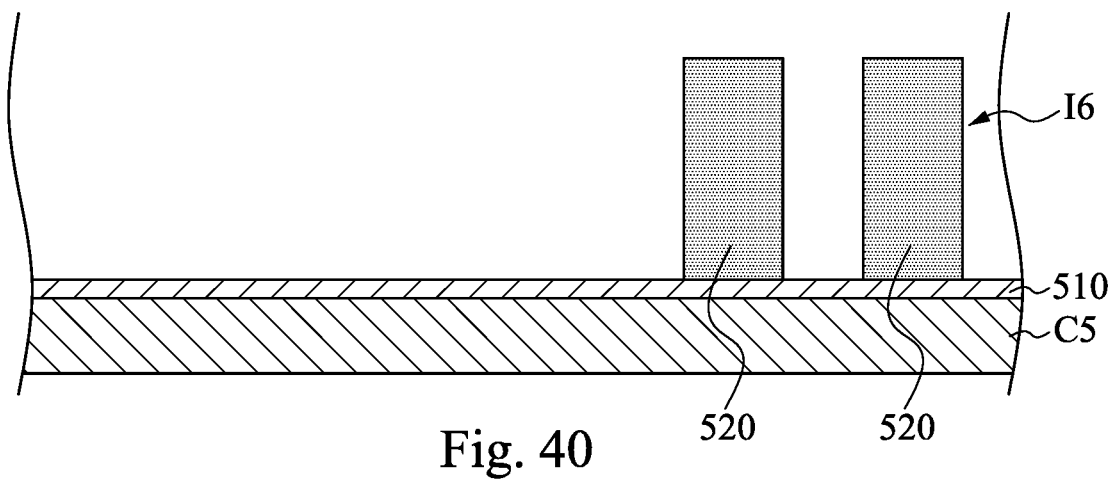
FIGS. 40-46 illustrate a method of forming a package structure in accordance with some embodiments of the present disclosure.

FIGS. 40-46 illustrate a method of forming a package structure in accordance with some embodiments of the present disclosure. Referring to FIG. 40, a buffer layer 510 is formed on a carrier C5. The buffer layer 510 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. The buffer layer 510 is a substantially planar layer having a substantially uniform thickness, in which the thickness may be greater than about 2 μm, and may be in a range from about 2 μm to about 40 μm. In some embodiments, top and bottom surfaces of the buffer layer 510 are also substantially planar. The carrier C5 may be a blank glass carrier, a blank ceramic carrier, or the like. In some embodiments, an adhesive layer (not shown) can be formed on the carrier C5, and the buffer layer 510 is formed on the adhesive layer. The adhesive layer may be made of an adhesive, such as ultra-violet (UV) glue, light-to-heat conversion (LTHC) glue, or the like, although other types of adhesives may be used.

Figure 41:
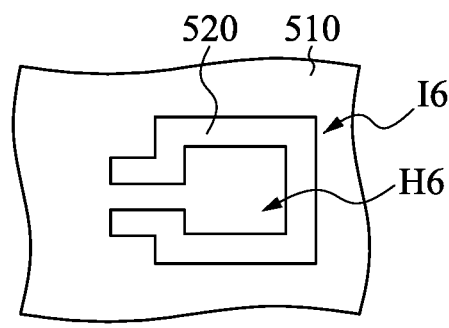

Thereafter, a TIV 520 is formed on the buffer layer 510 and formed in a spiral pattern in a top view, as shown in FIG. 41. The TIV 520 formed in the spiral pattern can be referred to as an inductor I6, especially a spiral inductor I6 having a through hole H6 therein. Formation of the TIV 520 may exemplarily include forming a blanket seed layer on the buffer layer 510, applying a photoresist over the seed layer and patterning the photoresist to form an opening with a spiral pattern, forming a conductive feature in the opening through plating, removing the photoresist to expose portions of the seed layer, and removing the exposed portions of the seed layer using an anisotropic etching. The remaining portion of the seed layer and the overlying conductive feature can be collectively referred to as the TIV 520. The resulting structure is shown in FIGS. 40 and 41.

Figure 42:
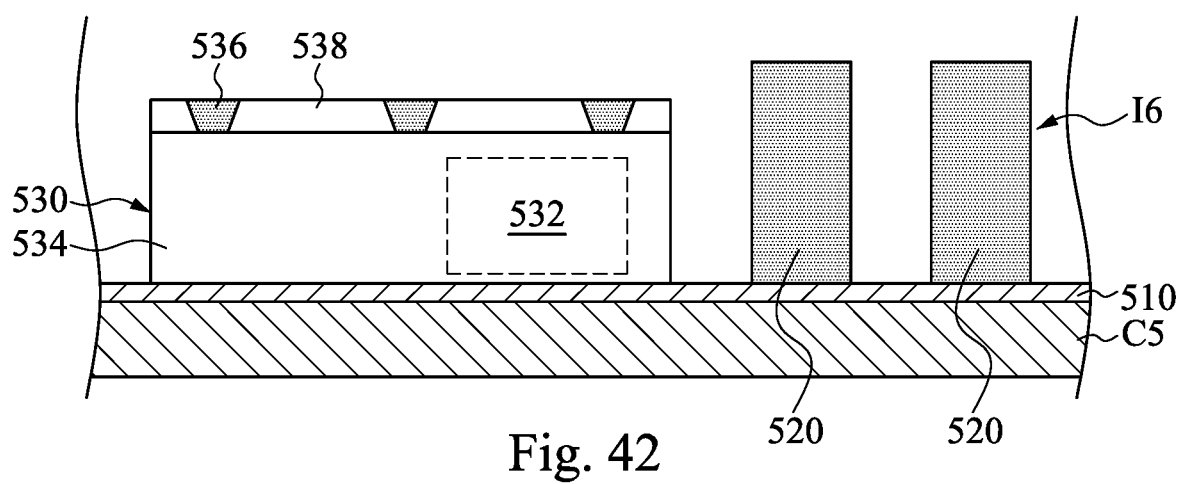

FIG. 42 illustrates placement of a semiconductor device 530 over the buffer layer 510. The semiconductor device 530 may be adhered to the buffer layer 510 through adhesive (not shown). In some embodiments, the semiconductor device 530 includes an unpackaged semiconductor device, i.e. device die. For example, the semiconductor device 530 may be a logic device die including logic transistors therein. In some exemplary embodiments, the semiconductor device 530 may be a central computing unit (CPU) die with a voltage regulator (VR) die 532. In some other embodiments, the CPU die and the VR die may be disposed in individual semiconductor devices. The semiconductor device 530 includes a semiconductor substrate 534 (a silicon substrate, for example) that is adhered to the buffer layer 510, wherein the back surface of the semiconductor substrate 534 is in contact with the adhesive on the buffer layer 510.

In some exemplary embodiments, conductive pillars 536 (such as copper posts) are formed as the top portions of the semiconductor device 530, and are electrically coupled to the devices such as transistors (not shown) in the semiconductor device 530. In some embodiments, a dielectric layer 538 is formed on the top surface of the semiconductor device 530, with the conductive pillars 536 having at least lower portions in the dielectric layer 538. The top surfaces of the conductive pillars 536 may be substantially level with the top surface of the dielectric layer 538 in some embodiments. Alternatively, the dielectric layer is not formed, and the conductive pillars 536 protrude from a top dielectric layer (not shown) of the semiconductor device 530.

Figure 43:
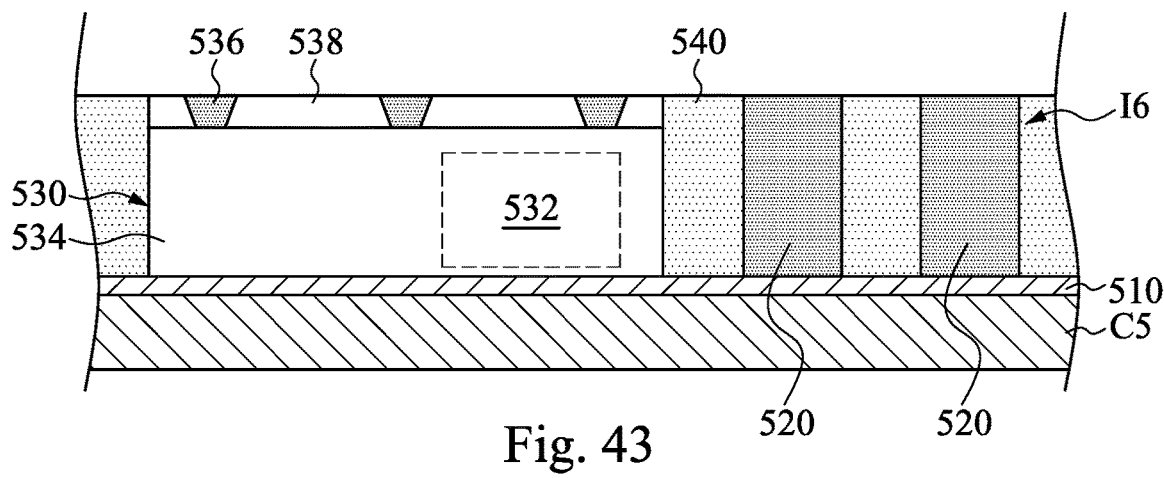

Reference is made to FIG. 43. A molding material 540 is molded on the semiconductor device 530 and the TIV 520. Thereafter, a grinding step is performed to thin the molding material 540, until the conductive pillars 536 and the TIV 520 are exposed, and the resulting structure is shown in FIG. 43. The molding material 540 fills gaps between the semiconductor device 530 and the TIV 520, and may be in contact with the buffer layer 510. Furthermore, the molding material 540 is filled into gaps between the conductive pillars 536 when the conductive pillars 536 are protruding metal pillars (this arrangement is not shown). In some embodiments, the molding material 540 includes a polymer-based material. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Due to the grinding, the inductor I6 penetrates through the molding material 540. Further, due to the grinding, the top end of the TIV 520 is substantially level (coplanar) with the top ends of the conductive pillars 536, and is substantially level (coplanar) with the top surface of the molding material 540. In other words, a top of the inductor I6 formed by the TIV 520 is substantially level with that of the molding material 540. As a result of the grinding, conductive residues such as metal particles may be generated, and left on the top surface of the structure shown in FIG. 43. Accordingly, after the grinding, a cleaning may be performed, for example, through a wet etching, so that the conductive residues are removed.

Figure 44:
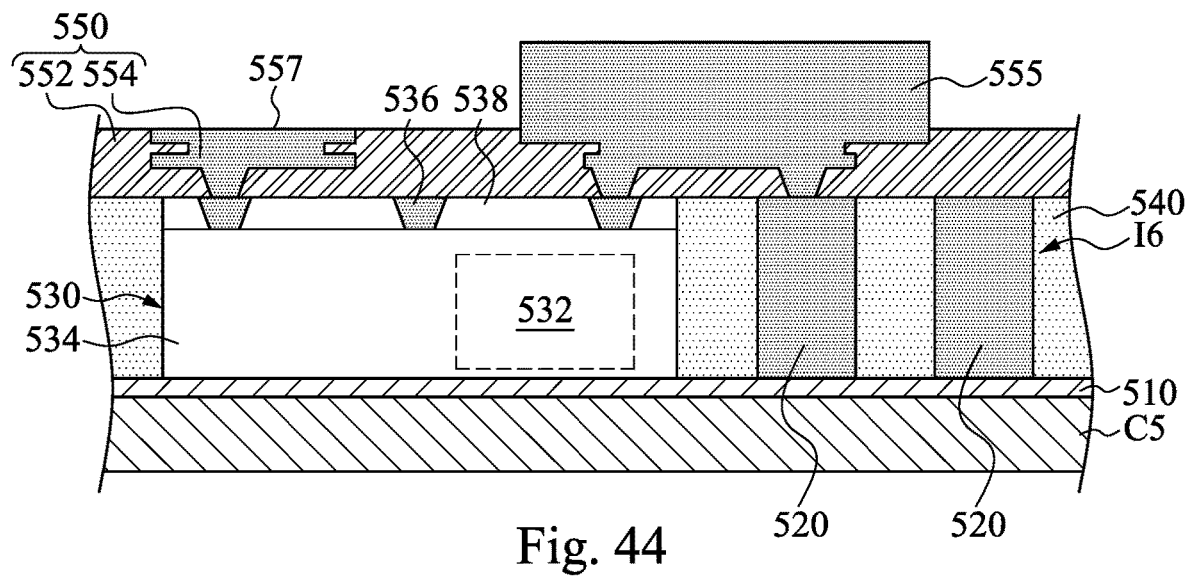

Next, referring to FIG. 44, a redistribution layer (RDL) 550 is formed over the molding material 540. The RDL 550 includes a dielectric structure 552 and a wiring structure 554 located in the dielectric structure 552. The wiring structure 554 is connected to the conductive pillars 536 and the TIV 520. The wiring structure 554 may also interconnect the conductive pillars 536 and the TIV 520. The RDL 550 further includes a conductive feature 555. The conductive feature 555 is connected to the inductor I6 by the wiring structure 554. The conductive feature 555 is thick enough such that a top of the conductive feature 555 is located outside the dielectric structure 552 and a bottom of the conductive feature 555 is located in the dielectric structure 552. That is, the top of the conductive feature 555 protrudes with respect to that of the dielectric structure 552. The conductive feature 555 can be referred to as a thick UBM that is thicker than a UBM structure 557 in some embodiments. Because the conductive feature 555 is exposed on the top of the RDL 550, it can be thick enough to reduce a resistance of a current path between the inductor I6 and the semiconductor device 530. That is, the thick conductive feature 555 can lower the resistance of the current path between the inductor I6 and the semiconductor device 530, and the Q factor of the inductor I6 is thus improved. Moreover, the lower the resistance of the current path between the inductor I6 and the semiconductor device 530 is, the higher the power conversion efficiency of the VR die 532 is. As such, the thick conductive feature 555 may be also advantageous to increase the power conversion efficiency of the VR die 532.

In some embodiments, the formation of one layer of the wiring structure 554 includes forming a blanket copper seed layer, forming and patterning a mask layer over the blanket copper seed layer, performing a plating to form the wiring structure 554, removing the mask layer, and performing a flash etching to remove the portions of the blanket copper seed layer not covered by the wiring structure 554. In alternative embodiments, the RDL 550 is formed by depositing metal layers, patterning the metal layers, and filling gaps between separated portions of the wiring structure 554 with the dielectric structure 552. The wiring structure 554 may include a metal or a metal alloy including aluminum, copper, tungsten, and/or alloys thereof. The dielectric structure 552 in these embodiments may include a polymer such as polyimide, benzocyclobutene (BCB), polybenzoxazole (PBO), or the like. Alternatively, the dielectric structure 552 may include non-organic dielectric materials such as silicon oxide, silicon nitride, silicon carbide, silicon oxynitride, or the like. Amount of the layers of the dielectric structure 552 and the wiring structure 554 can depend on the routing design of the respective package.

Figure 45:
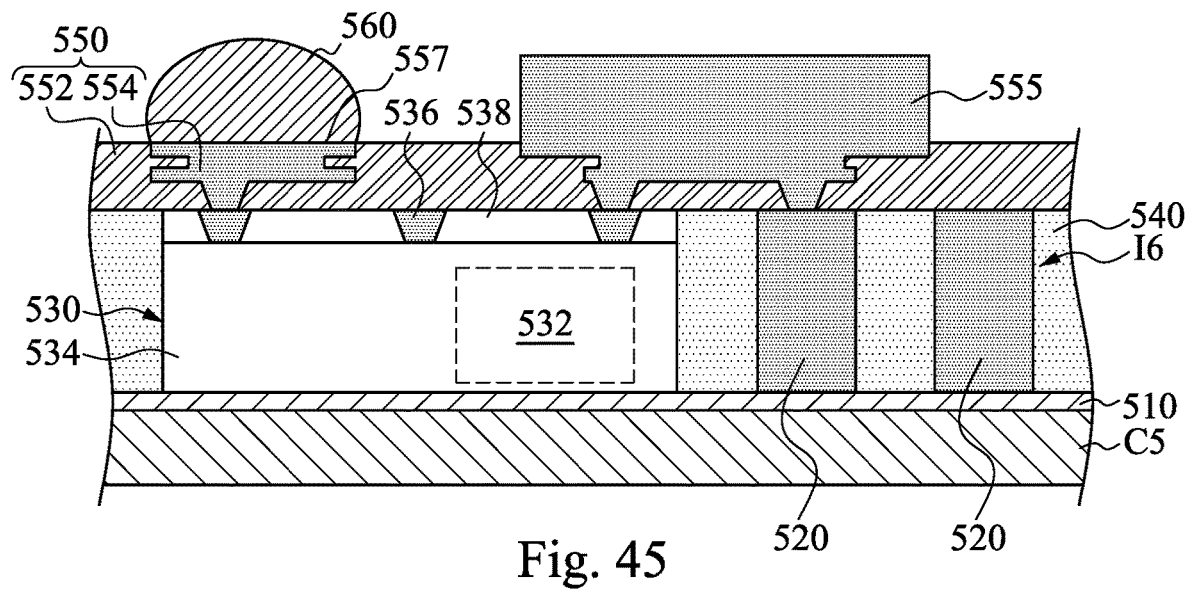

Reference is made to FIG. 45. External connector 560 is formed on the UBM structure 557 that is thinner than the thick conductive feature 555. The external connector 560 can include, for example, as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof. In some other embodiments, external connectors 560 may be conductive balls such as solder balls. These solder balls may be arranged in a grid pattern of rows and columns. The external connectors 560 may thus form a ball grid array (BGA). In some embodiments, a top of the conductive feature 555 is lower than that of the external connector 560, so that the conductive feature 555 can be spatially separated from a device (not shown) attached to the external connector 560. A conductive ball such as the external connector 560 is absent on the conductive feature 555 in some embodiments, so that an electrical connection between the inductor I6 and the device attached to the external connector 560 may not be created.

By using the RDL 550, the pitch of conductive pillars 536 of the semiconductor device 530 can be fanned out to the pitch of the external connectors 560. Afterwards, the package structure may be de-bonded from the carrier C5, and the adhesive layer (not shown) between the buffer layer 510 and the carrier C5 is also cleaned from the package structure, and then, the package structure may be sawed into a plurality of package structures. A top view of one resulting structure is shown in FIG. 46.

Figure 46:
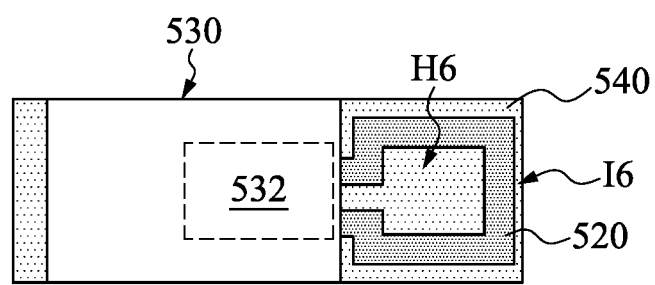

As shown in FIG. 45 and FIG. 46, the inductor I6 penetrates through the molding material 540 and is electrically connected to the semiconductor device 530. For example, the inductor I6 and the conductive pillars 536 can be electrically connected by the wiring structure 554 of the RDL 550. The through hole H6 is filled by the molding material 540 because the inductor I6 is molded in the molding material 540. The inductor I6 and the semiconductor device 530 are together molded in the molding material 540, so this configuration may be beneficial to scale down the package structure incorporating with the inductor I6 therein.

Figure 47:
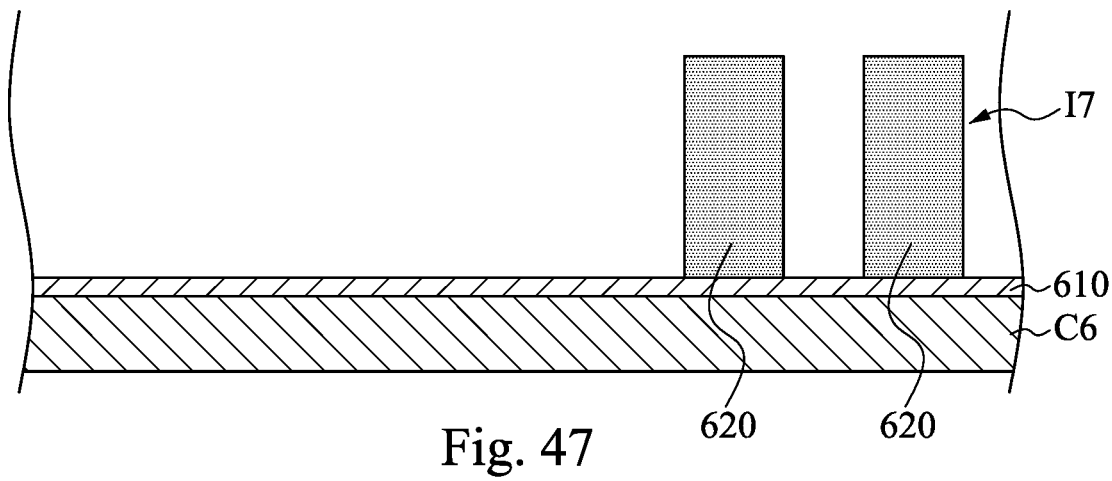
FIGS. 47-54 illustrate a method of forming a package structure in accordance with some embodiments of the present disclosure.

FIGS. 47-54 illustrate a method of forming a package structure in accordance with some embodiments of the present disclosure. Referring to FIG. 47, a buffer layer 610 is formed on a carrier C6. The buffer layer 610 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. The buffer layer 610 is a substantially planar layer having a substantially uniform thickness, in which the thickness may be greater than about 2 µm, and may be in a range from about 2 µm to about 40 µm. In some embodiments, top and bottom surfaces of the buffer layer 610 are also substantially planar. The carrier C6 may be a blank glass carrier, a blank ceramic carrier, or the like. In some embodiments, an adhesive layer (not shown) can be formed on the carrier C6, and the buffer layer 610 is formed on the adhesive layer. The adhesive layer may be made of an adhesive, such as ultra-violet (UV) glue, light-to-heat conversion (LTHC) glue, or the like, although other types of adhesives may be used.

Figure 48:
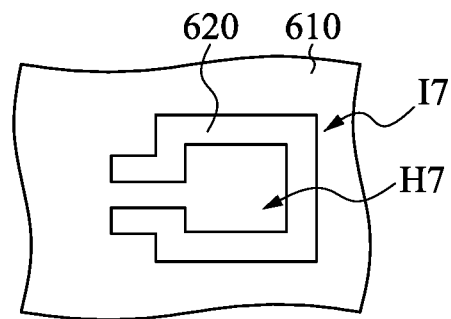

Thereafter, a TIV 620 is formed on the buffer layer 610 and formed in a spiral pattern in a top view, as shown in FIG. 48. The TIV 620 formed in the spiral pattern can be referred to as an inductor I7, especially a spiral inductor I7 having a through hole H7 therein. Formation of the TIV 620 may exemplarily include forming a blanket seed layer on the buffer layer 610, applying a photoresist over the seed layer and patterning the photoresist to form an opening with a spiral pattern, forming a conductive feature in the opening through plating, removing the photoresist to expose portions of the seed layer, and removing the exposed portions of the seed layer using an anisotropic etching. The remaining portion of the seed layer and the overlying conductive feature can be collectively referred to as the TIV 620. The resulting structure is shown in FIGS. 47 and 48.

Figure 49:
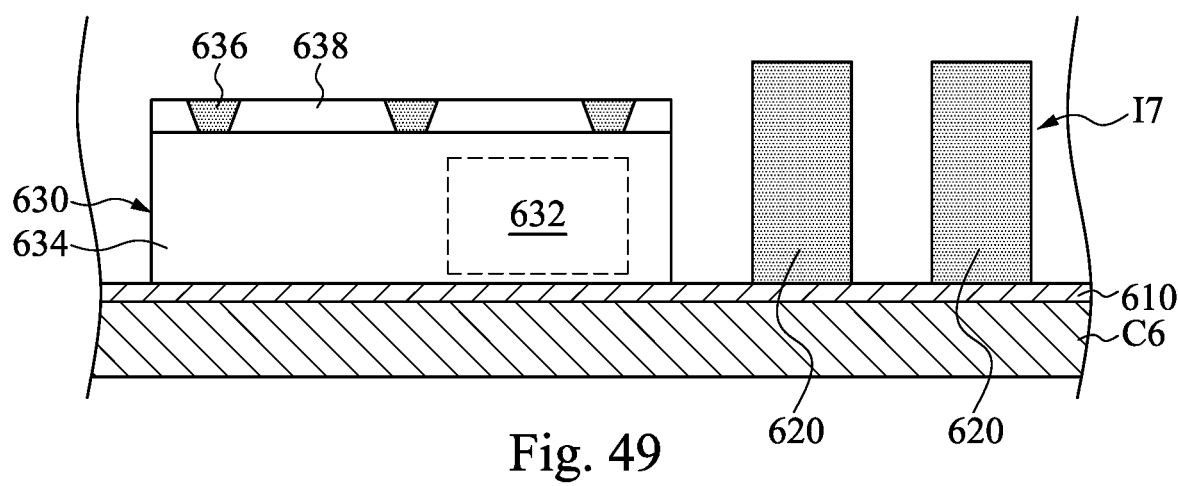

FIG. 49 illustrates placement of a semiconductor device 630 over the buffer layer 610. The semiconductor device 630 may be adhered to the buffer layer 610 through adhesive (not shown). In some embodiments, the semiconductor device 630 includes an unpackaged semiconductor device, i.e. device die. For example, the semiconductor device 630 may be a logic device die including logic transistors therein. In some exemplary embodiments, the semiconductor device 630 may be a central computing unit (CPU) die with a voltage regulator (VR) die 632. In some other embodiments, the CPU die and the VR die may be disposed in individual semiconductor devices. The semiconductor device 630 includes a semiconductor substrate 634 (a silicon substrate, for example) that is adhered to the buffer layer 610, wherein the back surface of the semiconductor substrate 634 is in contact with the adhesive on the buffer layer 610.

In some exemplary embodiments, conductive pillars 636 (such as copper posts) are formed as the top portions of the semiconductor device 630, and are electrically coupled to the devices such as transistors (not shown) in the semiconductor device 630. In some embodiments, a dielectric layer 638 is formed on the top surface of the semiconductor device 630, with the conductive pillars 636 having at least lower portions in the dielectric layer 638. The top surfaces of the conductive pillars 636 may be substantially level with the top surface of the dielectric layer 638 in some embodiments. Alternatively, the dielectric layer is not formed, and the conductive pillars 636 protrude from a top dielectric layer (not shown) of the semiconductor device 630.

Figure 50:
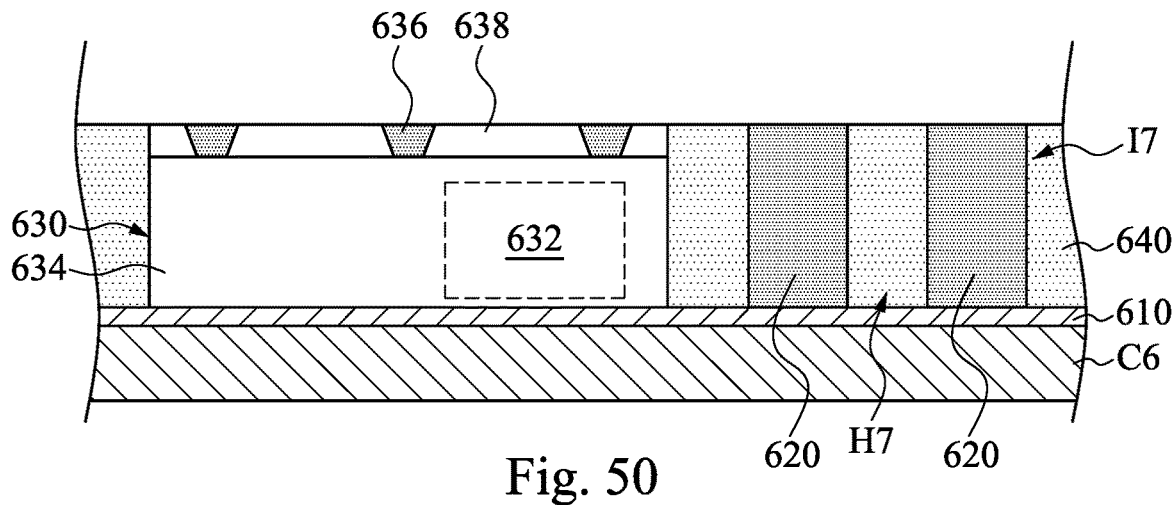

Reference is made to FIG. 50. A molding material 640 is molded on the semiconductor device 630 and the TIV 620. Thereafter, a grinding step is performed to thin the molding material 640, until the conductive pillars 636 and the TIV 620 are exposed, and the resulting structure is shown in FIG. 50. The molding material 640 fills gaps between the semiconductor device 630 and the TIV 620, and may be in contact with the buffer layer 610. Furthermore, the molding material 640 is filled into gaps between the conductive pillars 636 when the conductive pillars 636 are protruding metal pillars (this arrangement is not shown). In some embodiments, the molding material 640 includes a polymer-based material. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Due to the grinding, the inductor I7 penetrates through the molding material 640. Further, due to the grinding, the top end of the TIV 620 is substantially level (coplanar) with the top ends of the conductive pillars 636, and is substantially level (coplanar) with the top surface of the molding material 640. In other words, a top of the inductor I7 formed by the TIV 620 is substantially level with that of the molding material 640. As a result of the grinding, conductive residues such as metal particles may be generated, and left on the top surface of the structure shown in FIG. 50. Accordingly, after the grinding, a cleaning may be performed, for example, through a wet etching, so that the conductive residues are removed.

Figure 51:
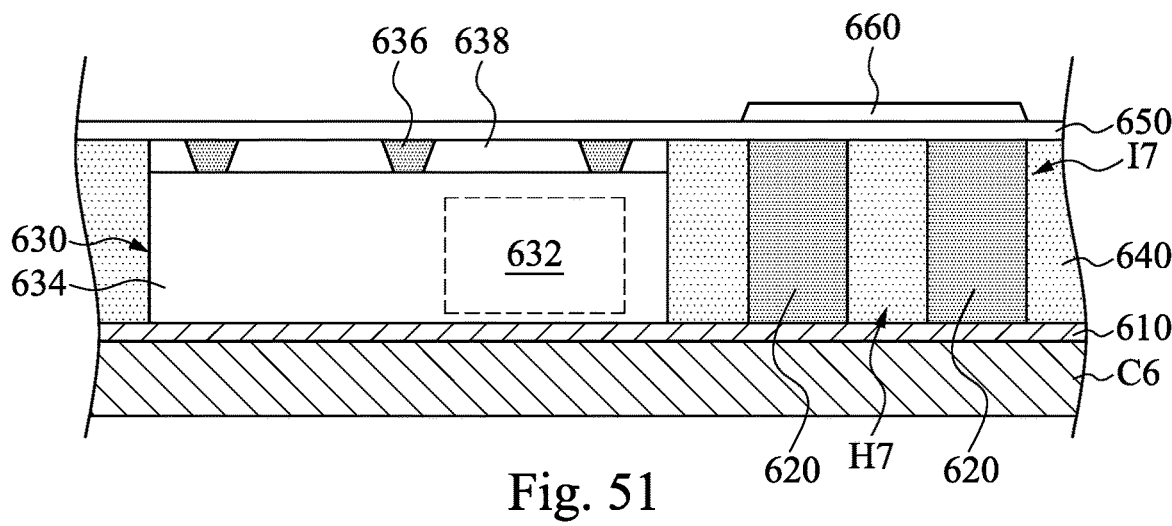

Reference is made to FIG. 51. A dielectric layer 650 is formed on the structure shown in FIG. 50. That is, a blanket dielectric layer 650 caps the TIV 620, the semiconductor device 630 and the molding material 640. Formation of the dielectric layer 650 may exemplarily include deposition, such as physical vapor deposition (PVD) or chemical vapor deposition (CVD). In some embodiments, the dielectric layer 650 is a low temperature silicon nitride layer.

Next, a magnetic film 660 is formed on at least a portion of the dielectric layer 650, and this portion of the dielectric layer 650 overlies the TIV 620. That is, the inductor I7 underlies the magnetic film 660, and they are spaced apart by the dielectric layer 650, so that the magnetic film 660 is located on the through hole H7 of the inductor I7 and is electrically insulated from the inductor I7. This magnetic film 660 can serve as a magnetic core for the inductor I7 to increase the magnetic field and thus improve the inductance of the inductor I7. Moreover, the inductor I7 can be scaled down due to that the inductance can be increased by the magnetic film 660 located on the through hole H7. In other words, the TIV 620 can be formed in a scaled down spiral pattern, which may be advantageous to scale down the package structure. Exemplarily formation method of the magnetic film 660 may include forming a blanket magnetic layer over the dielectric layer 650, applying a photoresist over the magnetic layer, patterning the photoresist to expose some portions of the magnetic layer, and performing an etch process on the magnetic layer to remove the exposed portions of the magnetic layer, wherein an etching solution used in the etching process may include HF, $HNO_3$ and water, and the etch process may be operated at a temperature in a range from about 15° C. to about 40° C., as examples.

In some embodiments, the magnetic film 660 includes cobalt (Co), zirconium (Zr), tantalum (Ta), niobium (Nb), rhenium (Re), neodymium (Nd), praseodymium (Pr), nickel (Ni), or dysprosium (Dy). In some embodiments, the magnetic film 660 includes an amorphous cobalt (Co) alloy including cobalt (Co) and zirconium (Zr). Zirconium (Zr) helps make cobalt (Co) amorphous. In some embodiments, the magnetic film 660 includes a cobalt-zirconium (CoZr) alloy having one or more additional elements, such as tantalum (Ta) and niobium (Nb). For example, the magnetic film 660 may be made of CoZrTa (CZT) alloy. In some other embodiments, the magnetic film 660 includes a cobalt-zirconium (CoZr) alloy having one or more additional elements, such as a rare earth element, that help increase the ferromagnetic resonance of the cobalt-zirconium (CoZr) alloy. Rare earth elements include rhenium (Re), neodymium (Nd), praseodymium (Pr), or dysprosium (Dy). In some embodiments, the magnetic film 660 may include other alloys such as permalloy (Ni$_8$OFe$_2$O), orthnol (Ni$_5$OFe$_5$O), amorphous CoFeCu, supermalloy (NiFeMo), polymer ferrite materials or other suitable magnetic materials. Although one magnetic film 660 is shown in FIG. 51, there may be multiple magnetic films 660 formed on the dielectric layer 650 depending on a predetermined or desired inductance.

Figure 52:
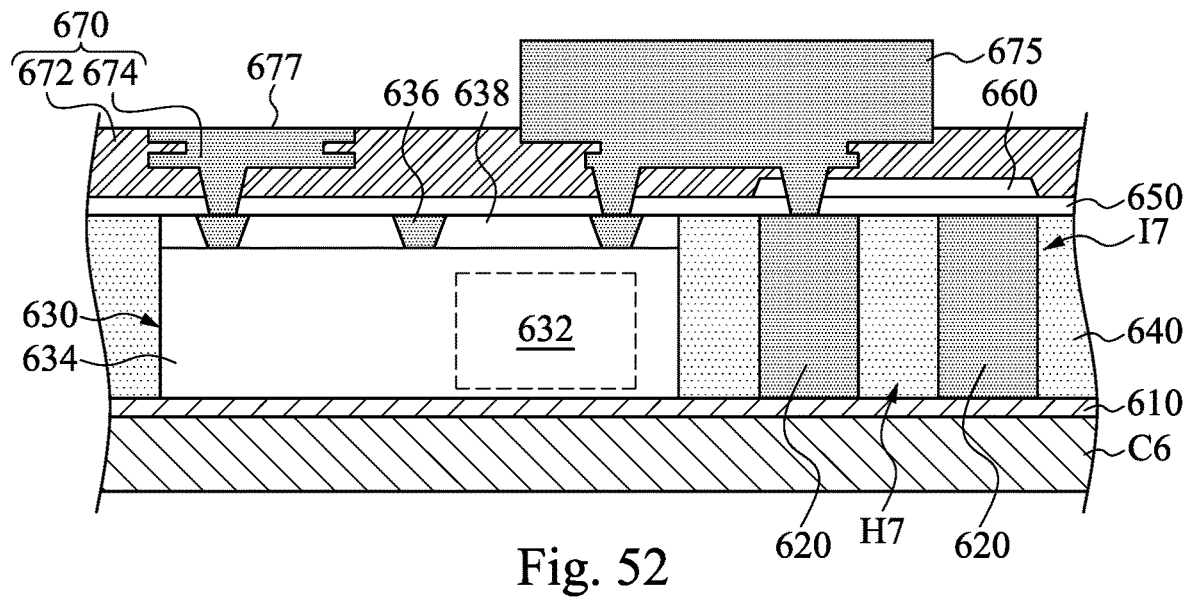

Next, referring to FIG. 52, a redistribution layer (RDL) 670 is formed over the dielectric layer 650 and the magnetic film 660, so that the magnetic film 660 is located in the RDL 670. The RDL 670 includes a dielectric structure 672 and a wiring structure 674 located in the dielectric structure 672. The wiring structure 674 is connected to the conductive pillars 636 and the TIV 620. The wiring structure 674 may also interconnect the conductive pillars 636 and the TIV 620. In the embodiments where the dielectric layer 650 is a blanket capping layer, the blanket dielectric capping layer 650 is patterned to expose some conductive pillars 636 and some portions of the TIV 620, and then, the RDL 670 is formed, wherein some portions of the wiring structure 674 penetrate through the dielectric layer 650 to connect to the exposed conductive pillars 636 and the exposed portions of the TIV 620. The blanket dielectric capping layer 650 is patterned using a photolithography and etch process, as examples.

The RDL 670 further includes a conductive feature 675. The conductive feature 675 is connected to the inductor I7 by the wiring structure 674. The conductive feature 675 is thick enough such that a top of the conductive feature 675 is located outside the dielectric structure 672 and a bottom of the conductive feature 675 is located in the dielectric structure 672. That is, the top of the conductive feature 675 protrudes with respect to that of the dielectric structure 672. The conductive feature 675 can be referred to as a thick UBM that is thicker than a UBM structure 677 in some embodiments. Because the conductive feature 675 is exposed on the top of the RDL 670, it can be thick enough to reduce a resistance of a current path between the inductor I7 and the semiconductor device 630. That is, the thick conductive feature 675 can lower the resistance of the current path between the inductor I7 and the semiconductor device 630, and the Q factor of the inductor I7 is thus improved. Moreover, the lower the resistance of the current path between the inductor I7 and the semiconductor device 630 is, the higher the power conversion efficiency of the VR die 632 is. As such, the thick conductive feature 675 may be also advantageous to increase the power conversion efficiency of the VR die 632.

In some embodiments, the formation of one layer of the wiring structure 674 includes forming a blanket copper seed layer, forming and patterning a mask layer over the blanket copper seed layer, performing a plating to form the wiring structure 674, removing the mask layer, and performing a flash etching to remove the portions of the blanket copper seed layer not covered by the wiring structure 674. In alternative embodiments, the RDL 670 is formed by depositing metal layers, patterning the metal layers, and filling gaps between separated portions of the wiring structure 674 with the dielectric structure 672. The wiring structure 674 may include a metal or a metal alloy including aluminum, copper, tungsten, and/or alloys thereof. The dielectric structure 672 in these embodiments may include a polymer such as polyimide, benzocyclobutene (BCB), polybenzoxazole (PBO), or the like. Alternatively, the dielectric structure 672 may include non-organic dielectric materials such as silicon oxide, silicon nitride, silicon carbide, silicon oxynitride, or the like. Amount of the layers of the dielectric structure 672 and the wiring structure 674 can depend on the routing design of the respective package.

Figure 53:
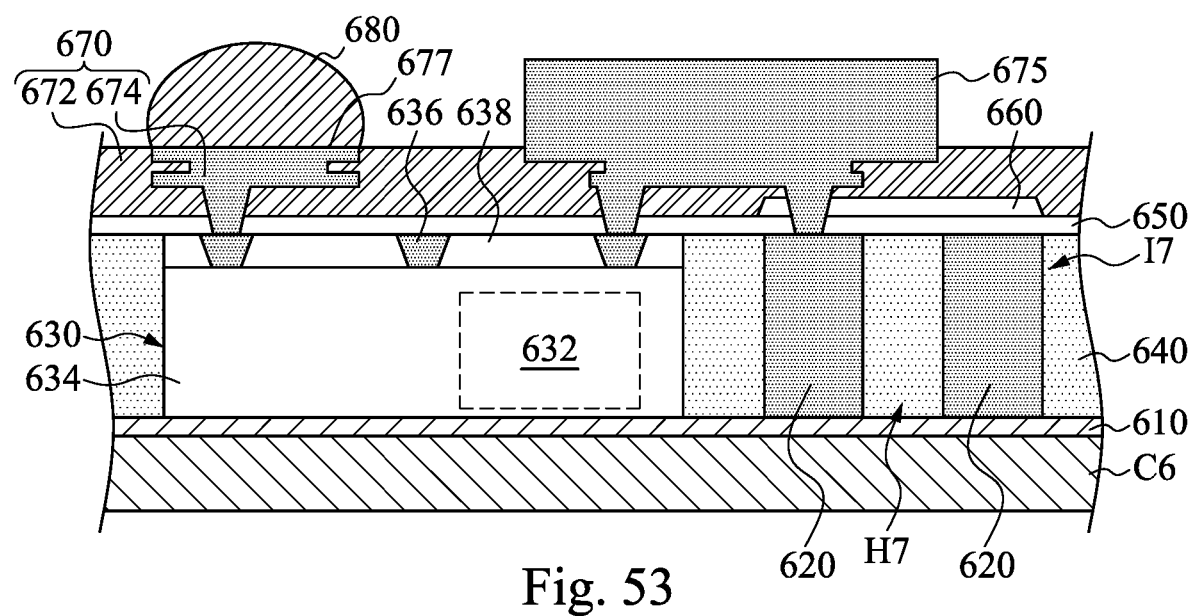

Reference is made to FIG. 53. External connector 680 is formed on the UBM structure 677 that is thinner than the thick conductive feature 675. The external connector 680 can include, for example, as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof. In some other embodiments, external connectors 680 may be conductive balls such as solder balls. These solder balls may be arranged in a grid pattern of rows and columns. The external connectors 680 may thus form a ball grid array (BGA). In some embodiments, a top of the conductive feature 675 is lower than that of the external connector 680, so that the conductive feature 675 can be spatially separated from a device (not shown) attached to the external connector 680. A conductive ball such as the external connector 680 is absent on the conductive feature 675 in some embodiments, so that an electrical connection between the inductor I7 and the device attached to the external connector 680 may not be created.

By using the RDL 670, the pitch of conductive pillars 636 of the semiconductor device 630 can be fanned out to the pitch of the external connectors 680. Afterwards, the package structure may be de-bonded from the carrier C6, and the adhesive layer (not shown) between the buffer layer 610 and the carrier C6 is also cleaned from the package structure, and then, the package structure may be sawed into a plurality of package structures. A top view of one resulting structure is shown in FIG. 54.

Figure 54:
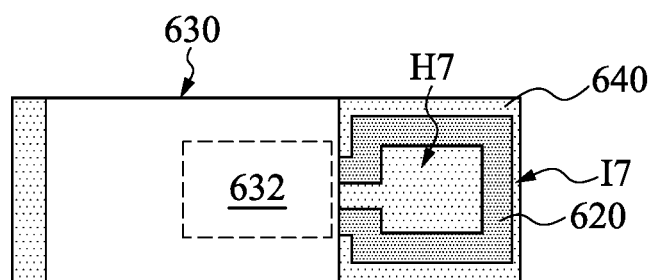

As shown in FIG. 53 and FIG. 54, the inductor I7 penetrates through the molding material 640 and is electrically connected to the semiconductor device 630. For example, the inductor I7 and the conductive pillars 636 can be electrically connected by the wiring structure 674 of the RDL 670. The through hole H7 is filled by the molding material 640 because the inductor I7 is molded in the molding material 640. The inductor I7 and the semiconductor device 630 are together molded in the molding material 640, so this configuration may be beneficial to scale down the package structure incorporating with the inductor I7 therein.

Figure 55:
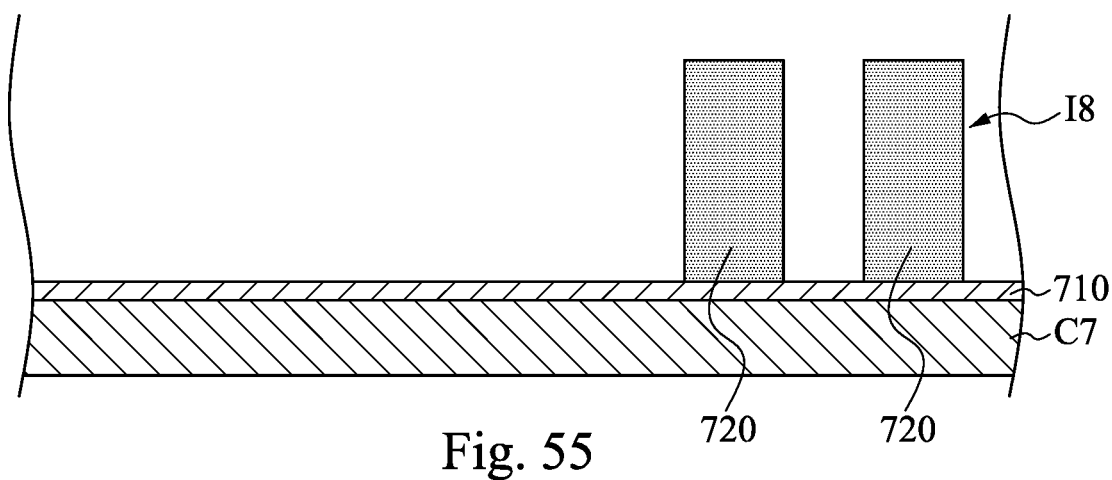
FIGS. 55-61 illustrate a method of forming a package structure in accordance with some embodiments of the present disclosure.

FIGS. 55-61 illustrate a method of forming a package structure in accordance with some embodiments of the present disclosure. Referring to FIG. 55, a buffer layer 710 is formed on a carrier C7. The buffer layer 710 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. The buffer layer 710 is a substantially planar layer having a substantially uniform thickness, in which the thickness may be greater than about 2 μm, and may be in a range from about 2 μm to about 40 μm. In some embodiments, top and bottom surfaces of the buffer layer 710 are also substantially planar. The carrier C7 may be a blank glass carrier, a blank ceramic carrier, or the like. In some embodiments, an adhesive layer (not shown) can be formed on the carrier C7, and the buffer layer 710 is formed on the adhesive layer. The adhesive layer may be made of an adhesive, such as ultra-violet (UV) glue, light-to-heat conversion (LTHC) glue, or the like, although other types of adhesives may be used.

Thereafter, a TIV 720 is formed on the buffer layer 710 and formed in a spiral pattern in a top view, as shown in FIG.

Figure 56:
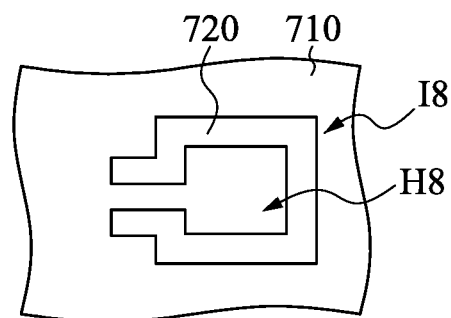

56. The TIV 720 formed in the spiral pattern can be referred to as an inductor I8, especially a spiral inductor I8 having a through hole H8 therein. Formation of the TIV 720 may exemplarily include forming a blanket seed layer on the buffer layer 710, applying a photoresist over the seed layer and patterning the photoresist to form an opening with a spiral pattern, forming a conductive feature in the opening through plating, removing the photoresist to expose portions of the seed layer, and removing the exposed portions of the seed layer using an anisotropic etching. The remaining portion of the seed layer and the overlying conductive feature can be collectively referred to as the TIV 720. The resulting structure is shown in FIGS. 55 and 56.

Figure 57:
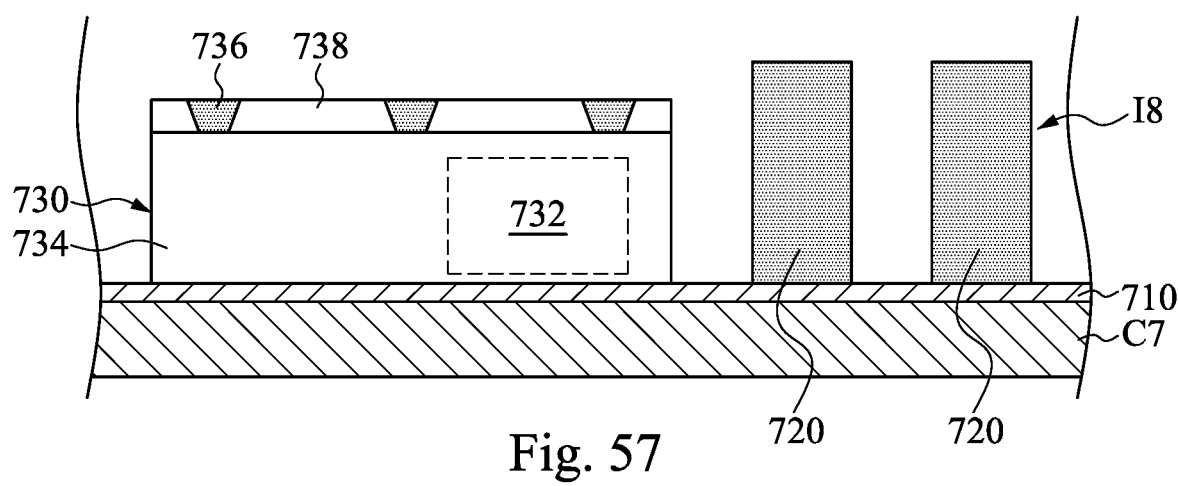

FIG. 57 illustrates placement of a semiconductor device 730 over the buffer layer 710. The semiconductor device 730 may be adhered to the buffer layer 710 through adhesive (not shown). In some embodiments, the semiconductor device 730 includes an unpackaged semiconductor device, i.e. device die. For example, the semiconductor device 730 may be a logic device die including logic transistors therein. In some exemplary embodiments, the semiconductor device 730 may be a central computing unit (CPU) die with a voltage regulator (VR) die 732. In some other embodiments, the CPU die and the VR die may be disposed in individual semiconductor devices. The semiconductor device 730 includes a semiconductor substrate 734 (a silicon substrate, for example) that is adhered to the buffer layer 710, wherein the back surface of the semiconductor substrate 734 is in contact with the adhesive on the buffer layer 710.

In some exemplary embodiments, conductive pillars 736 (such as copper posts) are formed as the top portions of the semiconductor device 730, and are electrically coupled to the devices such as transistors (not shown) in the semiconductor device 730. In some embodiments, a dielectric layer 738 is formed on the top surface of the semiconductor device 730, with the conductive pillars 736 having at least lower portions in the dielectric layer 738. The top surfaces of the conductive pillars 736 may be substantially level with the top surface of the dielectric layer 738 in some embodiments. Alternatively, the dielectric layer is not formed, and the conductive pillars 736 protrude from a top dielectric layer (not shown) of the semiconductor device 730.

Figure 58:
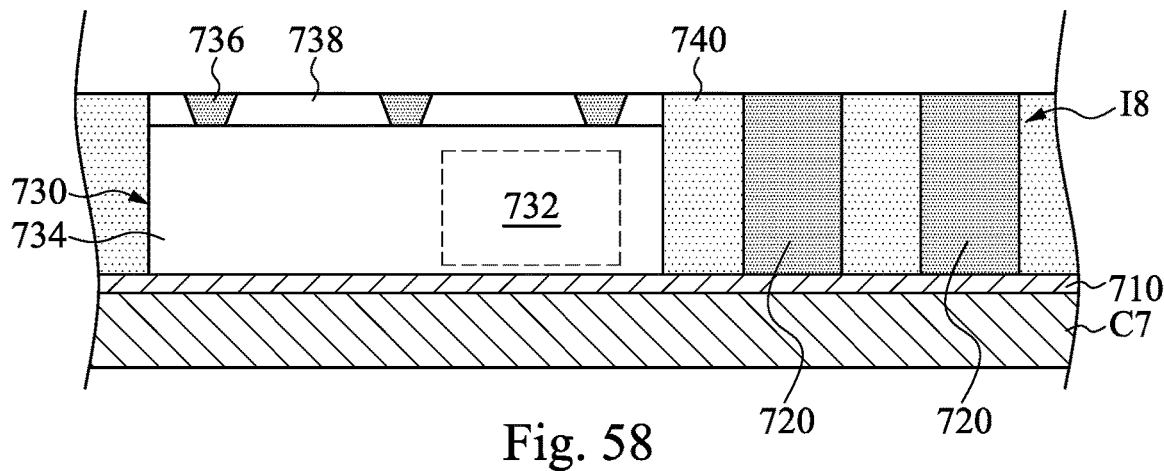

Reference is made to FIG. 58. A molding material 740 is molded on the semiconductor device 730 and the TIV 720. Thereafter, a grinding step is performed to thin the molding material 740, until the conductive pillars 736 and the TIV 720 are exposed, and the resulting structure is shown in FIG. 58. The molding material 740 fills gaps between the semiconductor device 730 and the TIV 720, and may be in contact with the buffer layer 710. Furthermore, the molding material 740 is filled into gaps between the conductive pillars 736 when the conductive pillars 736 are protruding metal pillars (this arrangement is not shown). In some embodiments, the molding material 740 includes a polymer-based material. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Due to the grinding, the inductor I8 penetrates through the molding material 740. Further, due to the grinding, the top end of the TIV 720 is substantially level (coplanar) with the top ends of the conductive pillars 736, and is substantially level (coplanar) with the top surface of the molding material 740. In other words, a top of the inductor I8 formed by the TIV 720 is substantially level with that of the molding material 740. As a result of the grinding, conductive residues such as metal particles may be generated, and left on the top surface of the structure shown in FIG. 58. Accordingly, after the grinding, a cleaning may be performed, for example, through a wet etching, so that the conductive residues are removed.

Figure 59:
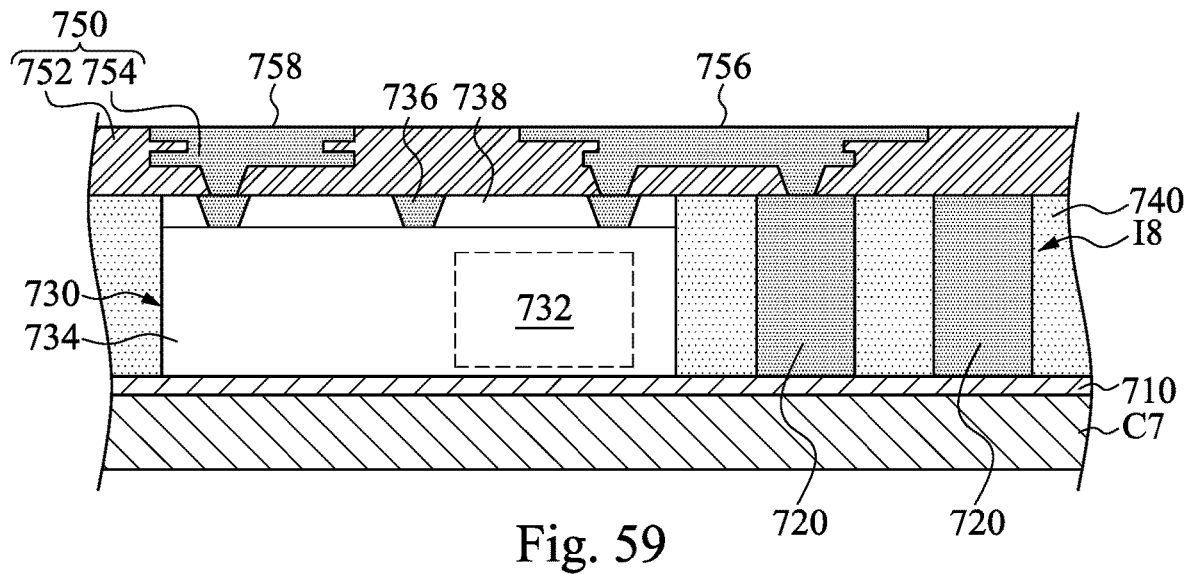

Next, referring to FIG. 59, a redistribution layer (RDL) 750 is formed over the molding material 740. The RDL 750 includes a dielectric structure 752 and a wiring structure 754 located in the dielectric structure 752. The wiring structure 754 is connected to the conductive pillars 736 and the TIV 720. The wiring structure 754 may also interconnect the conductive pillars 736 and the TIV 720. The RDL 750 further includes a first contact pad 756 and a second contact pad 758. The first and second contact pads 756 and 758 are located on one side of the RDL 750 opposite to the molding material 740. The first contact pad 756 is electrically connected to the inductor I8 by the wiring structure 754. The second contact pad 758 is electrically connected to the semiconductor device 730 by the wiring structure 754. The first contact pad 756 has an area greater than that of the second contact pad 758. For example, the first and second contact pads 756 and 758 respectively have surfaces exposed by the dielectric structure 752, and the exposed surface of the first contact pad 756 has an area greater than that of the second contact pad 758. This area difference may be beneficial to make conductive features subsequently formed on the first and second contact pads 756 and 758 have different thicknesses.

In some embodiments, the formation of one layer of the wiring structure 754 includes forming a blanket copper seed layer, forming and patterning a mask layer over the blanket copper seed layer, performing a plating to form the wiring structure 754, removing the mask layer, and performing a flash etching to remove the portions of the blanket copper seed layer not covered by the wiring structure 754. In alternative embodiments, the RDL 750 is formed by depositing metal layers, patterning the metal layers, and filling gaps between separated portions of the wiring structure 754 with the dielectric structure 752. The wiring structure 754 may include a metal or a metal alloy including aluminum, copper, tungsten, and/or alloys thereof. The first and second contact pads 756 and 758 may be under-ball metallization (UBM) structures formed on the wiring structure 754. The wiring structure 754 and first and second contact pads 756 and 758 may have substantially the same material. For example, the first and second contact pads 756 and 758 may also include a metal or a metal alloy including aluminum, copper, tungsten, and/or alloys thereof. The dielectric structure 752 in these embodiments may include a polymer such as polyimide, benzocyclobutene (BCB), polybenzoxazole (PBO), or the like. Alternatively, the dielectric structure 752 may include non-organic dielectric materials such as silicon oxide, silicon nitride, silicon carbide, silicon oxynitride, or the like. Amount of the layers of the dielectric structure 752 and the wiring structure 754 can depend on the routing design of the respective package.

Figure 60:
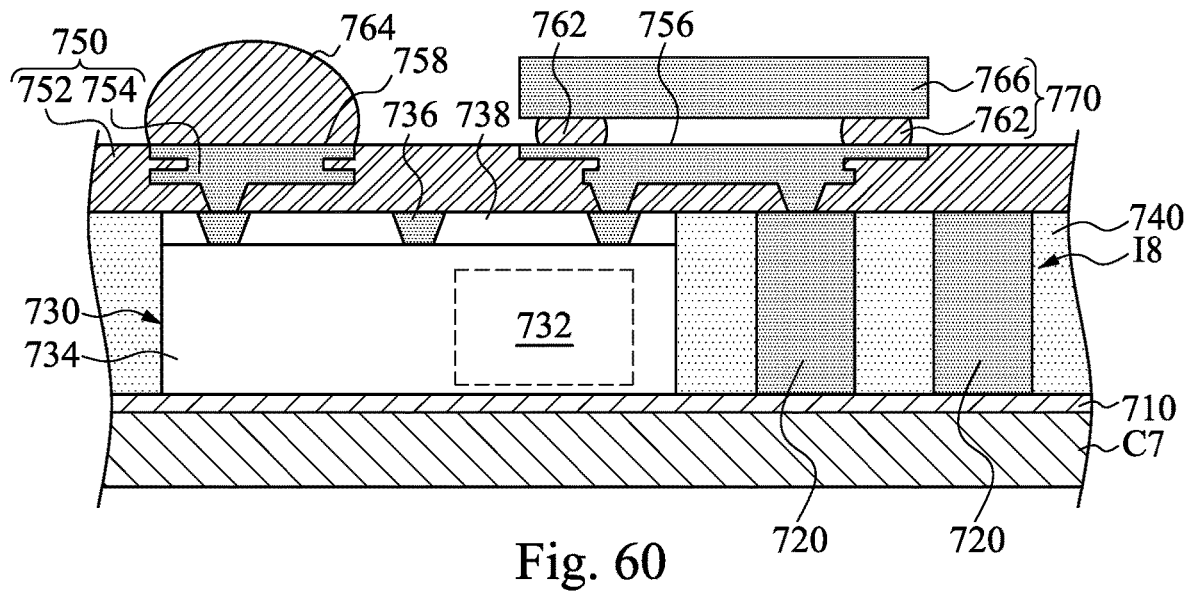

Reference is made to FIG. 60. Internal connectors 762 are formed on the first contact pad 756 of the RDL 750, and an external connector 764 is formed on the second contact pad 758 of the RDL 750. Thereafter, a conductive structure 766 such as a thick metal wire is attached to the internal connectors 762. The combined structure of the internal connectors 762 and the overlying conductive structure 766 can be referred to as a conductive feature 770 located on the first contact pad 756. The conductive feature 770 protrudes with respect to the dielectric structure 752. That is, the conductive feature 770 is at least partially located outside the dielectric structure 752. The conductive feature 770 is electrically connected to the inductor I8 by the underlying first contact pad 756 and the wiring structure 754, so as to reduce a resistance of a current path between the inductor I8 and the semiconductor device 730, and the Q factor of the inductor I8 can be thus improved. Furthermore, the lower the resistance of the current path between the inductor I8 and the semiconductor device 730 is, the higher the power conversion efficiency of the VR die 732 is. As such, the conductive feature 770 may be also advantageous to increase the power conversion efficiency of the VR die 732.

The internal connectors 762 and the external connector 764 may include substantially the same material in some embodiments. The internal connectors 762 and the external connector 764 can include, for example, as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof. In some other embodiments, the internal connectors 762 and the external connector 764 may be conductive balls such as solder balls. The formation of the internal connectors 762 and the external connector 764 may include placing solder balls on the first and second contact pads 756 and 758, and then reflowing the solder balls. The solder ball on the second contact pad 758 is thicker than that on the first contact pad 756 because the second contact pad 758 provides an area less than that that of the first contact pad 756 for placing the solder ball. That is, the external connector 764 is thicker than the internal connectors 762 due to the area difference between the first and second contact pads 756 and 758. Moreover, the combined structure of the internal connectors 762 and the overlying conductive structure 766, i.e. the conductive feature 770, is thinner than the external connector 764. That is, a top of the conductive feature 770 is lower than that of the external connector 764, and the conductive feature 770 can thus be spatially separated from the device that is attached to the external connector 764, so that an electrical connection between the inductor I8 and the device attached to the external connector 764 may not be created.

The external connectors 764 may be arranged in a grid pattern of rows and columns and thus form a ball grid array (BGA). By using the RDL 750, the pitch of conductive pillars 736 of the semiconductor device 730 can be fanned out to the pitch of the external connectors 764. Afterwards, the package structure may be de-bonded from the carrier C7, and the adhesive layer (not shown) between the buffer layer 710 and the carrier C7 is also cleaned from the package structure, and then, the package structure may be sawed into a plurality of package structures. A top view of one resulting structure is shown in FIG. 61.

Figure 61:
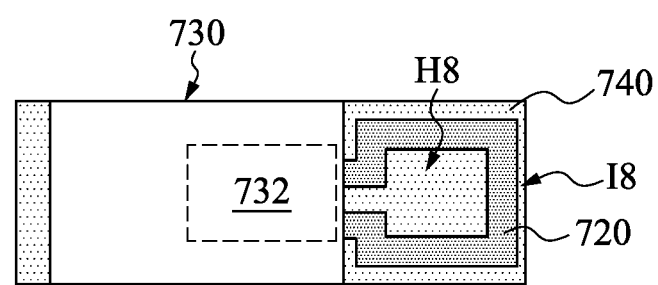

As shown in FIG. 60 and FIG. 61, the inductor I8 penetrates through the molding material 740 and is electrically connected to the semiconductor device 730. For example, the inductor I8 and the conductive pillars 736 can be electrically connected by the wiring structure 754 of the RDL 750. The through hole H8 is filled by the molding material 740 because the inductor I8 is molded in the molding material 740. The inductor I8 and the semiconductor device 730 are together molded in the molding material 740, so it may be beneficial to scale down the package structure incorporating with the inductor I8 therein.

Figure 62:
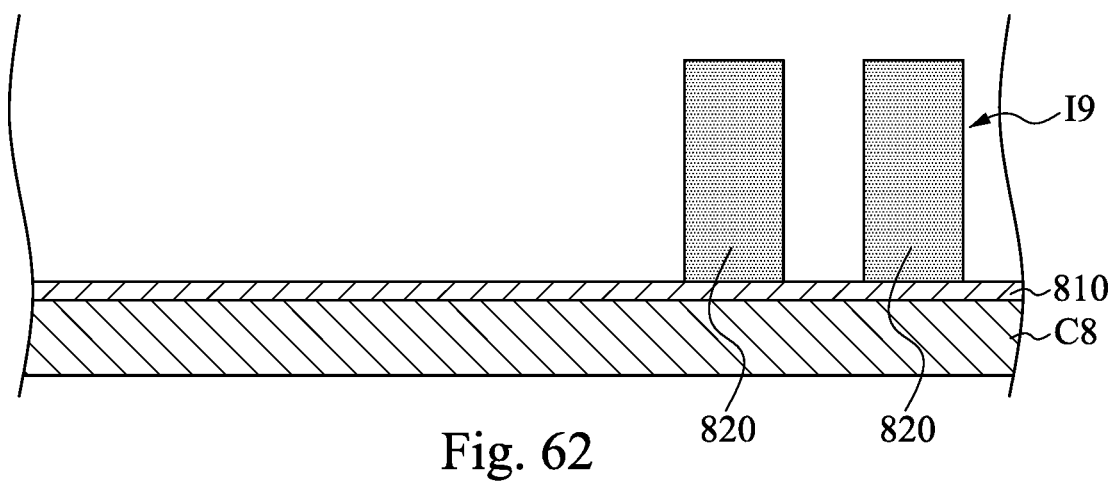
FIGS. 62-69 illustrate a method of forming a package structure in accordance with some embodiments of the present disclosure.

FIGS. 62-69 illustrate a method of forming a package structure in accordance with some embodiments of the present disclosure. Referring to FIG. 62, a buffer layer 810 is formed on a carrier C8. The buffer layer 810 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. The buffer layer 810 is a substantially planar layer having a substantially uniform thickness, in which the thickness may be greater than about 2 μm, and may be in a range from about 2 μm to about 40 μm. In some embodiments, top and bottom surfaces of the buffer layer 810 are also substantially planar. The carrier C8 may be a blank glass carrier, a blank ceramic carrier, or the like. In some embodiments, an adhesive layer (not shown) can be formed on the carrier C8, and the buffer layer 810 is formed on the adhesive layer. The adhesive layer may be made of an adhesive, such as ultra-violet (UV) glue, light-to-heat conversion (LTHC) glue, or the like, although other types of adhesives may be used.

Figure 63:
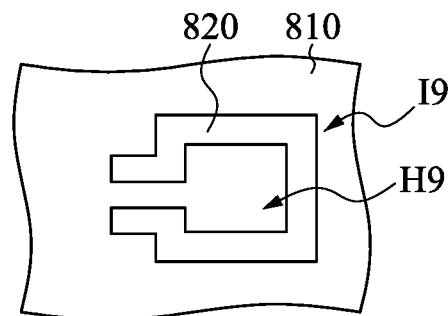

Thereafter, a TIV 820 is formed on the buffer layer 810 and formed in a spiral pattern in a top view, as shown in FIG. 63. The TIV 820 formed in the spiral pattern can be referred to as an inductor I9, especially a spiral inductor I9 having a through hole H9 therein. Formation of the TIV 820 may exemplarily include forming a blanket seed layer on the buffer layer 810, applying a photoresist over the seed layer and patterning the photoresist to form an opening with a spiral pattern, forming a conductive feature in the opening through plating, removing the photoresist to expose portions of the seed layer, and removing the exposed portions of the seed layer using an anisotropic etching. The remaining portion of the seed layer and the overlying conductive feature can be collectively referred to as the TIV 820. The resulting structure is shown in FIGS. 62 and 63.

Figure 64:
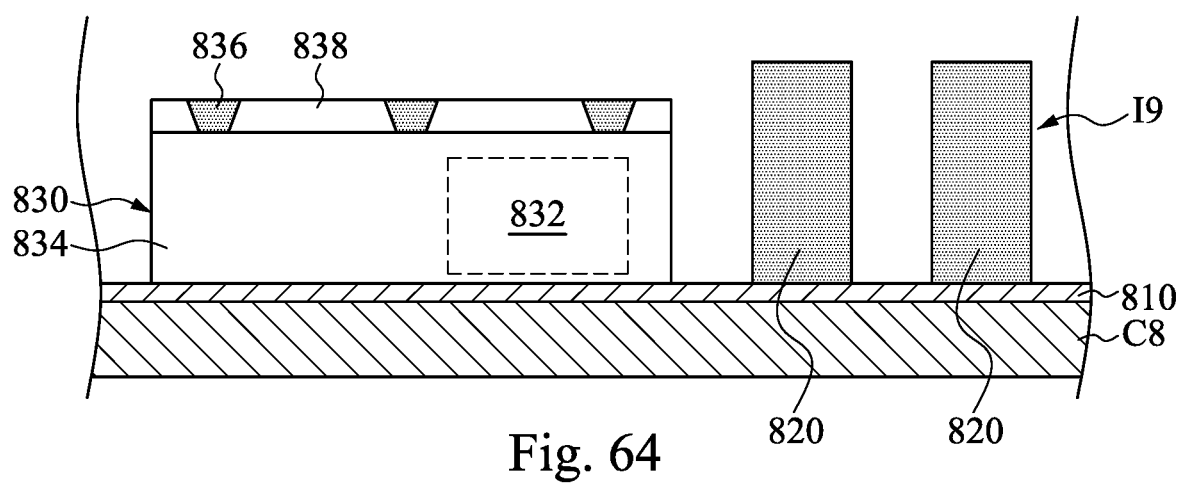

FIG. 64 illustrates placement of a semiconductor device 830 over the buffer layer 810. The semiconductor device 830 may be adhered to the buffer layer 810 through adhesive (not shown). In some embodiments, the semiconductor device 830 includes an unpackaged semiconductor device, i.e. device die. For example, the semiconductor device 830 may be a logic device die including logic transistors therein. In some exemplary embodiments, the semiconductor device 830 may be a central computing unit (CPU) die with a voltage regulator (VR) die 832. In some other embodiments, the CPU die and the VR die may be disposed in individual semiconductor devices. The semiconductor device 830 includes a semiconductor substrate 834 (a silicon substrate, for example) that is adhered to the buffer layer 810, wherein the back surface of the semiconductor substrate 834 is in contact with the adhesive on the buffer layer 810.

In some exemplary embodiments, conductive pillars 836 (such as copper posts) are formed as the top portions of the semiconductor device 830, and are electrically coupled to the devices such as transistors (not shown) in the semiconductor device 830. In some embodiments, a dielectric layer 838 is formed on the top surface of the semiconductor device 830, with the conductive pillars 836 having at least lower portions in the dielectric layer 838. The top surfaces of the conductive pillars 836 may be substantially level with the top surface of the dielectric layer 838 in some embodiments. Alternatively, the dielectric layer is not formed, and the conductive pillars 836 protrude from a top dielectric layer (not shown) of the semiconductor device 830.

Figure 65:
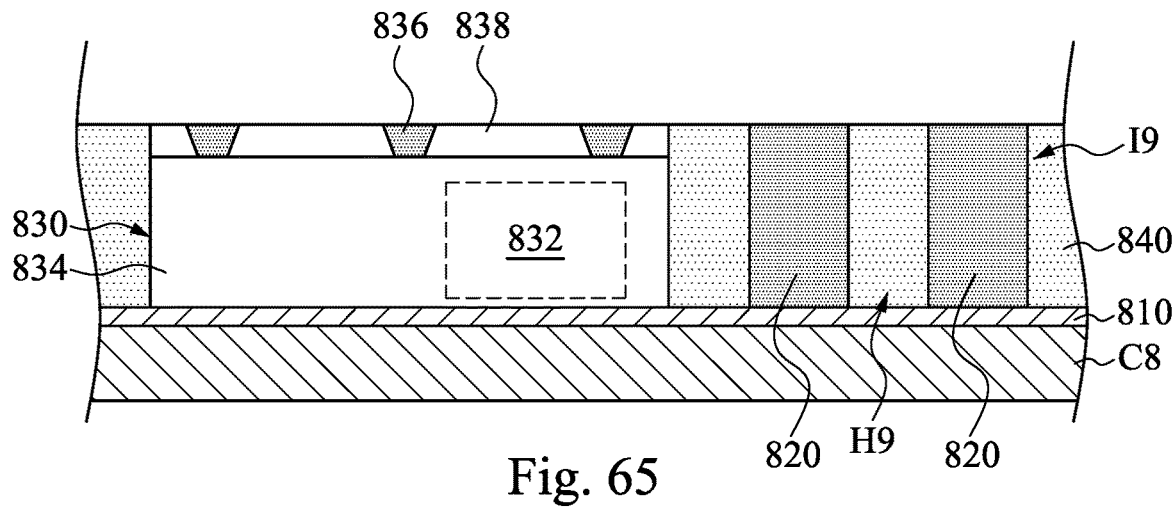

Reference is made to FIG. 65. A molding material 840 is molded on the semiconductor device 830 and the TIV 820. Thereafter, a grinding step is performed to thin the molding material 840, until the conductive pillars 836 and the TIV 820 are exposed, and the resulting structure is shown in FIG. 65. The molding material 840 fills gaps between the semiconductor device 830 and the TIV 820, and may be in contact with the buffer layer 810. Furthermore, the molding material 840 is filled into gaps between the conductive pillars 836 when the conductive pillars 836 are protruding metal pillars (this arrangement is not shown). In some embodiments, the molding material 840 includes a polymer-based material. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Due to the grinding, the inductor I9 penetrates through the molding material 840. Further, due to the grinding, the top end of the TIV 820 is substantially level (coplanar) with the top ends of the conductive pillars 836, and is substantially level (coplanar) with the top surface of the molding material 840. In other words, a top of the inductor I9 formed by the TIV 820 is substantially level with that of the molding material 840. As a result of the grinding, conductive residues such as metal particles may be generated, and left on the top surface of the structure shown in FIG. 65. Accordingly, after the grinding, a cleaning may be performed, for example, through a wet etching, so that the conductive residues are removed.

Figure 66:
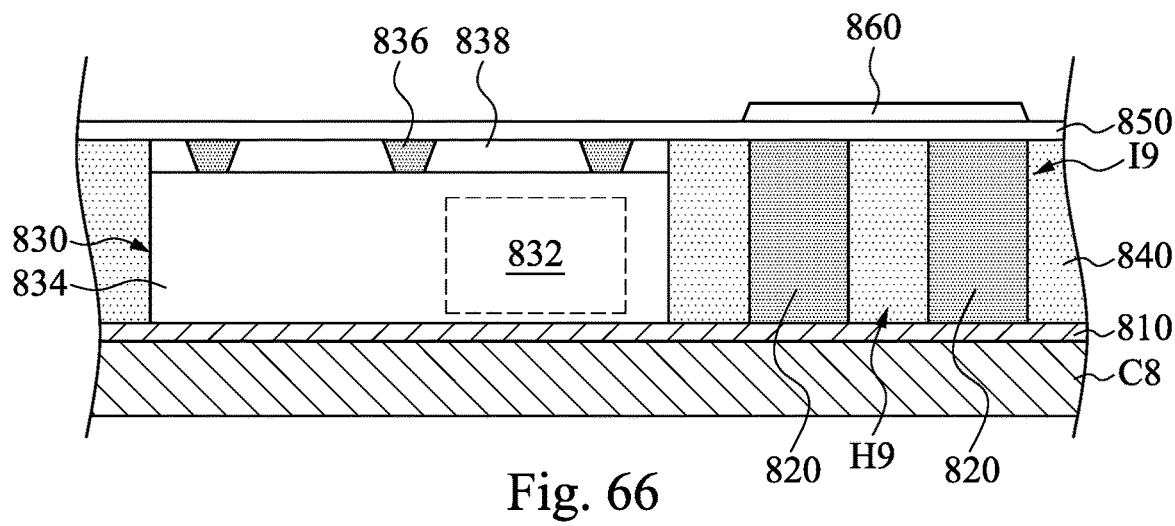

Reference is made to FIG. 66. A dielectric layer 850 is formed on the structure shown in FIG. 65. That is, a blanket dielectric layer 650 caps the TIV 820, the semiconductor device 830 and the molding material 840. Formation of the dielectric layer 850 may exemplarily include deposition, such as physical vapor deposition (PVD) or chemical vapor deposition (CVD). In some embodiments, the dielectric layer 850 is a low temperature silicon nitride layer.

Next, a magnetic film 860 is formed on at least a portion of the dielectric layer 850, and this portion of the dielectric layer 850 overlies the TIV 820. That is, the inductor I9 underlies the magnetic film 860, and they are spaced apart by the dielectric layer 850, so that the magnetic film 860 is located on the through hole H9 of the inductor I9 and is electrically insulated from the inductor I9. This magnetic film 860 can serve as a magnetic core for the inductor I9 to increase the magnetic field and thus improve the inductance of the inductor I9. Moreover, the inductor I9 can be scaled down due to that the inductance can be increased by the magnetic film 860 located on the through hole H9. In other words, the TIV 820 can be formed in a scaled down spiral pattern, which may be advantageous to scale down the package structure. Exemplarily formation method of the magnetic film 860 may include forming a blanket magnetic layer over the dielectric layer 850, applying a photoresist over the magnetic layer, patterning the photoresist to expose some portions of the magnetic layer, and performing an etch process on the magnetic layer to remove the exposed portions of the magnetic layer, wherein an etching solution used in the etching process may include HF, $HNO_3$ and water, and the etch process may be operated at a temperature in a range from about 15° C. to about 40° C., as examples.

In some embodiments, the magnetic film 860 includes cobalt (Co), zirconium (Zr), tantalum (Ta), niobium (Nb), rhenium (Re), neodymium (Nd), praseodymium (Pr), nickel (Ni), or dysprosium (Dy). In some embodiments, the magnetic film 260 includes an amorphous cobalt (Co) alloy including cobalt (Co) and zirconium (Zr). Zirconium (Zr) helps make cobalt (Co) amorphous. In some embodiments, the magnetic film 860 includes a cobalt-zirconium (CoZr) alloy having one or more additional elements, such as tantalum (Ta) and niobium (Nb). For example, the magnetic film 860 may be made of CoZrTa (CZT) alloy. In some other embodiments, the magnetic film 860 includes a cobalt-zirconium (CoZr) alloy having one or more additional elements, such as a rare earth element, that help increase the ferromagnetic resonance of the cobalt-zirconium (CoZr) alloy. Rare earth elements include rhenium (Re), neodymium (Nd), praseodymium (Pr), or dysprosium (Dy). In some embodiments, the magnetic film 860 may include other alloys such as permalloy ($Ni_8OFe_2O$), orthnol ($Ni_5OFe_5O$), amorphous CoFeCu, supermalloy (NiFeMo), polymer ferrite materials or other suitable magnetic materials. Although one magnetic film 860 is shown in FIG. 66, there may be multiple magnetic films 860 formed on the dielectric layer 850 depending on a predetermined or desired inductance.

Figure 67:
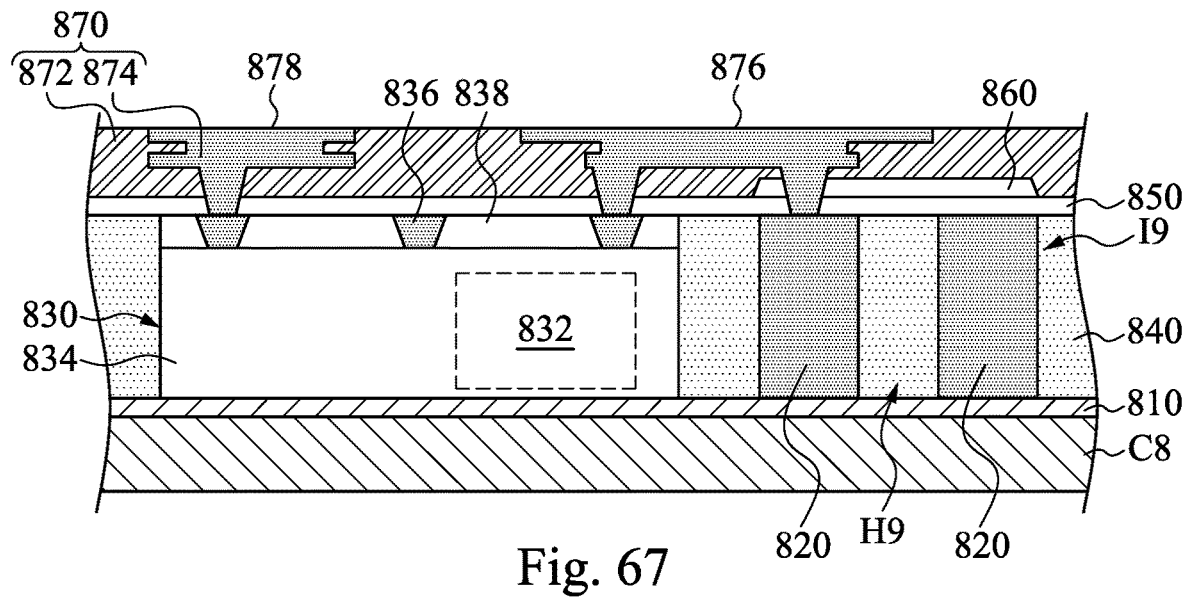

Reference is made to FIG. 67. A redistribution layer (RDL) 870 is formed over the magnetic film 860 and a dielectric layer 850, and after the forming the RDL 870, the magnetic film 860 is located in the RDL 870. The RDL 870 includes a dielectric structure 872 and a wiring structure 874 located in the dielectric structure 872. The wiring structure 874 is connected to the conductive pillars 836 and the TIV 820. The wiring structure 874 may also interconnect the conductive pillars 836 and the TIV 820. In the embodiments where the dielectric layer 850 is a blanket capping layer, the blanket dielectric capping layer 850 is patterned to expose some conductive pillars 836 and some portions of the TIV 820, and then, the RDL 870 is formed, wherein some portions of the wiring structure 874 penetrate through the dielectric layer 850 to connect to the exposed conductive pillars 836 and the exposed portions of the TIV 820. The blanket dielectric capping layer 850 is patterned using a photolithography and etch process, as examples.

The RDL 870 further includes a first contact pad 876 and a second contact pad 878. The first and second contact pads 876 and 878 are located on one side of the RDL 870 opposite to the molding material 840. The first contact pad 876 is electrically connected to the inductor I9 by the wiring structure 874. The second contact pad 878 is electrically connected to the semiconductor device 830 by the wiring structure 874. The first contact pad 876 has an area greater than that of the second contact pad 878. For example, the first and second contact pads 876 and 878 respectively have surfaces exposed by the dielectric structure 872, and the exposed surface of the first contact pad 876 has an area greater than that of the second contact pad 878. This area difference may be beneficial to make conductive features subsequently formed on the first and second contact pads 876 and 878 have different thicknesses.

In some embodiments, the formation of one layer of the wiring structure 874 includes forming a blanket copper seed layer, forming and patterning a mask layer over the blanket copper seed layer, performing a plating to form the wiring structure 874, removing the mask layer, and performing a flash etching to remove the portions of the blanket copper seed layer not covered by the wiring structure 874. In alternative embodiments, the RDL 870 is formed by depositing metal layers, patterning the metal layers, and filling gaps between separated portions of the wiring structure 874 with the dielectric structure 872. The wiring structure 874 may include a metal or a metal alloy including aluminum, copper, tungsten, and/or alloys thereof. The first and second contact pads 876 and 878 may be under-ball metallization (UBM) structures formed on the wiring structure 874. The wiring structure 874 and first and second contact pads 876 and 878 may have substantially the same material. For example, the first and second contact pads 876 and 878 may also include a metal or a metal alloy including aluminum, copper, tungsten, and/or alloys thereof. The dielectric structure 872 in these embodiments may include a polymer such as polyimide, benzocyclobutene (BCB), polybenzoxazole (PBO), or the like. Alternatively, the dielectric structure 872 may include non-organic dielectric materials such as silicon oxide, silicon nitride, silicon carbide, silicon oxynitride, or the like. Amount of the layers of the dielectric structure 872 and the wiring structure 874 can depend on the routing design of the respective package.

Figure 68:
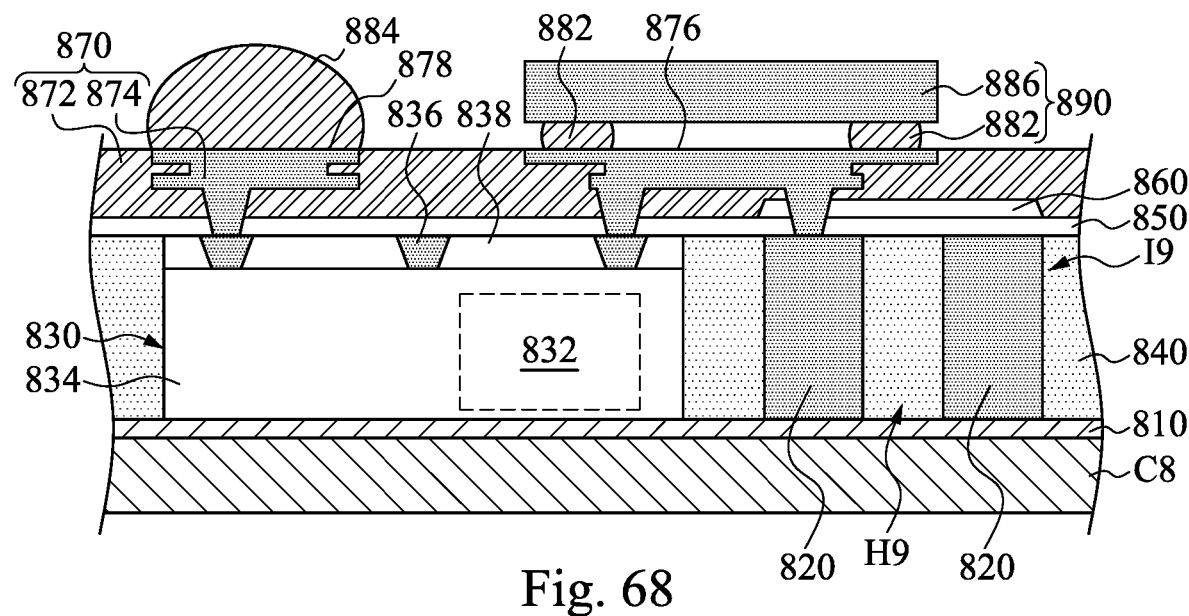

Reference is made to FIG. 68. Internal connectors 882 are formed on the first contact pad 876 of the RDL 870, and an external connector 884 is formed on the second contact pad 878 of the RDL 870. Thereafter, a conductive structure 886 such as a thick metal wire is attached to the internal connectors 882. The combined structure of the internal connectors 882 and the overlying conductive structure 886 can be referred to as a conductive feature 890 located on the first contact pad 876. The conductive feature 890 protrudes with respect to the dielectric structure 872. That is, the conductive feature 890 is at least partially located outside the dielectric structure 872. The conductive feature 890 is electrically connected to the inductor I9 by the underlying first contact pad 876 and the wiring structure 874, so as to reduce a resistance of a current path between the inductor I9 and the semiconductor device 830, and the Q factor of the inductor I9 can be thus improved. Furthermore, the lower the resistance of the current path between the inductor I9 and the semiconductor device 830 is, the higher the power conversion efficiency of the VR die 832 is. As such, the conductive feature 890 may be also advantageous to increase the power conversion efficiency of the VR die 832.

The internal connectors 882 and the external connector 884 may include substantially the same material in some embodiments. The internal connectors 882 and the external connector 884 can include, for example, as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof. In some other embodiments, the internal connectors 882 and the external connector 884 may be conductive balls such as solder balls. The formation of the internal connectors 882 and the external connector 884 may include placing solder balls on the first and second contact pads 876 and 878, and then reflowing the solder balls. The solder ball on the second contact pad 878 is thicker than that on the first contact pad 876 because the second contact pad 878 provides an area less than that that of the first contact pad 876 for placing the solder ball. That is, the external connector 884 is thicker than the internal connectors 882 due to the area difference between the first and second contact pads 876 and 878. Moreover, the combined structure of the internal connectors 882 and the overlying conductive structure 886, i.e. the conductive feature 890, is thinner than the external connector 884. That is, a top of the conductive feature 890 is lower than that of the external connector 884, and the conductive feature 890 can thus be spatially separated from the device that is attached to the external connector 884, so that an electrical connection between the inductor I9 and the device attached to the external connector 884 may not be created.

The external connectors 884 may be arranged in a grid pattern of rows and columns and thus form a ball grid array (BGA). By using the RDL 870, the pitch of conductive pillars 836 of the semiconductor device 830 can be fanned out to the pitch of the external connectors 884. Afterwards, the package structure may be de-bonded from the carrier C8, and the adhesive layer (not shown) between the buffer layer 810 and the carrier C8 is also cleaned from the package structure, and then, the package structure may be sawed into a plurality of package structures. A top view of one resulting structure is shown in FIG. 69.

Figure 69:
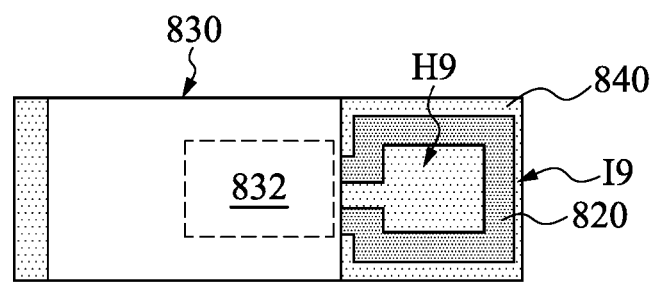

As shown in FIG. 68 and FIG. 69, the inductor I9 penetrates through the molding material 840 and is electrically connected to the semiconductor device 830. For example, the inductor I9 and the conductive pillars 836 can be electrically connected by the wiring structure 874 of the RDL 870. The through hole H9 is filled by the molding material 840 because the inductor I9 is molded in the molding material 840. The inductor I9 and the semiconductor device 830 are together molded in the molding material 840, so it may be beneficial to scale down the package structure incorporating with the inductor I9 therein.

Figure 70:
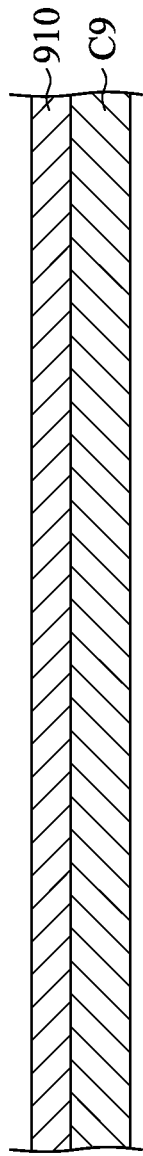

FIGS. 70-88 illustrate a method of forming a package structure in accordance with some embodiments of the present disclosure. Referring to FIG. 70, a buffer layer 910 is formed on a carrier C9. The buffer layer 910 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. The buffer layer 910 is a substantially planar layer having a substantially uniform thickness, in which the thickness may be greater than about 2 μm, and may be in a range from about 2 μm to about 40 μm. In some embodiments, top and bottom surfaces of the buffer layer 910 are also substantially planar. The carrier C9 may be a blank glass carrier, a blank ceramic carrier, or the like. In some embodiments, an adhesive layer (not shown) can be formed on the carrier C9, and the buffer layer 910 is formed on the adhesive layer. The adhesive layer may be made of an adhesive, such as ultra-violet (UV) glue, light-to-heat conversion (LTHC) glue, or the like, although other types of adhesives may be used.

Figure 71:
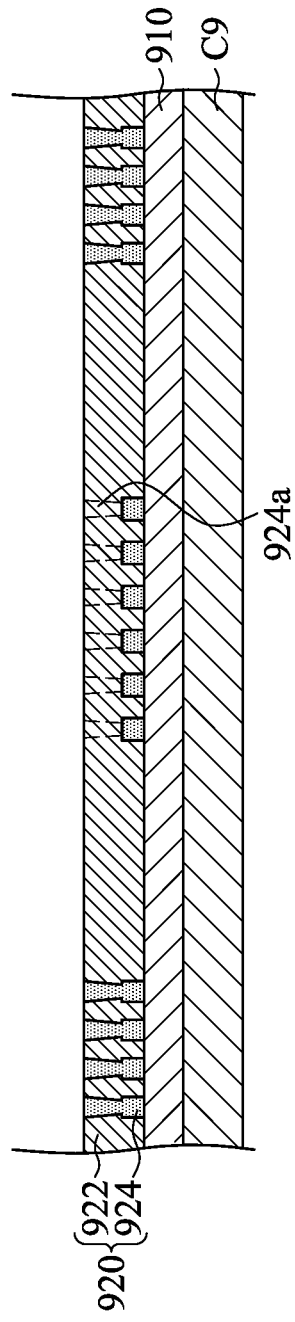
Figure 72:
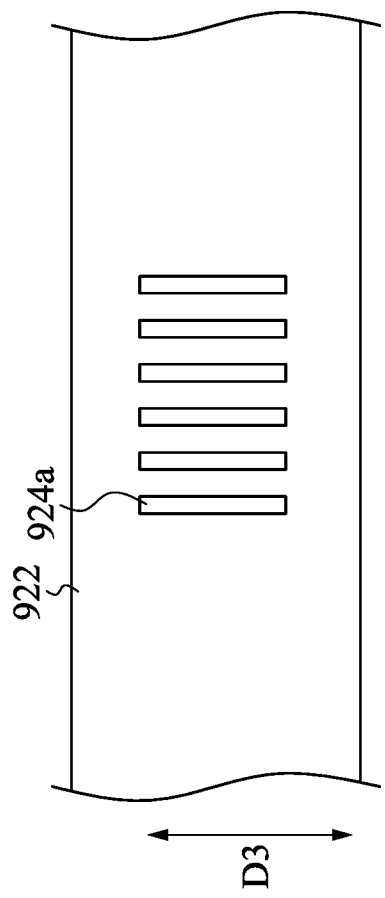

Next, referring to FIG. 71, a first redistribution layer (RDL) 920 is formed over the buffer layer 910. The first RDL 920 includes a dielectric structure 922 and a wiring structure 924 located in the dielectric structure 922. The wiring structure 924 includes a plurality of conductive features 924a extending laterally over a surface of the dielectric structure 922. For example, as shown in FIG. 72, which is a fragmentary top view of the structure in FIG. 71, the conductive features 924a, which may be formed as conductive lines, extend in a direction D3 and are arranged in a direction perpendicular to the direction D3. The conductive features 924a may serve as portions of an inductor, especially a helical inductor, formed in subsequently steps.

In some embodiments, the formation of one layer of the wiring structure 924 includes forming a blanket copper seed layer, forming and patterning a mask layer over the blanket copper seed layer, performing a plating to form the wiring structure 924, removing the mask layer, and performing a flash etching to remove the portions of the blanket copper seed layer not covered by the wiring structure 924. In alternative embodiments, the first RDL 920 is formed by depositing metal layers, patterning the metal layers, and filling gaps between separated portions of the wiring structure 924 with the dielectric structure 922. The wiring structure 924 may include a metal or a metal alloy including aluminum, copper, tungsten, and/or alloys thereof. The dielectric structure 922 in these embodiments may include a polymer such as polyimide, benzocyclobutene (BCB), polybenzoxazole (PBO), or the like. Alternatively, the dielectric structure 922 may include non-organic dielectric materials such as silicon oxide, silicon nitride, silicon carbide, silicon oxynitride, or the like. Amount of the layers of the dielectric structure 922 and the wiring structure 924 can depend on the routing design of the respective package.

Figure 73:
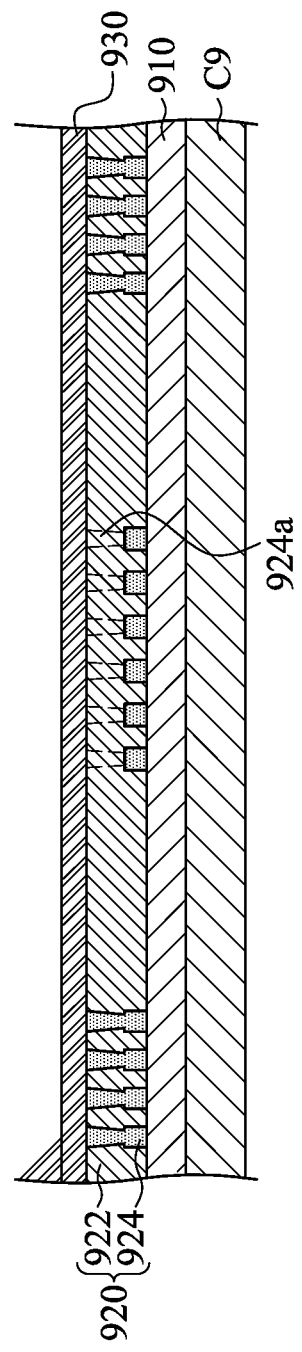

Reference is made to FIG. 73. A dielectric layer 930 is formed on the structure shown in FIG. 72. That is, a blanket dielectric layer 930 caps the first RDL 920. Formation of the dielectric layer 930 may exemplarily include deposition, such as physical vapor deposition (PVD) or chemical vapor deposition (CVD). In some embodiments, the dielectric layer 930 is a low temperature silicon nitride layer.

Figure 74:
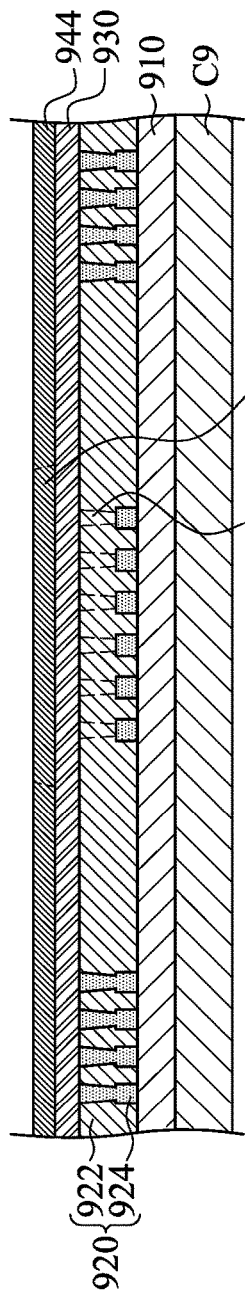

Next, as shown in FIG. 74, a magnetic film 942 is formed on a portion of the dielectric layer 930, and this portion of the dielectric layer 930 overlies the conductive features 924a. That is, the conductive features 924a serving as portions of the subsequently formed inductor underlie the magnetic film 942 so that the magnetic film 942 may be located in the subsequently formed inductor. Therefore, the magnetic film 942 can serve as a magnetic core for the subsequently formed inductor to increase the magnetic field and thus improve the inductance of the subsequently formed inductor. Exemplarily formation method of the magnetic film 942 may include forming a blanket magnetic layer over the dielectric layer 930, applying a photoresist over the magnetic layer, patterning the photoresist to expose some portions of the magnetic layer, and performing an etch process on the magnetic layer to remove the exposed portions of the magnetic layer, wherein an etching solution used in the etching process may include HF, $HNO_3$ and water, and the etch process may be operated at a temperature in a range from about 15° C. to about 40° C., as examples. In some embodiments, the magnetic film 942 includes cobalt (Co), zirconium (Zr), tantalum (Ta), niobium (Nb), rhenium (Re), neodymium (Nd), praseodymium (Pr), nickel (Ni), or dysprosium (Dy). In some embodiments, the magnetic film 942 includes an amorphous cobalt (Co) alloy including cobalt (Co) and zirconium (Zr). Zirconium (Zr) helps make cobalt (Co) amorphous. In some embodiments, the magnetic film 942 includes a cobalt-zirconium (CoZr) alloy having one or more additional elements, such as tantalum (Ta) and niobium (Nb). For example, the magnetic film 942 may be made of CoZrTa (CZT) alloy. In some other embodiments, the magnetic film 942 includes a cobalt-zirconium (CoZr) alloy having one or more additional elements, such as a rare earth element, that help increase the ferromagnetic resonance of the cobalt-zirconium (CoZr) alloy. Rare earth elements include rhenium (Re), neodymium (Nd), praseodymium (Pr), or dysprosium (Dy). In some embodiments, the magnetic film 942 may include other alloys such as permalloy ($Ni_8OFe_2O$), orthnol ($Ni_5OFe_5O$), amorphous CoFeCu, supermalloy (NiFeMo), polymer ferrite materials or other suitable magnetic materials. Although one magnetic film 942 is shown in FIG. 74, there may be multiple magnetic films 942 formed on the dielectric layer 930 depending on a predetermined or desired inductance.

Next, a dielectric layer 944 is formed on other portions of the dielectric layer 930 not covered by the magnetic film 942. Formation of the dielectric layer 944 may exemplarily include deposition, such as physical vapor deposition (PVD) or chemical vapor deposition (CVD). After the deposition process of the dielectric layer 944, an etch back process may be performed on the dielectric layer 944 to remove a portion of the dielectric layer 944, and this process may stop at the magnetic film 942, so that a top surface of the magnetic film 942 is exposed. The dielectric layer 944 may be a polymer layer. The polymer layer may include, for example, polyimide, polybenzoxazole (PBO), benzocyclobutene (BCB), an ajinomoto buildup film (ABF), a solder resist film (SR), or the like.

Figure 75:
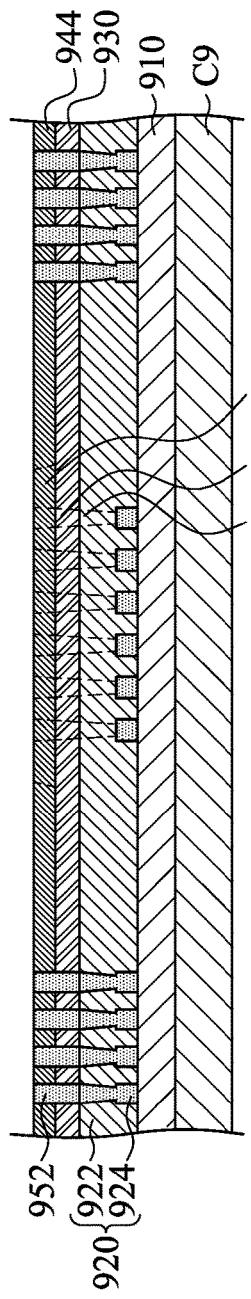
Figure 76:
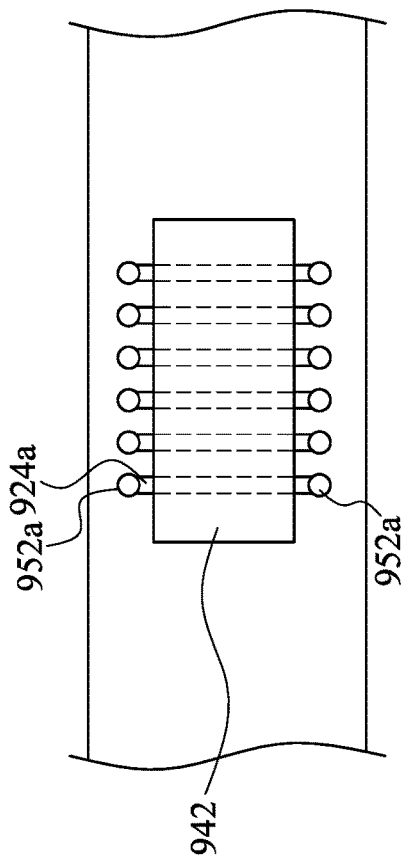

Reference is made to FIG. 75. Conductive features 952 are formed through the dielectric layers 930 and 944 to connect to the underlying wiring structure 924 of the first RDL 920. Some conductive features 952a penetrating through the dielectric layers 930 and 944 are respectively connected to opposite ends of the conductive features 924a, as shown in FIG. 76, which is a fragmentary top view of FIG. 75. These conductive features 952a may serve as portions of the subsequently formed inductor as well. Moreover, the conductive features 952a are respectively located on opposite sides of the magnetic film 942, and they do not penetrate through the magnetic film 942, as shown in FIG. 76. The conductive features 952 and the magnetic film 942 can be spaced apart and electrically insulated by the dielectric layer 944. This arrangement may be beneficial to make the subsequently formed inductor surround and not electrically connect to the magnetic film 942, so that the magnetic film 942 can serve as a magnetic core for the inductor. Exemplary method of forming the conductive features 952 and 952a may include forming a mask layer over the dielectric layer 944, patterning the mask layer to form openings, through which portions of the dielectric layer 944 are exposed, removing the exposed portions of the dielectric layer 944 and the underlying portions of the dielectric layer 930 to deepen the openings such that some portions of the wiring structure 924 and the conductive features 924a are exposed, forming conductive material into the openings to connect to the exposed portions of the wiring structure 924 and the conductive features 924a, and removing the mask layer and the excess conductive material outside the dielectric layer 944 to form the conductive features 952 and 952a.

Figure 77:
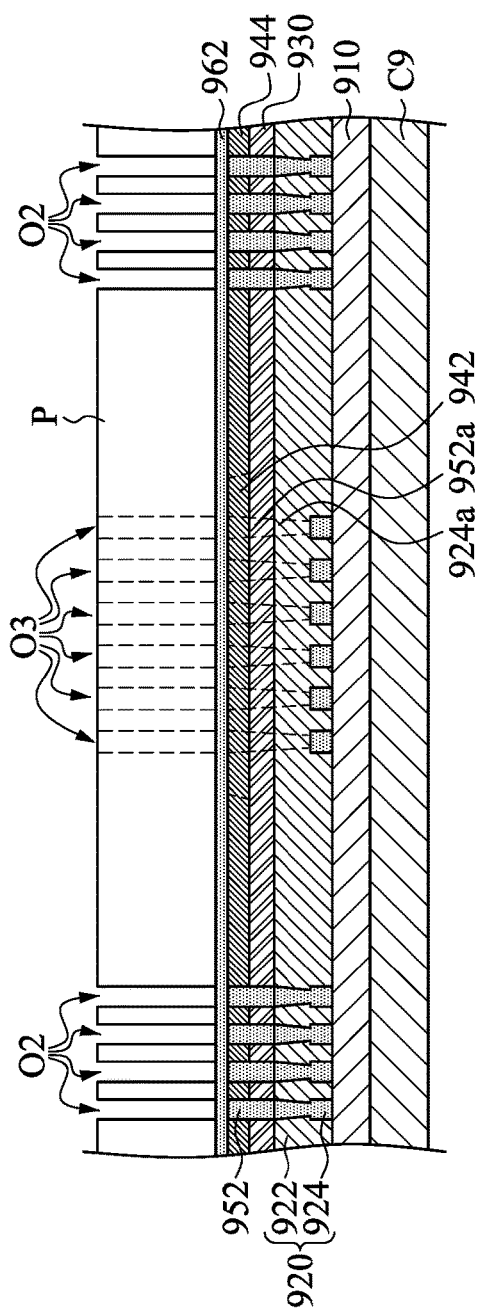

Next, as shown in FIG. 77, a seed layer 962 is formed on the magnetic film 942, the dielectric layer 944 and the conductive features 952 and 952a, for example, through physical vapor deposition (PVD) or metal foil laminating. The seed layer 962 may include copper, copper alloy, aluminum, titanium, titanium alloy, or combinations thereof. In some embodiments, the seed layer 962 includes a titanium layer and a copper layer over the titanium layer. In alternative embodiments, the seed layer 962 is a copper layer.

Figure 78:
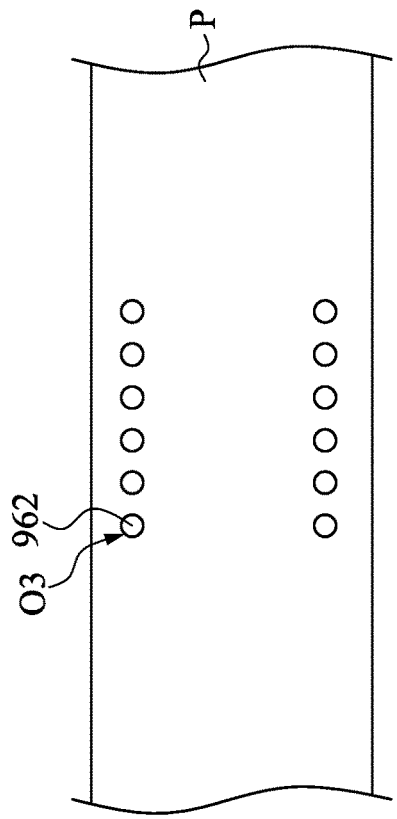

Thereafter, a photoresist P is applied over the seed layer 962 and is then patterned. As a result, openings O2 and O3 are formed in the photoresist P, through which some portions of the seed layer 962 are exposed. The pattern of the openings O3 is substantially the same as that of the conductive features 952a, and some portions of the seed layer 962 overlying the conductive features 952a are thus respectively exposed by the openings O3, as shown in FIG. 78, which is a fragmentary top view of the structure in FIG. 77.

Figure 79:
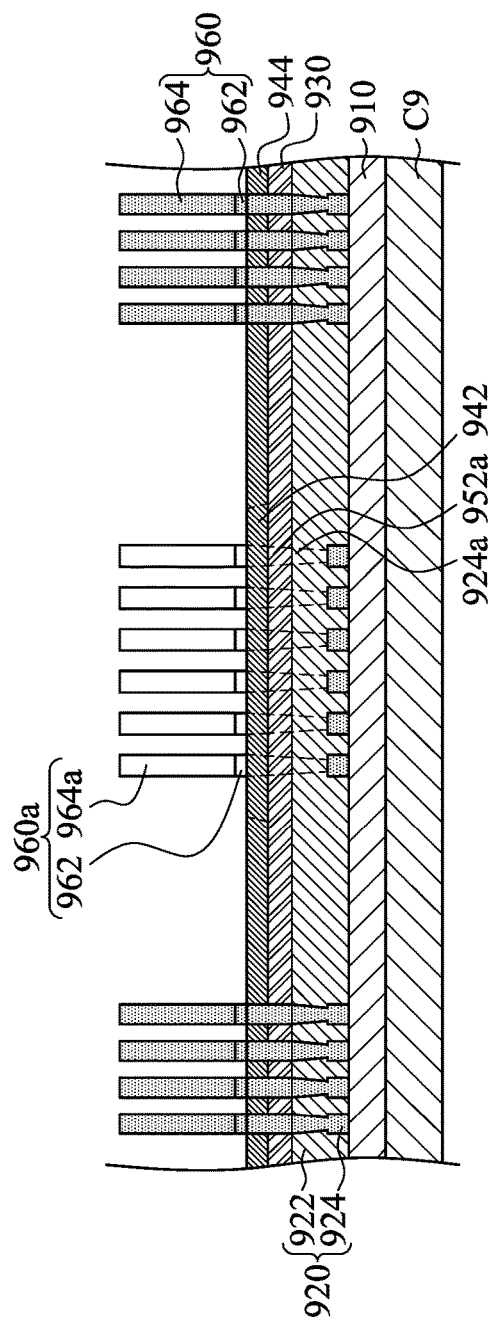

Reference is made to FIG. 79. Conductive features 964 and 964a are respectively formed in the openings O2 and O3 of the photoresist P through plating, which may be electro plating or electro-less plating. The conductive features 964 and 964a are plated on the exposed portions of the seed layer 962. The conductive features 964 and 964a may include copper, aluminum, tungsten, nickel, solder, or alloys thereof. Heights of the conductive features 964 and 964a can be determined by the thickness of the subsequently placed semiconductor device 970 (FIG. 80), with the heights of the conductive features 964 and 964a greater than the thickness of the semiconductor device 970 in some embodiments of the present disclosure. After the plating of the conductive features 964 and 964a, the photoresist P is removed. After the photoresist P is removed, some portions of the seed layer 962 are exposed. An etch step is performed to remove the exposed portions of the seed layer 962, wherein the etch step may include an anisotropic etching. After the exposed portions of the seed layer 962 are removed, the magnetic film 942 and some portions of the dielectric layer 944 are exposed. Portions of the seed layer 962 that are covered by the conductive features 964 and 964a, on the other hand, remain not etched. The conductive features 964 and the remaining underlying portions of the seed layer 962 are in combination referred to as through integrated fan-out (InFO) vias (TIV) 960, which are also referred to as through-vias. The conductive features 964a and the remaining underlying portions of the seed layer 962 are in combination referred to as TIVs 960a, and these TIVs 960a can serve as portions of the subsequently formed inductor. More particularly, since the TIVs 960a are respectively formed in the openings O3, the TIVs 960a can be respectively connected to the conductive features 952a that are connected to opposite ends of the conductive features 924a. Therefore, the TIVs 960a, the conductive features 952a penetrating through the dielectric layers 930 and 944, and the conductive features 924a of the first RDL 920 can collectively serve as portions of the subsequently formed inductor.

Although the seed layer 962 is shown as a layer separate from the conductive features 964 and 964a, when the seed layer 962 is made of a material similar to or substantially the same as the respective overlying conductive features 964 and 964a, the seed layer 962 may be merged with the conductive features 964 and 964a with no distinguishable interface therebetween. In alternative embodiments, there exist distinguishable interfaces between the seed layer 962 and the overlying conductive features 964 and 964a.

Figure 80:
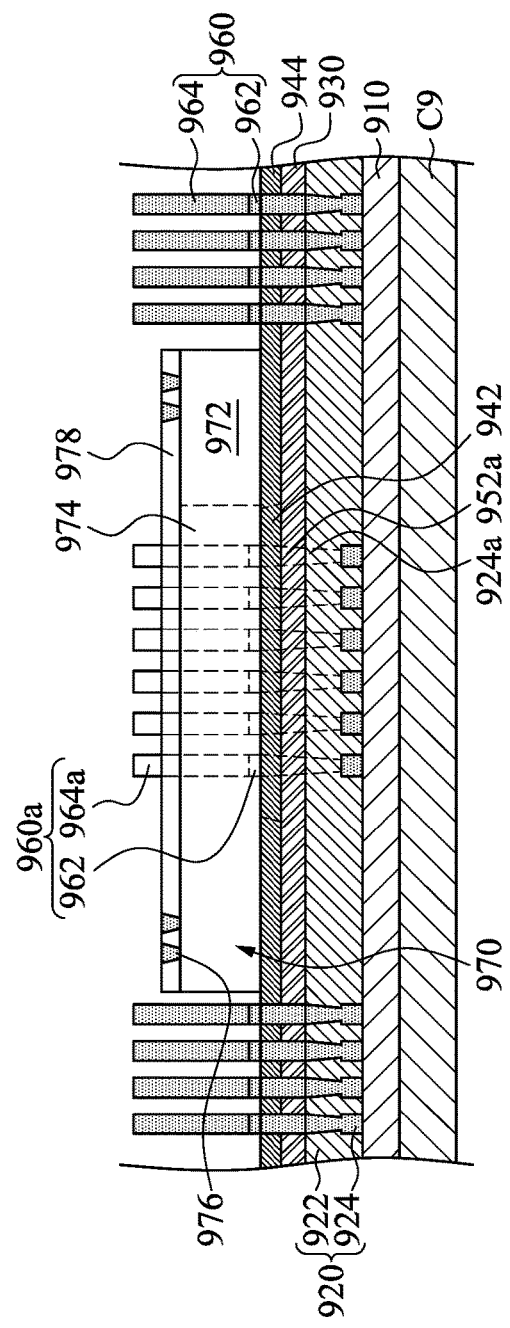
Figure 81:
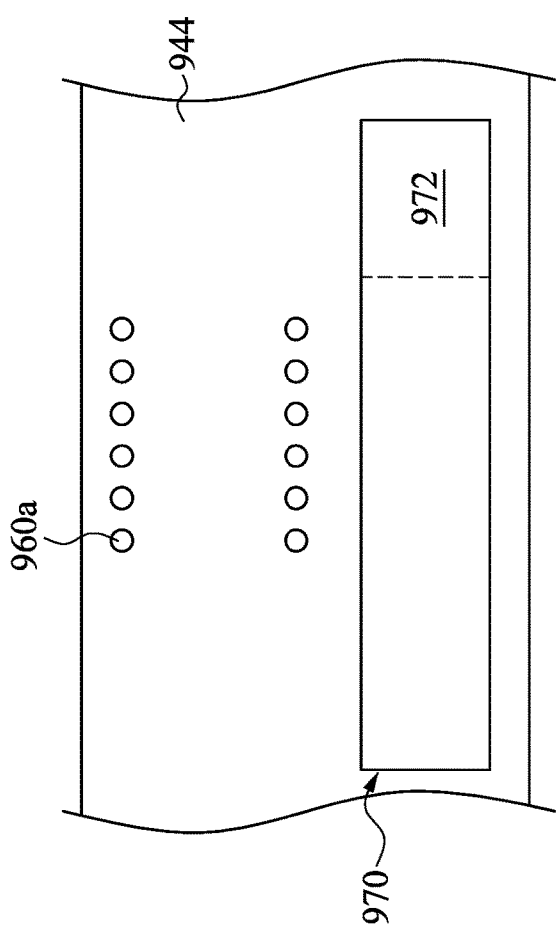

FIG. 80 illustrates placement of a semiconductor device 970 over the dielectric layer 944. The semiconductor device 970 may be adhered to the dielectric layer 944 through adhesive (not shown), and the TIVs 960a are located on one side of the semiconductor device 970, as shown in FIG. 81. In some embodiments, the semiconductor device 970 includes an unpackaged semiconductor device, i.e. device die. For example, the semiconductor device 970 may be a logic device die including logic transistors therein. In some exemplary embodiments, the semiconductor device 970 may be a central computing unit (CPU) die with a voltage regulator (VR) die 972. The semiconductor device 970 includes a semiconductor substrate 974 (a silicon substrate, for example) that is adhered to the dielectric layer 944, wherein the back surface of the semiconductor substrate 974 is in contact with the adhesive on the dielectric layer 944.

In some exemplary embodiments, conductive pillars 976 (such as copper posts) are formed as the top portions of the semiconductor device 970, and are electrically coupled to the devices such as transistors (not shown) in the semiconductor device 970. In some embodiments, a dielectric layer 978 is formed on the top surface of the semiconductor device 970, with the conductive pillars 976 having at least lower portions in the dielectric layer 978. The top surfaces of the conductive pillars 976 may be substantially level with the top surface of the dielectric layer 978 in some embodiments. Alternatively, the dielectric layer is not formed, and the conductive pillars 976 protrude from a top dielectric layer (not shown) of the semiconductor device 970.

Figure 82:
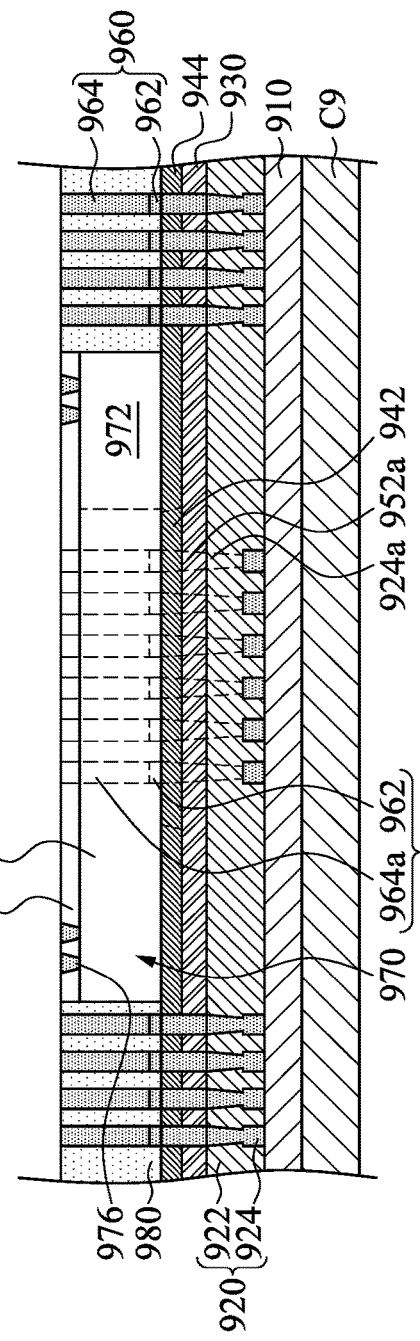

Reference is made to FIG. 82. A molding material 980 is molded on the semiconductor device 970 and the TIVs 960 and 960a. The molding material 980 fills gaps between the semiconductor device 970 and the TIVs 960 and 960a, and may be in contact with the dielectric layer 944. Furthermore, the molding material 980 is filled into gaps between the conductive pillars 976 when the conductive pillars 976 are protruding metal pillars (this arrangement is not shown). The top surface of the molding material 980 is higher than the top ends of the conductive pillars 976 and the TIVs 960 and 960a.

In some embodiments, the molding material 980 includes a polymer-based material. The term "polymer" can represent thermosetting polymers, thermoplastic polymers, or any mixtures thereof. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Next, a grinding step is performed to thin the molding material 980, until the conductive pillars 976 and the TIVs 960 and 960a are exposed. The resulting structure is shown in FIG. 82, in which the molding material 980 is in contact with sidewalls of the semiconductor device 970 and the TIVs 960 and 960a. Due to the grinding, top ends of the TIVs 960 and 960a are substantially level (coplanar) with the top ends of the conductive pillars 976, and are substantially level (coplanar) with the top surface of the molding material 980. As a result of the grinding, conductive residues such as metal particles may be generated, and left on the top surface of the structure shown in FIG. 82. Accordingly, after the grinding, a cleaning may be performed, for example, through a wet etching, so that the conductive residues are removed.

Reference is made to FIG. 83. A dielectric layer 990 is formed on the structure shown in FIG. 82. That is, a blanket dielectric layer 990 caps the TIVs 960 and 960a, the semiconductor device 970 and the molding material 980. Formation of the dielectric layer 990 may exemplarily include deposition, such as physical vapor deposition (PVD) or chemical vapor deposition (CVD). In some embodiments, the dielectric layer 990 is a low temperature silicon nitride layer.

Next, as shown in FIG. 84, a magnetic film 1000 is formed on a portion of the dielectric layer 990, and this portion of the dielectric layer 990 overlies the conductive features 924a of the first RDL 920. That is, the conductive features 924a serving as portions of the subsequently formed inductor underlie the magnetic film 1000, so that the magnetic film 1000 may be located in the subsequently formed inductor. Therefore, the magnetic film 1000 can serve as a magnetic core for the subsequently formed inductor to increase the magnetic field and thus improve the inductance of the subsequently formed inductor. Exemplarily formation method of the magnetic film 1000 may include forming a blanket magnetic layer over the dielectric layer 990, applying a photoresist over the magnetic layer, patterning the photoresist to expose some portions of the magnetic layer, and performing an etch process on the magnetic layer to remove the exposed portions of the magnetic layer, wherein an etching solution used in the etching process may include HF, $HNO_3$ and water, and the etch process may be operated at a temperature in a range from about 15° C. to about 40° C., as examples. In some embodiments, the magnetic film 1000 includes cobalt (Co), zirconium (Zr), tantalum (Ta), niobium (Nb), rhenium (Re), neodymium (Nd), praseodymium (Pr), nickel (Ni), or dysprosium (Dy). In some embodiments, the magnetic film 1000 includes an amorphous cobalt (Co) alloy including cobalt (Co) and zirconium (Zr). Zirconium (Zr) helps make cobalt (Co) amorphous. In some embodiments, the magnetic film 1000 includes a cobalt-zirconium (CoZr) alloy having one or more additional elements, such as tantalum (Ta) and niobium (Nb). For example, the magnetic film 1000 may be made of CoZrTa (CZT) alloy. In some other embodiments, the magnetic film 1000 includes a cobalt-zirconium (CoZr) alloy having one or more additional elements, such as a rare earth element, that help increase the ferromagnetic resonance of the cobalt-zirconium (CoZr) alloy. Rare earth elements include rhenium (Re), neodymium (Nd), praseodymium (Pr), or dysprosium (Dy). In some embodiments, the magnetic film 1000 may include other alloys such as permalloy ($Ni_8OFe_2O$), orthnol ($Ni_5OFe_5O$), amorphous CoFeCu, supermalloy (NiFeMo), polymer ferrite materials or other suitable magnetic materials. Although one magnetic film 1000 is shown in FIG. 84, there may be multiple magnetic films 1000 formed on the dielectric layer 990 depending on a predetermined or desired inductance.

Figure 85:
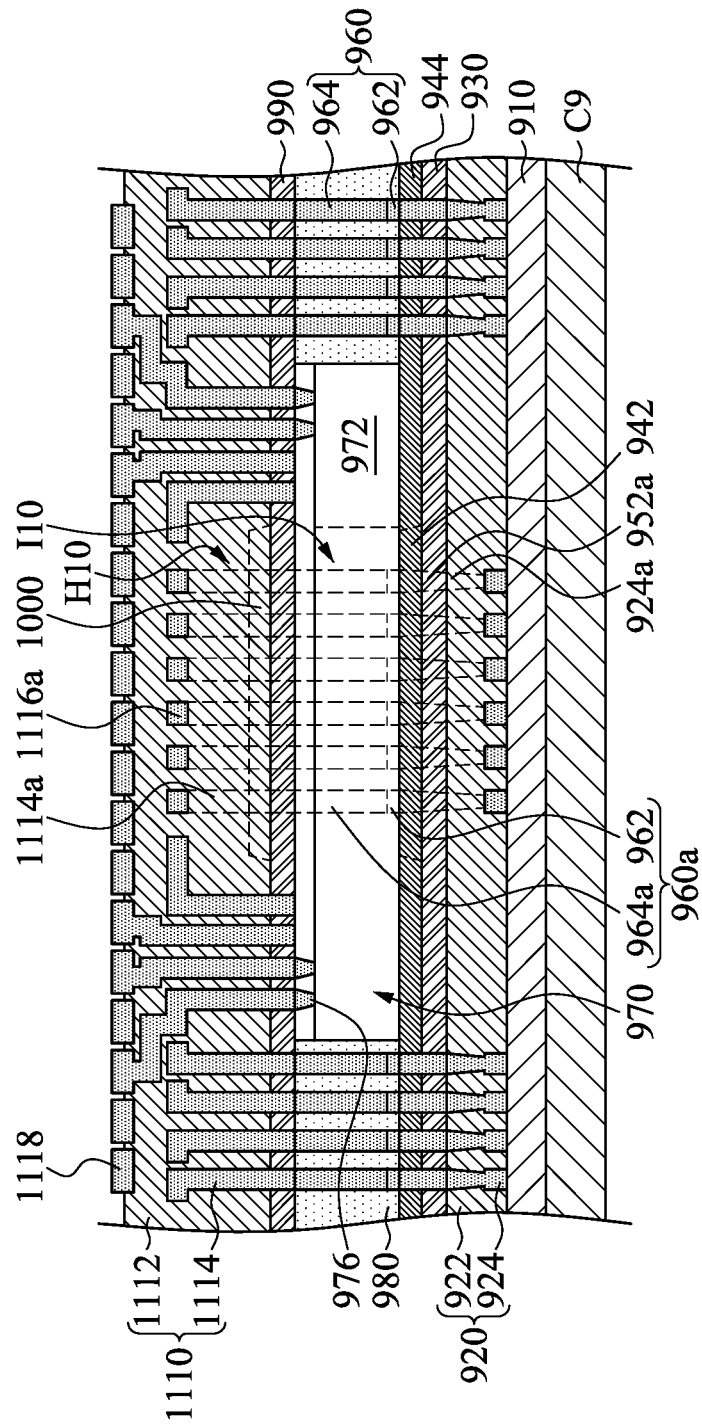

Reference is made to FIG. 85. A second redistribution layer (RDL) 1110 is formed over the magnetic film 1000 and the dielectric layer 990, and after the forming the second RDL 1110, the magnetic film 1000 is located in the second RDL 1110. The molding material 980 is located between the first and second RDLs 920 and 1110. The second RDL 1110 includes a dielectric structure 1112 and a wiring structure 1114 located in the dielectric structure 1112. The wiring structure 1114 is connected to the conductive pillars 976 of the semiconductor device 970 and the TIVs 960 and 960a. The wiring structure 1114 may also interconnect the conductive pillars 976 and the TIVs 960 and 960a. In the embodiments where the dielectric layer 990 is a blanket capping layer, the blanket dielectric capping layer 990 is patterned to expose some conductive pillars 976 and some portions of the TIVs 960 and 960a, and then, the second RDL 1110 is formed, wherein some portions of the wiring structure 1114 penetrate through the dielectric layer 990 to connect to the exposed conductive pillars 976 and the exposed portions of the TIVs 960 and 960a. The blanket dielectric capping layer 990 is patterned using a photolithography and etch process, as examples.

Figure 86:
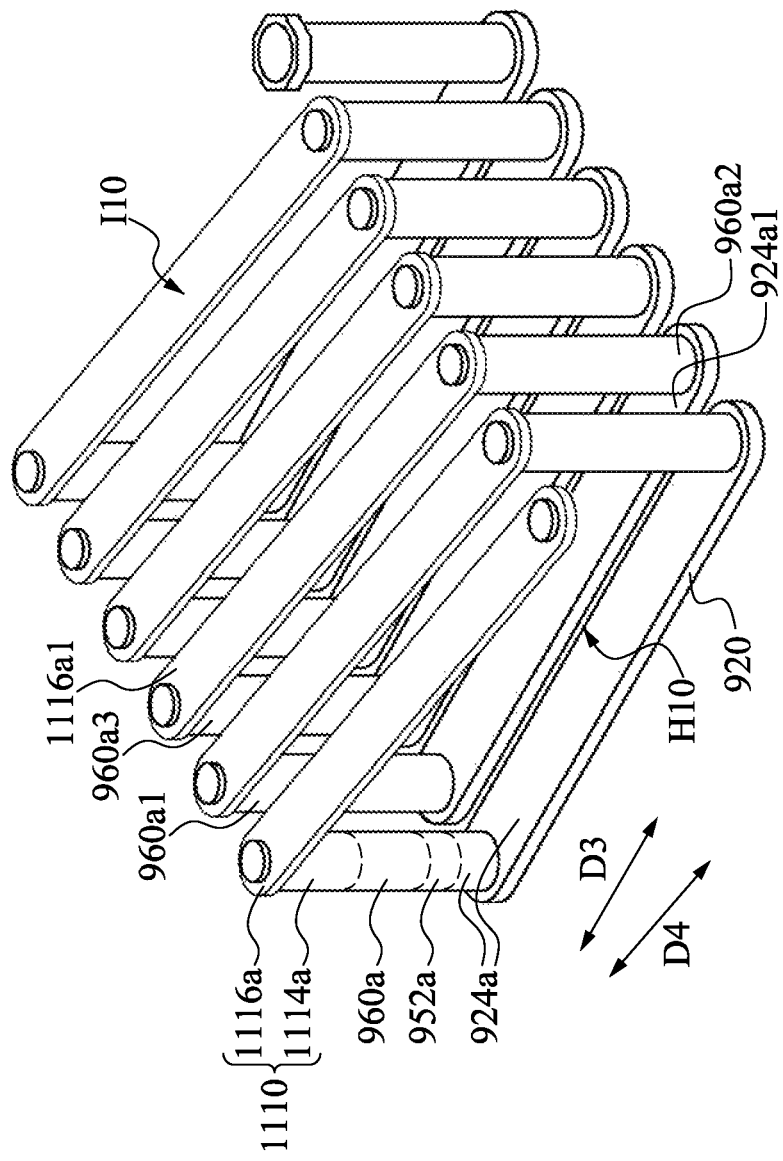

The wiring structure 1114 includes a plurality of conductive features 1114a and a plurality of conductive features 1116a. The conductive features 1114a extend vertically through the dielectric structure 1112 and the dielectric layer 990 to connect to the respective underlying TIVs 960a. The conductive features 1114a and the magnetic film 1000 are spaced apart and electrically insulated by the dielectric structure 1112. The conductive features 1116a extend laterally over a surface of the second RDL 1110 and are connected to the conductive features 1114a. The combined structure of the conductive structures 1116a and 1114a of the second RDL 1110, the TIVs 960a, the conductive features 952a penetrating through the dielectric layers 930 and 944, and the conductive features 924a of the first RDL 920 can be referred to as an inductor I10, especially a helical inductor I10, as shown in FIG. 86. Portions of the conductive features 924a of the first RDL 920, the overlying conductive features 952a, the overlying TIVs 960a, and the overlying conductive features 1114a of the second RDL 1110 can serve as vertical portions of the helical inductor I10. Portions of the conductive features 924a extending in the direction D3 can serve as bottom horizontal connections that connect bottoms of two vertical portions of the helical inductor I10. The conductive features 1116a of the second RDL 1110 extend in a direction D4 that is not parallel to the direction D3, and they can serve as top horizontal connections that connect tops of two vertical portions of the helical inductor I10. Stated differently, the inductor I10 includes first, second and third TIVs 960a1, 960a2 and 960a3. The first, second and third TIVs 960a1, 960a2 and 960a3 penetrate through the molding material 980. The first conductive feature 924a1 located in the first RDL 920 connects bottoms of the first and second TIVs 960a1 and 960a2. The second conductive feature 1116a1 located in the second RDL 1110 connects tops of the second and third TIVs 960a2 and 960a3. By using this arrangement, the inductor I10 can be formed as a helical inductor.

As shown in FIGS. 85 and 86, because a portion of the inductor I10 and the semiconductor device 970 are together molded in the molding material 980, so this configuration may be beneficial to scale down the package structure incorporating with the inductor I10 therein. Moreover, the inductor I10 has a through hole H10, and portions of the first and second RDLs 920 and 1110 are located in the through hole H10. The magnetic films 942 and 1000 are located in the through hole H10 as well. The magnetic films 942 and 1000 are electrically insulated from the inductor I10. In other words, the inductor I10 wraps around the magnetic films 942 and 1000 and are not electrically connected to them, so that the magnetic films 942 and 1000 can serve as magnetic cores for the inductor I10 to increase the magnetic field and thus improve the inductance of the inductor I10.

In some embodiments, the formation of one layer of the wiring structure 1114 includes forming a blanket copper seed layer, forming and patterning a mask layer over the blanket copper seed layer, performing a plating to form the wiring structure 1114, removing the mask layer, and performing a flash etching to remove the portions of the blanket copper seed layer not covered by the wiring structure 1114. In alternative embodiments, the second RDL 1110 is formed by depositing metal layers, patterning the metal layers, and filling gaps between separated portions of the wiring structure 1114 with the dielectric structure 1112. The wiring structure 1114 may include a metal or a metal alloy including aluminum, copper, tungsten, and/or alloys thereof. The dielectric structure 1112 in these embodiments may include a polymer such as polyimide, benzocyclobutene (BCB), polybenzoxazole (PBO), or the like. Alternatively, the dielectric structure 1112 may include non-organic dielectric materials such as silicon oxide, silicon nitride, silicon carbide, silicon oxynitride, or the like. Amount of the layers of the dielectric structure 1112 and the wiring structure 1114 can depend on the routing design of the respective package.

Figure 87:
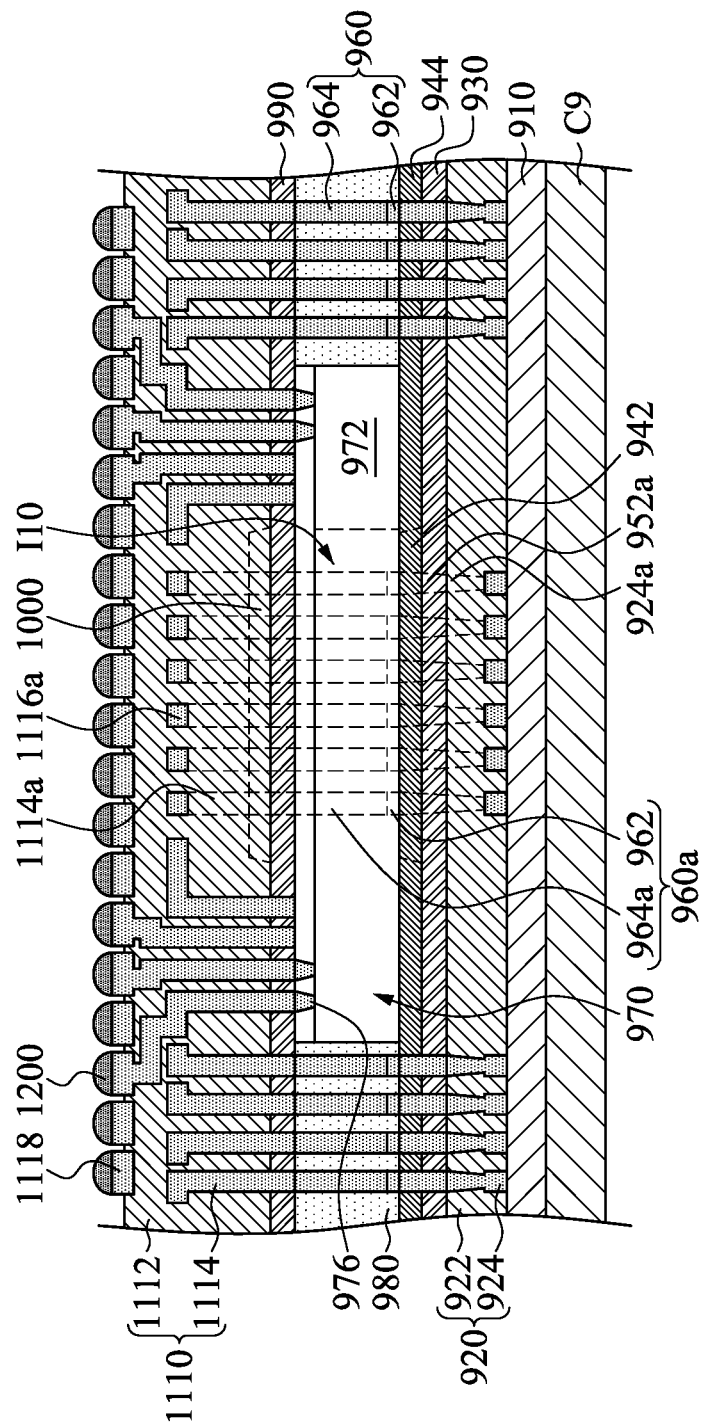

Reference is made to FIG. 87. External connectors 1200 are formed on contact pads 1118 of the second RDL 1110. The external connectors 1200 can include, for example, as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof. In some other embodiments, external connectors 1200 may be conductive balls such as solder balls. These solder balls may be arranged in a grid pattern of rows and columns. The external connectors 1200 may thus form a ball grid array (BGA). The contact pads 1118 of the second RDL 1110 under the respective external connectors 1200 can therefore be referred to as under-ball metallization (UBM) structures. By using the second RDL 1110, the pitch of conductive pillars 976 of the semiconductor device 970 can be fanned out to the pitch of the external connectors 1200. Afterwards, the package structure may be de-bonded from the carrier C9, and the adhesive layer (not shown) between the buffer layer 910 and the carrier C9 is also cleaned from the package structure, and then, the package structure may be sawed into a plurality of package structures. A top view of one resulting structure is shown in FIG. 88.

Figure 89:
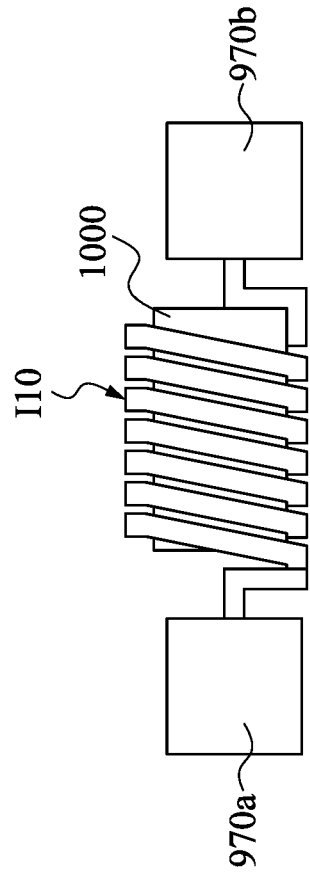
FIG. 89 is a top view of a package structure in accordance with some embodiments of the present disclosure.
Figure 88:
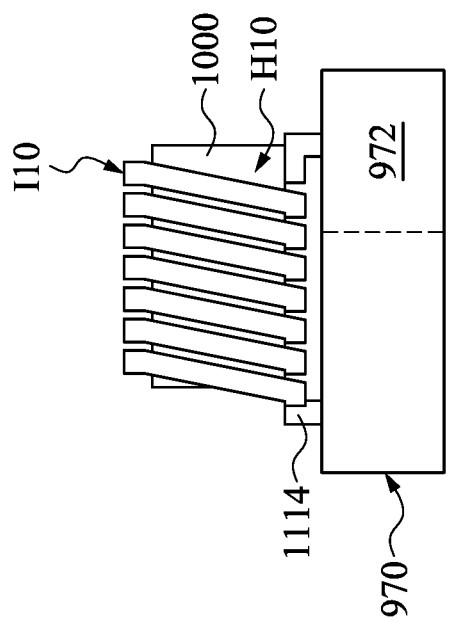

As shown in FIG. 87 and FIG. 88, the helical inductor I10 is electrically connected to the semiconductor device 970 by the wiring structure 1114 of the second RDL 1110. Moreover, the magnetic film 1000 is located in the through hole H10 of the helical inductor I10, so as to increase the magnetic field and thus improve the inductance of the helical inductor I10. In the embodiments as shown in FIG. 88, the VR die 972 and the CPU die are incorporated together in the semiconductor device 970. In some other embodiments, the CPU die and the VR die can be disposed in individual semiconductor devices. For example, as shown in FIG. 89, the helical inductor I10 may be located between and connected to semiconductor devices 970a and 970b, wherein the semiconductor devices 970a and 970b may respectively include, for example, a central computing unit (CPU) die and a voltage regulator (VR) die.

FIGS. 90-108 illustrate a method of forming a package structure in accordance with some embodiments of the present disclosure. A dielectric layer 1310 is formed on a carrier C10. Formation of the dielectric layer 1310 may exemplarily include deposition, such as physical vapor deposition (PVD) or chemical vapor deposition (CVD). In some embodiments, the dielectric layer 1310 is a low temperature silicon nitride layer. The carrier C10 may be a blank glass carrier, a blank ceramic carrier, or the like.

Reference is made to FIG. 91. A magnetic film 1320 is formed on a portion of the dielectric layer 1310. Exemplarily formation method of the magnetic film 1320 may include forming a blanket magnetic layer over the dielectric layer 1310, applying a photoresist over the magnetic layer, patterning the photoresist to expose some portions of the magnetic layer, and performing an etch process on the magnetic layer to remove the exposed portions of the magnetic layer, wherein an etching solution used in the etching process may include HF, $HNO_3$ and water, and the etch process may be operated at a temperature in a range from about 15° C. to about 40° C., as examples. In some embodiments, the magnetic film 1320 includes cobalt (Co), zirconium (Zr), tantalum (Ta), niobium (Nb), rhenium (Re), neodymium (Nd), praseodymium (Pr), nickel (Ni), or dysprosium (Dy). In some embodiments, the magnetic film 1320 includes an amorphous cobalt (Co) alloy including cobalt (Co) and zirconium (Zr). Zirconium (Zr) helps make cobalt (Co) amorphous. In some embodiments, the magnetic film 1320 includes a cobalt-zirconium (CoZr) alloy having one or more additional elements, such as tantalum (Ta) and niobium (Nb). For example, the magnetic film 1320 may be made of CoZrTa (CZT) alloy. In some other embodiments, the magnetic film 1320 includes a cobalt-zirconium (CoZr) alloy having one or more additional elements, such as a rare earth element, that help increase the ferromagnetic resonance of the cobalt-zirconium (CoZr) alloy. Rare earth elements include rhenium (Re), neodymium (Nd), praseodymium (Pr), or dysprosium (Dy). In some embodiments, the magnetic film 1320 may include other alloys such as permalloy ($Ni_8OFe_2O$), orthnol ($Ni_5OFe_5O$), amorphous CoFeCu, supermalloy (NiFeMo), polymer ferrite materials or other suitable magnetic materials. Although one magnetic film 1320 is shown in FIG. 91, there may be multiple magnetic films 1320 formed on the dielectric layer 1310 depending on a predetermined or desired inductance of a subsequently formed inductor.

Figure 92:
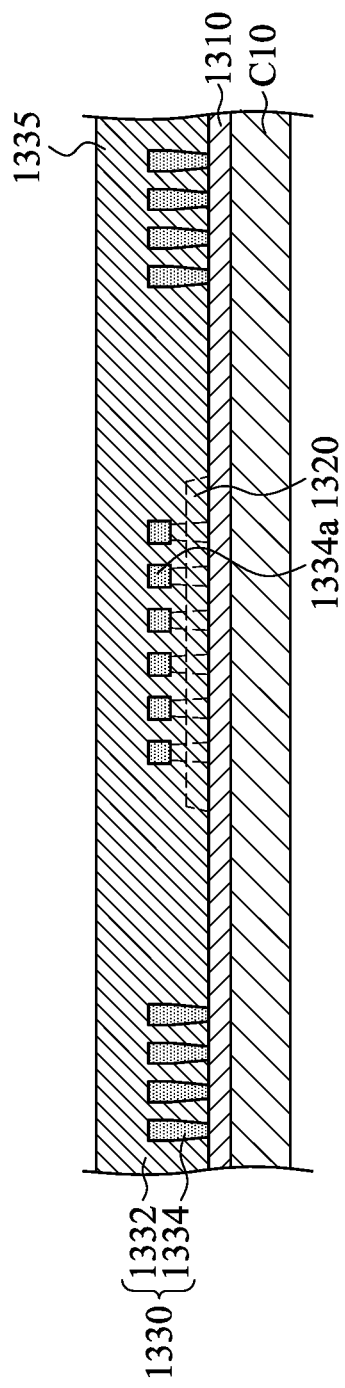
Figure 93:
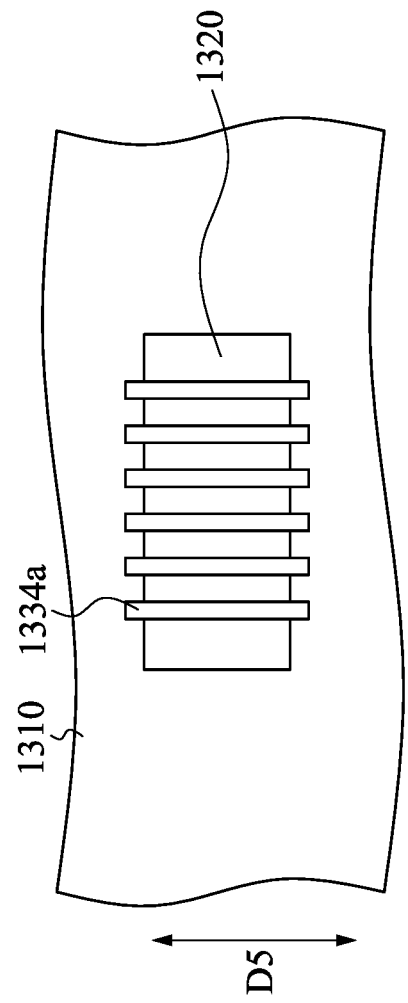

Next, as shown in FIG. 92, a first redistribution layer (RDL) 1330 is formed over the magnetic film 1320 and the dielectric layer 1310, and after the forming the first RDL 1330, the magnetic film 1320 is located in the first RDL 1330. The first RDL 1330 includes a dielectric structure 1332 and a wiring structure 1334 located in the dielectric structure 1332. The wiring structure 1334 includes a plurality of conductive features 1334a extending laterally over a surface of the magnetic film 1320. For example, as shown in FIG. 93, which is a fragmentary top view of the structure in FIG. 92, the conductive features 1334a, which may be formed as conductive lines, extend in a direction D5 and are arranged in a direction perpendicular to the direction D5. The conductive features 1334a may serve as portions of an inductor, especially a helical inductor, formed in subsequently steps.

In some embodiments, the formation of one layer of the wiring structure 1334 includes forming a blanket copper seed layer, forming and patterning a mask layer over the blanket copper seed layer, performing a plating to form the wiring structure 1334, removing the mask layer, and performing a flash etching to remove the portions of the blanket copper seed layer not covered by the wiring structure 1334. In alternative embodiments, the first RDL 1330 is formed by depositing metal layers, patterning the metal layers, and filling gaps between separated portions of the wiring structure 1334 with the dielectric structure 1332. The wiring structure 1334 may include a metal or a metal alloy including aluminum, copper, tungsten, and/or alloys thereof. The dielectric structure 1332 in these embodiments may include a polymer such as polyimide, benzocyclobutene (BCB), polybenzoxazole (PBO), or the like. Alternatively, the dielectric structure 1332 may include non-organic dielectric materials such as silicon oxide, silicon nitride, silicon carbide, silicon oxynitride, or the like. Amount of the layers of the dielectric structure 1332 and the wiring structure 1334 can depend on the routing design of the respective package. A portion of the dielectric structure 1332 may be a blanket capping layer capping the underlying wiring structure 1334, so as to serve as a buffer layer 1335 when the structure shown in FIG. 92 is flipped and attached to another carrier.

Figure 94:
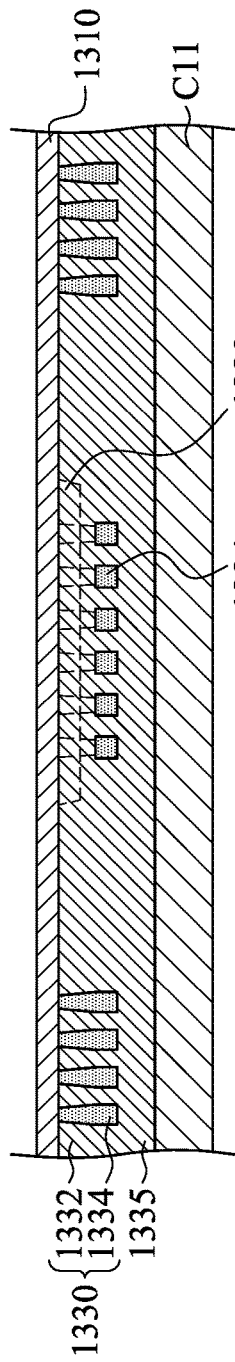

Reference is made to FIG. 94. The structure shown in FIG. 92 is flipped and attached to another carrier C11. The carrier C10 shown in FIG. 92 is removed. The carrier C11 may be a blank glass carrier, a blank ceramic carrier, or the like. In some embodiments, an adhesive layer (not shown) can be formed on the carrier C11, and the buffer layer 1335 is in contact with the adhesive layer. The adhesive layer may be made of an adhesive, such as ultra-violet (UV) glue, light-to-heat conversion (LTHC) glue, or the like, although other types of adhesives may be used. After the flipping, the magnetic film 1320 is located on the conductive features 1324a. That is, the conductive features 1324a serving as portion of the subsequently formed inductor underlie the magnetic film 1320, so that the magnetic film 1320 may be located in the subsequently formed inductor. Therefore, the magnetic film 1320 can serve as a magnetic core for the subsequently formed inductor to increase the magnetic field and thus improve the inductance of the subsequently formed inductor. After the flipping, a top surface of the dielectric layer 1310 is exposed, as shown in FIG. 94.

Figure 95:
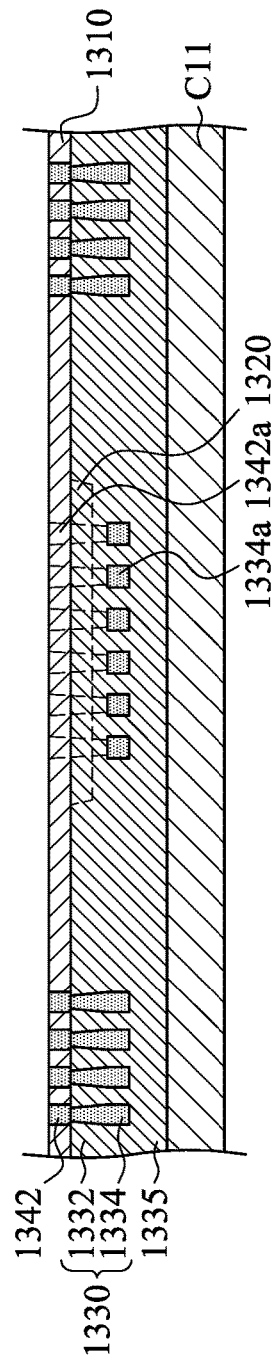
Figure 96:
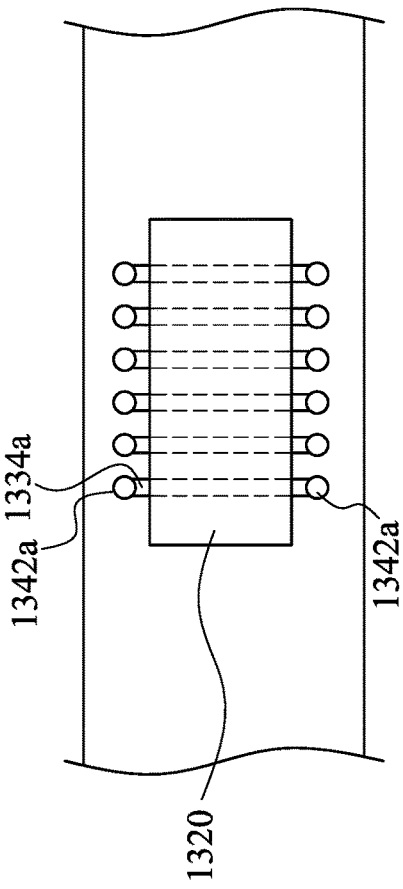

Next, as shown in FIG. 95, conductive features 1342 are formed through the dielectric layer 1310 to connect to the underlying wiring structure 1334 of the first RDL 1330. Some conductive features 1342a are respectively connected to opposite ends of the conductive features 1334a, as shown in FIG. 96, which is a fragmentary top view of FIG. 95. These conductive features 1342a may serve as portions of the subsequently formed inductor as well. Moreover, the conductive features 1342*a* are respectively located on opposite sides of the magnetic film 1320. Such a configuration may be beneficial to make the subsequently formed inductor surround the magnetic film 1320 and not electrically connect to it, so that the magnetic film 1320 can serve as a magnetic core for the inductor.

Figure 97:
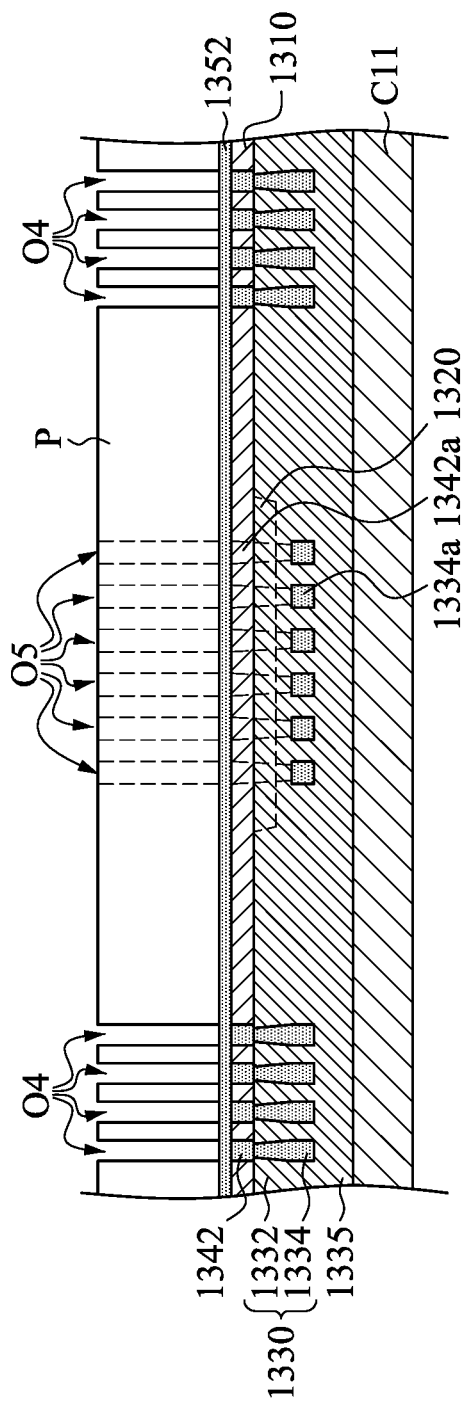

Next, as shown in FIG. 97, a seed layer 1352 is formed on the dielectric layer 1310 and the conductive features 1342 and 1342*a*, for example, through physical vapor deposition (PVD) or metal foil laminating. The seed layer 1352 may include copper, copper alloy, aluminum, titanium, titanium alloy, or combinations thereof. In some embodiments, the seed layer 1352 includes a titanium layer and a copper layer over the titanium layer. In alternative embodiments, the seed layer 1352 is a copper layer.

Figure 98:
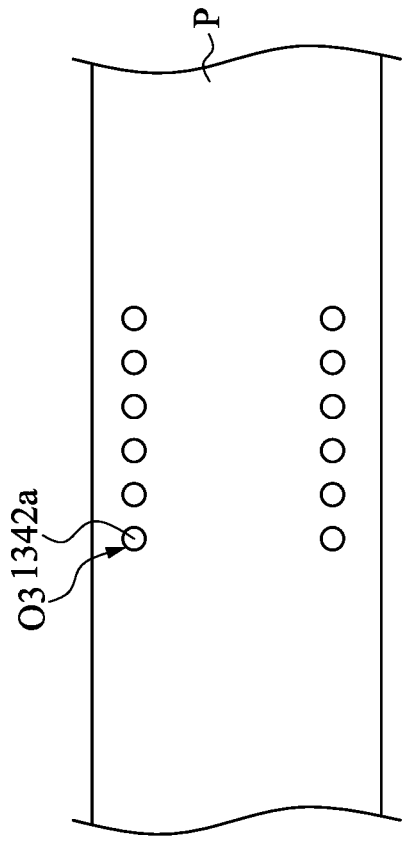

Thereafter, a photoresist P is applied over the seed layer 1352 and is then patterned. As a result, openings O4 and O5 are formed in the photoresist P, through which some portions of the seed layer 1352 are exposed. The pattern of the openings O5 is substantially the same as that of the conductive features 1342*a*, and some portions of the seed layer 1352 overlying the conductive features 1342*a* are thus respectively exposed by the openings O5, as shown in FIG. 98, which is a fragmentary top view of the structure in FIG. 97.

Figure 99:
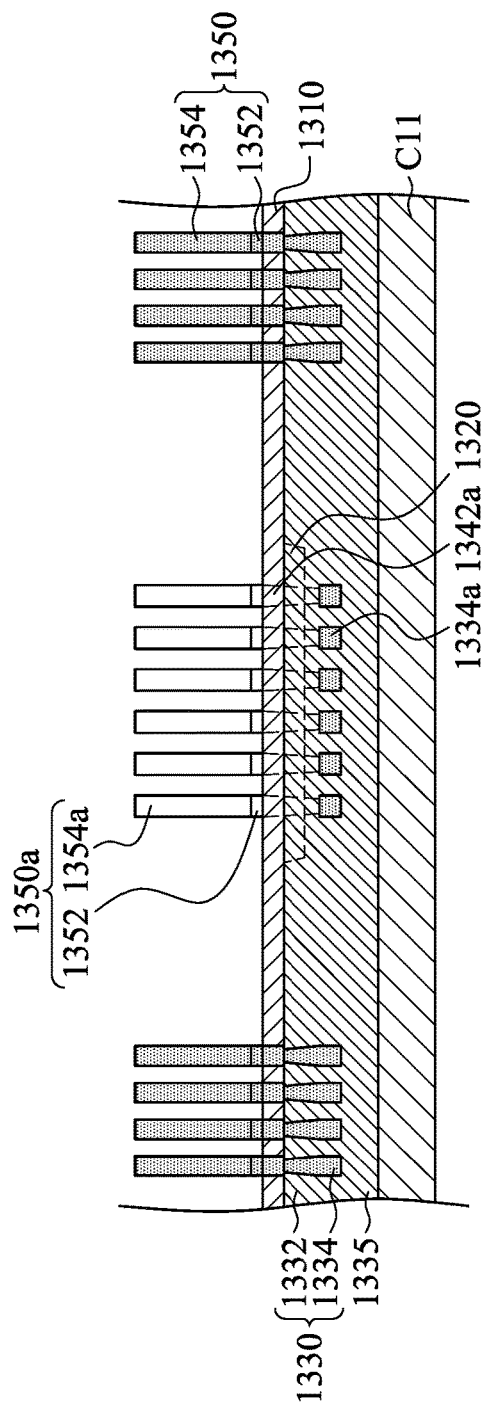

Reference is made to FIG. 99. Conductive features 1354 and 1354*a* are respectively formed in the openings O4 and O5 of the photoresist P through plating, which may be electro plating or electro-less plating. The conductive features 1354 and 1354*a* are plated on the exposed portions of the seed layer 1352. The conductive features 1354 and 1354*a* may include copper, aluminum, tungsten, nickel, solder, or alloys thereof. Heights of the conductive features 1354 and 1354*a* can be determined by the thickness of the subsequently placed semiconductor device 1360 (FIG. 100), with the heights of the conductive features 1354 and 1354*a* greater than the thickness of the semiconductor device 1360 in some embodiments of the present disclosure. After the plating of the conductive features 1354 and 1354*a*, the photoresist P is removed. After the photoresist P is removed, some portions of the seed layer 1352 are exposed. An etch step is performed to remove the exposed portions of the seed layer 1352, wherein the etch step may include an anisotropic etching. After the exposed portions of the seed layer 1352 are removed, some portions of the dielectric layer 1310 are exposed. Portions of the seed layer 1352 that are covered by the conductive features 1354 and 1354*a*, on the other hand, remain not etched. The conductive features 1354 and the remaining underlying portion of the seed layer 1352 are in combination referred to as through integrated fan-out (InFO) vias (TIV) 1350, which are also referred to as through-vias. The conductive features 1354*a* and the remaining underlying portion of the seed layer 1352 are in combination referred to as TIVs 1350*a*, and these TIVs 1350*a* can serve as portions of the subsequently formed inductor. More particularly, since the TIVs 1350*a* are respectively formed in the openings O5, the TIVs 1350*a* can be respectively connected to the conductive features 1342*a* that are connected to opposite ends of the conductive features 1334*a*, as shown in FIG. 96. Therefore, the TIVs 1350*a*, the conductive features 1342*a* penetrating through the dielectric layer 1310, and the conductive features 1334*a* of the first RDL 1330 can collectively serve as portions of the subsequently formed inductor.

Although the seed layer 1352 is shown as a layer separate from the conductive features 1354 and 1354*a*, when the seed layer 1352 is made of a material similar to or substantially the same as the respective overlying conductive features 1354 and 1354*a*, the seed layer 1352 may be merged with the conductive features 1354 and 1354*a* with no distinguishable interface therebetween. In alternative embodiments, there exist distinguishable interfaces between the seed layer 1352 and the overlying conductive features 1354 and 1354*a*.

Figure 100:
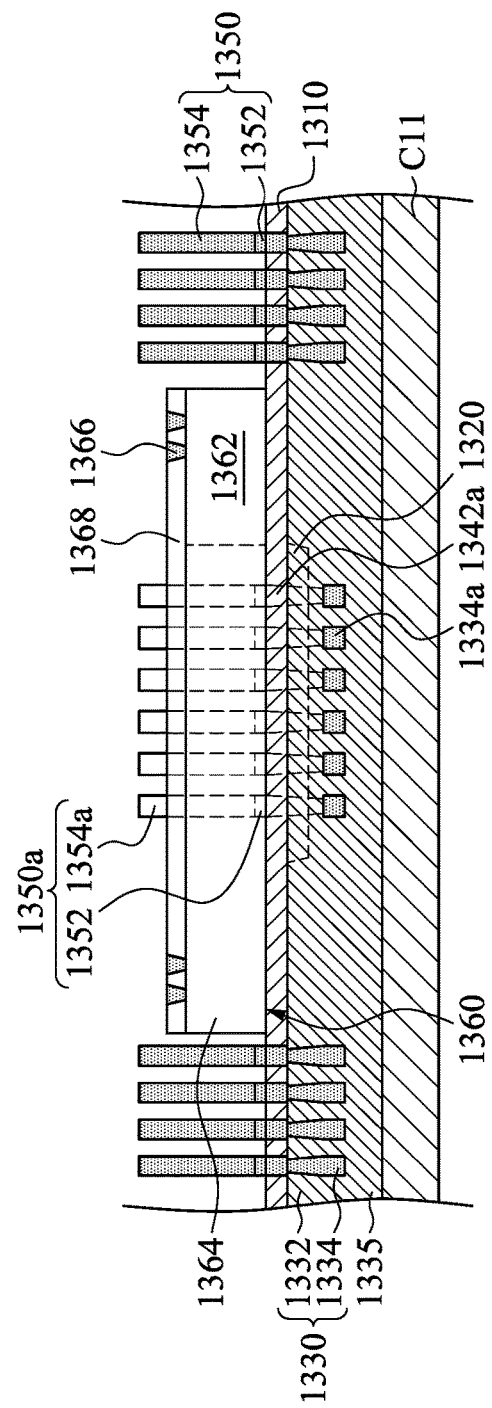
Figure 101:
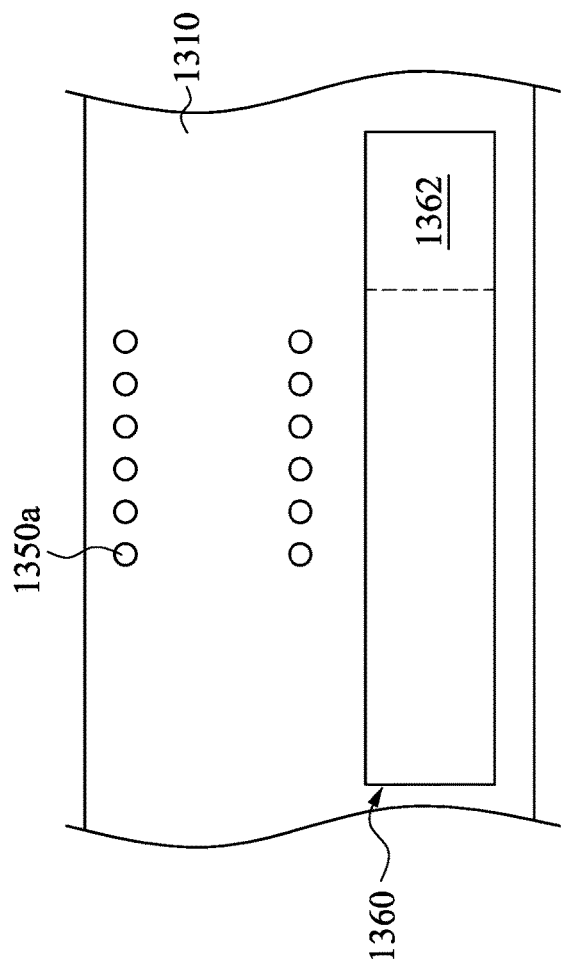

FIG. 100 illustrates placement of a semiconductor device 1360 over the dielectric layer 1310. The semiconductor device 1360 may be adhered to the dielectric layer 1310 through adhesive (not shown), and the TIVs 1350*a* are located on one side of the semiconductor device 1360, as shown in FIG. 101. In some embodiments, the semiconductor device 1360 includes an unpackaged semiconductor device, i.e. device die. For example, the semiconductor device 1360 may be a logic device die including logic transistors therein. In some exemplary embodiments, the semiconductor device 1360 may be a central computing unit (CPU) die with a voltage regulator (VR) die 1362. The semiconductor device 1360 includes a semiconductor substrate 1364 (a silicon substrate, for example) that is adhered to the dielectric layer 1310, wherein the back surface of the semiconductor substrate 1364 is in contact with the adhesive on the dielectric layer 1310.

In some exemplary embodiments, conductive pillars 1366 (such as copper posts) are formed as the top portions of the semiconductor device 1360, and are electrically coupled to the devices such as transistors (not shown) in the semiconductor device 1360. In some embodiments, a dielectric layer 1368 is formed on the top surface of the semiconductor device 1360, with the conductive pillars 1366 having at least lower portions in the dielectric layer 1368. The top surfaces of the conductive pillars 1366 may be substantially level with the top surface of the dielectric layer 1368 in some embodiments. Alternatively, the dielectric layer is not formed, and the conductive pillars 1366 protrude from a top dielectric layer (not shown) of the semiconductor device 1360.

Figure 102:
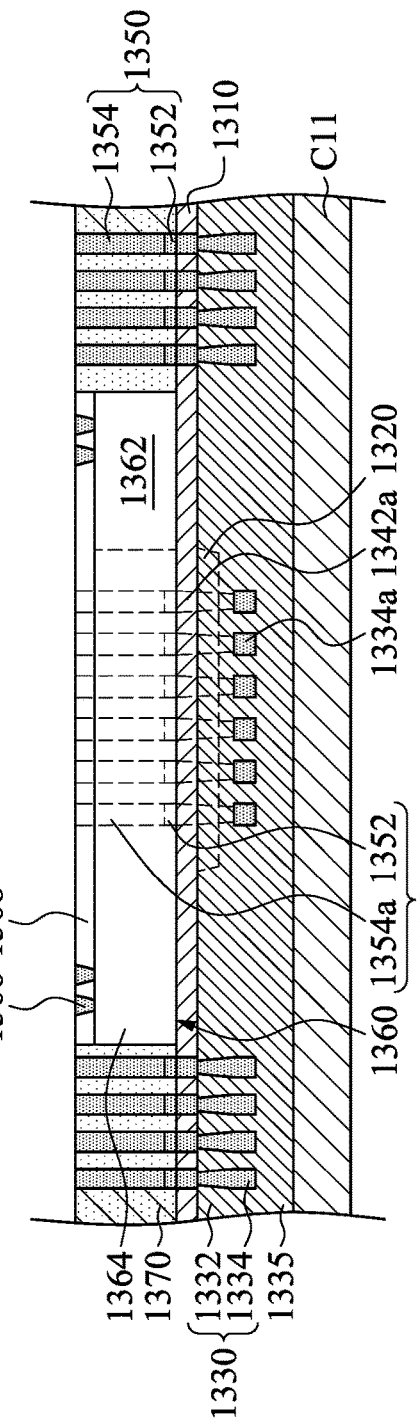

Reference is made to FIG. 102. A molding material 1370 is molded on the semiconductor device 1360 and the TIVs 1350 and 1350*a*. The molding material 1370 fills gaps between the semiconductor device 1360 and the TIVs 1350 and 1350*a*, and may be in contact with the dielectric layer 1310. Furthermore, the molding material 1370 is filled into gaps between the conductive pillars 1366 when the conductive pillars 1366 are protruding metal pillars (this arrangement is not shown). The top surface of the molding material 1370 is higher than the top ends of the conductive pillars 1366 and the TIVs 1350 and 1350*a*.

In some embodiments, the molding material 1370 includes a polymer-based material. The term "polymer" can represent thermosetting polymers, thermoplastic polymers, or any mixtures thereof. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Next, a grinding step is performed to thin the molding material 1370, until the conductive pillars 1366 and the TIVs 1350 and 1350*a* are exposed. The resulting structure is shown in FIG. 102, in which the molding material 1370 is in contact with sidewalls of the semiconductor device 1360 and the TIVs 1350 and 1350*a*. Due to the grinding, top ends of the TIVs 1350 and 1350*a* are substantially level (coplanar) with the top ends of the conductive pillars 1366, and are substantially level (coplanar) with the top surface of the molding material 1370. As a result of the grinding, conductive residues such as metal particles may be generated, and left on the top surface of the structure shown in FIG. 102. Accordingly, after the grinding, a cleaning may be performed, for example, through a wet etching, so that the conductive residues are removed.

Figure 103:
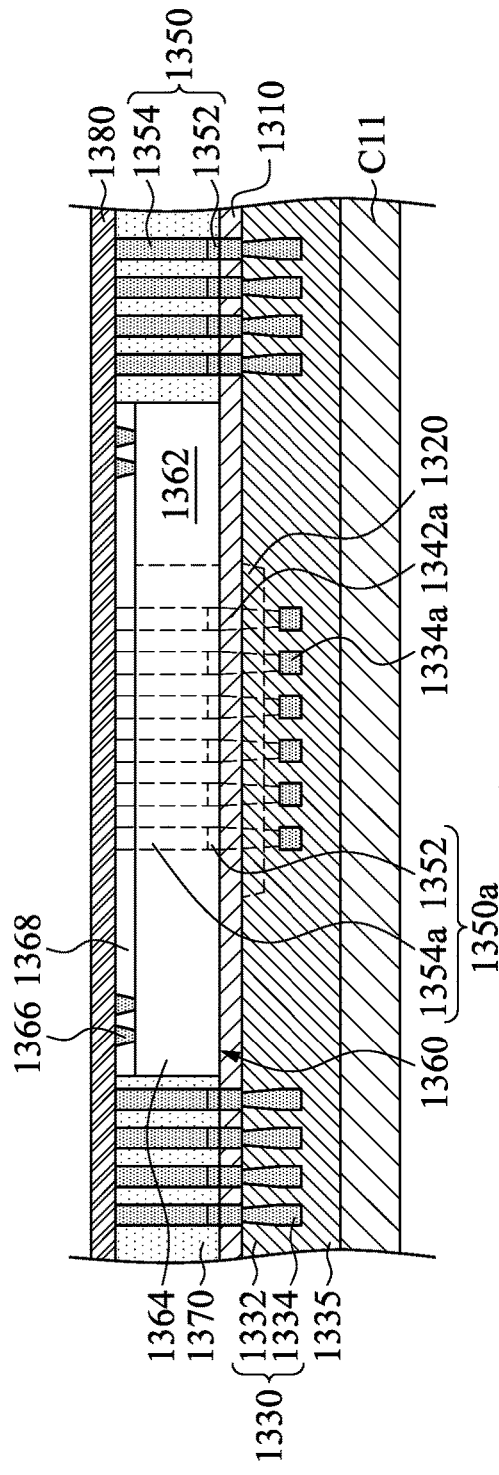

Reference is made to FIG. 103. A dielectric layer 1380 is formed on the structure shown in FIG. 102. That is, a blanket dielectric layer 1380 caps the TIVs 1350 and 1350a, the semiconductor device 1360 and the molding material 1370. Formation of the dielectric layer 1380 may exemplarily include deposition, such as physical vapor deposition (PVD) or chemical vapor deposition (CVD). In some embodiments, the dielectric layer 1380 is a low temperature silicon nitride layer.

Figure 104:
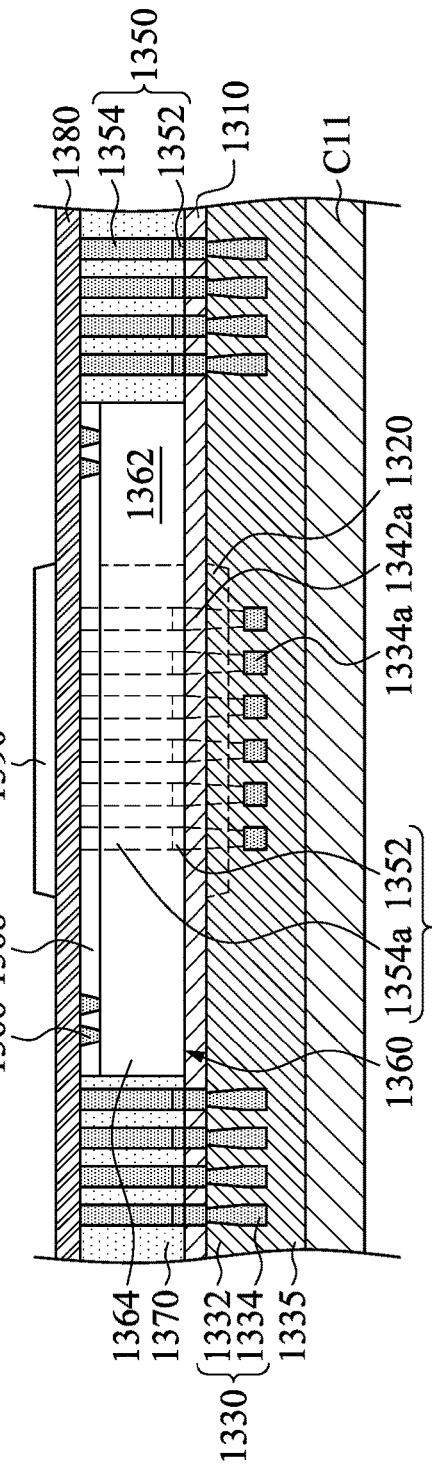

Next, as shown in FIG. 104, a magnetic film 1390 is formed on a portion of the dielectric layer 1380, and this portion of the dielectric layer 1380 overlies the conductive features 1334a of the first RDL 1330. That is, the conductive features 1334a serving as portions of the subsequently formed inductor underlie the magnetic film 1390, so that the magnetic film 1390 may be located in the subsequently formed inductor. Therefore, the magnetic film 1390 can serve as a magnetic core for the subsequently formed inductor to increase the magnetic field and thus improve the inductance of the subsequently formed inductor. Exemplarily formation method of the magnetic film 1390 may include forming a blanket magnetic layer over the dielectric layer 1380, applying a photoresist over the magnetic layer, patterning the photoresist to expose some portions of the magnetic layer, and performing an etch process on the magnetic layer to remove the exposed portions of the magnetic layer, wherein an etching solution used in the etching process may include HF, $HNO_3$ and water, and the etch process may be operated at a temperature in a range from about 15° C. to about 40° C., as examples. In some embodiments, the magnetic film 1390 includes cobalt (Co), zirconium (Zr), tantalum (Ta), niobium (Nb), rhenium (Re), neodymium (Nd), praseodymium (Pr), nickel (Ni), or dysprosium (Dy). In some embodiments, the magnetic film 1390 includes an amorphous cobalt (Co) alloy including cobalt (Co) and zirconium (Zr). Zirconium (Zr) helps make cobalt (Co) amorphous. In some embodiments, the magnetic film 1390 includes a cobalt-zirconium (CoZr) alloy having one or more additional elements, such as tantalum (Ta) and niobium (Nb). For example, the magnetic film 1390 may be made of CoZrTa (CZT) alloy. In some other embodiments, the magnetic film 1390 includes a cobalt-zirconium (CoZr) alloy having one or more additional elements, such as a rare earth element, that help increase the ferromagnetic resonance of the cobalt-zirconium (CoZr) alloy. Rare earth elements include rhenium (Re), neodymium (Nd), praseodymium (Pr), or dysprosium (Dy). In some embodiments, the magnetic film 1390 may include other alloys such as permalloy ($Ni_8OFe_2O$), orthnol ($Ni_5OFe_5O$), amorphous CoFeCu, supermalloy (NiFeMo), polymer ferrite materials or other suitable magnetic materials. Although one magnetic film 1390 is shown in FIG. 104, there may be multiple magnetic films 1390 formed on the dielectric layer 1380 depending on a predetermined or desired inductance.

Figure 105:
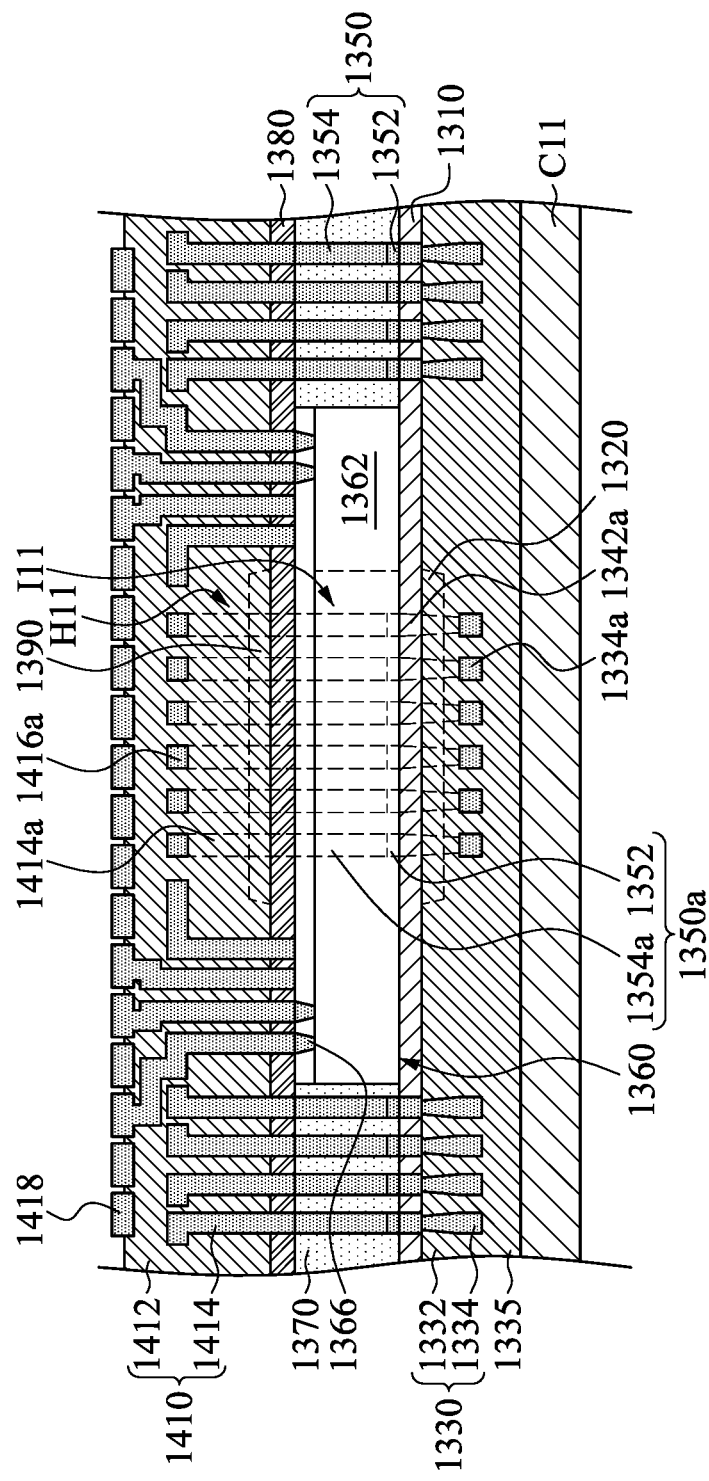

Reference is made to FIG. 105. A second redistribution layer (RDL) 1410 is formed over the magnetic film 1390 and the dielectric layer 1380, and after the forming the second RDL 1410, the magnetic film 1390 is located in the second RDL 1410. The molding material 1370 is located between the first and second RDLs 1330 and 1410. The second RDL 1410 includes a dielectric structure 1412 and a wiring structure 1414 located in the dielectric structure 1412. The wiring structure 1414 is connected to the conductive pillars 1366 of the semiconductor device 1360 and the TIVs 1350 and 1350a. The wiring structure 1414 may also interconnect the conductive pillars 1366 and the TIVs 1350 and 1350a. In the embodiments where the dielectric layer 1380 is a blanket capping layer, the blanket dielectric capping layer 1380 is patterned to expose some conductive pillars 1366 and some portions of the TIVs 1350 and 1350a, and then, the second RDL 1410 is formed, wherein some portions of the wiring structure 1414 penetrate through the dielectric layer 1380 to connect to the exposed conductive pillars 1366 and the exposed portions of the TIVs 1350 and 1350a. The blanket dielectric capping layer 1380 is patterned using a photolithography and etch process, as examples.

Figure 106:
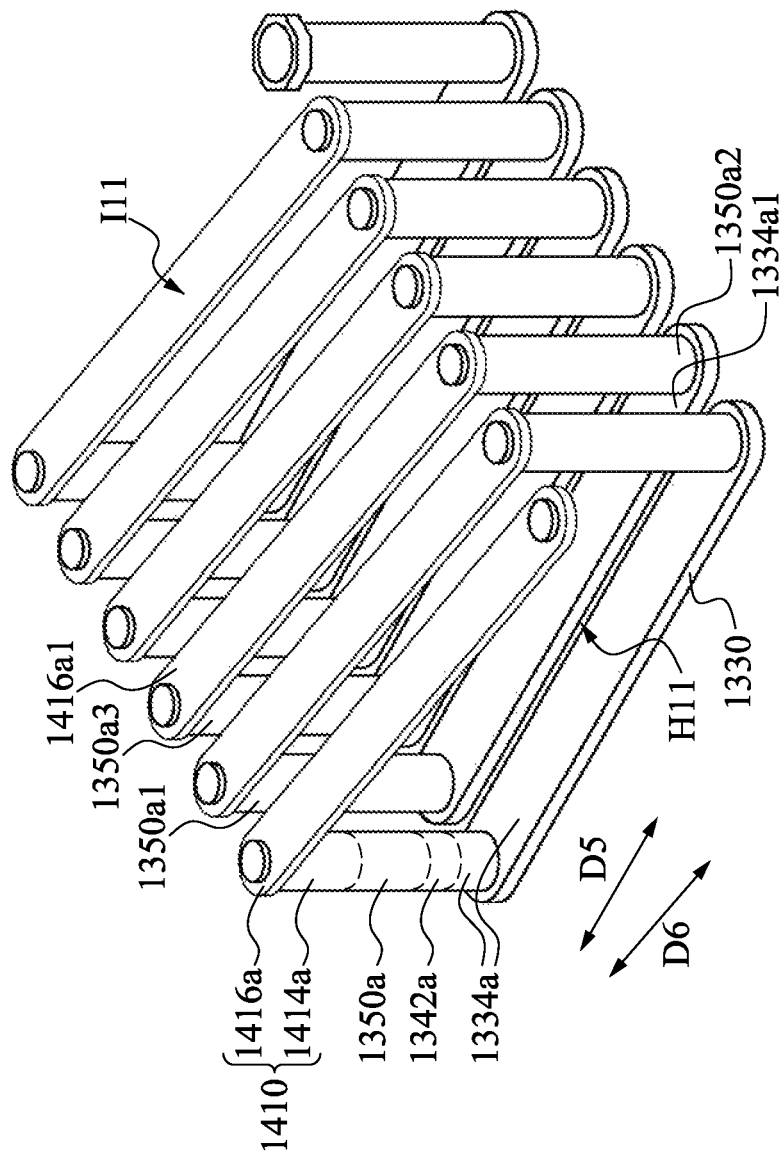

The wiring structure 1414 includes a plurality of conductive features 1414a and a plurality of conductive features 1416a. The conductive features 1414a extend vertically through the dielectric structure 1412 and the dielectric layer 1380 to respectively connect to the underlying TIVs 1350a, and the conductive features 1414a and the magnetic film 1390 are spaced apart by the dielectric structure 1412. The conductive features 1416a extend laterally over a surface of the second RDL 1410 and are connected to the conductive features 1414a. The combined structure of the conductive features 1416a and 1414a of the second RDL 1410, the TIVs 1350a, the conductive features 1342a penetrating through the dielectric layer 1310, and the conductive features 1334a of the first RDL 1330 can be referred to as an inductor I11, especially a helical inductor I11, as shown in FIG. 106. Portions of the conductive features 1334a of the first RDL 1330, the overlying conductive features 1342a, the overlying TIVs 1350a, and the overlying conductive features 1414a of the second RDL 1410 can serve as vertical portions of the helical inductor I11. Portions of the conductive features 1334a extending in the direction D5 can serve as bottom horizontal connections that connect bottoms of two vertical portions of the helical inductor I11. The conductive features 1416a of the second RDL 1410 extend in a direction D6 that is not parallel to the direction D5, and they can serve as top horizontal connections that connect tops of two vertical portions of the helical inductor I11. Stated differently, the inductor I11 includes first, second and third TIVs 1350a1, 1350a2 and 1350a3. The first, second and third TIVs 1350a1, 1350a2 and 1350a3 penetrate through the molding material 1370. The first conductive feature 1334a1 located in the first RDL 1330 connects bottoms of the first and second TIVs 1350a1 and 1350a2. The second conductive feature 1416a1 located in the second RDL 1410 connects tops of the second and third TIVs 1350a2 and 1350a3. By using such configuration, the inductor I11 can be formed as a helical inductor.

As shown in FIGS. 105 and 106, because a portion of the inductor I11 and the semiconductor device 1360 are together molded in the molding material 1370, so this configuration may be beneficial to scale down the package structure incorporating with the inductor I11 therein. Moreover, the inductor I11 has a through hole H11, and portions of the first and second RDL 1330 and 1410 are located in the through hole H11. The magnetic films 1320 and 1390 are located in the through hole H11 as well, and they are electrically insulated from the inductor I11. In other words, the inductor I11 wraps around the magnetic films 1320 and 1390 and is not electrically connected to them, so that the magnetic films 1320 and 1390 can serve as a magnetic core for the inductor I11 to increase the magnetic field and thus improve the inductance of the inductor I11.

In some embodiments, the formation of one layer of the wiring structure 1414 includes forming a blanket copper seed layer, forming and patterning a mask layer over the blanket copper seed layer, performing a plating to form the wiring structure 1414, removing the mask layer, and performing a flash etching to remove the portions of the blanket copper seed layer not covered by the wiring structure 1414. In alternative embodiments, the second RDL 1410 is formed by depositing metal layers, patterning the metal layers, and filling gaps between separated portions of the wiring structure 1414 with the dielectric structure 1412. The wiring structure 1414 may include a metal or a metal alloy including aluminum, copper, tungsten, and/or alloys thereof. The dielectric structure 1412 in these embodiments may include a polymer such as polyimide, benzocyclobutene (BCB), polybenzoxazole (PBO), or the like. Alternatively, the dielectric structure 1412 may include non-organic dielectric materials such as silicon oxide, silicon nitride, silicon carbide, silicon oxynitride, or the like. Amount of the layers of the dielectric structure 1412 and the wiring structure 1414 can depend on the routing design of the respective package.

Figure 107:
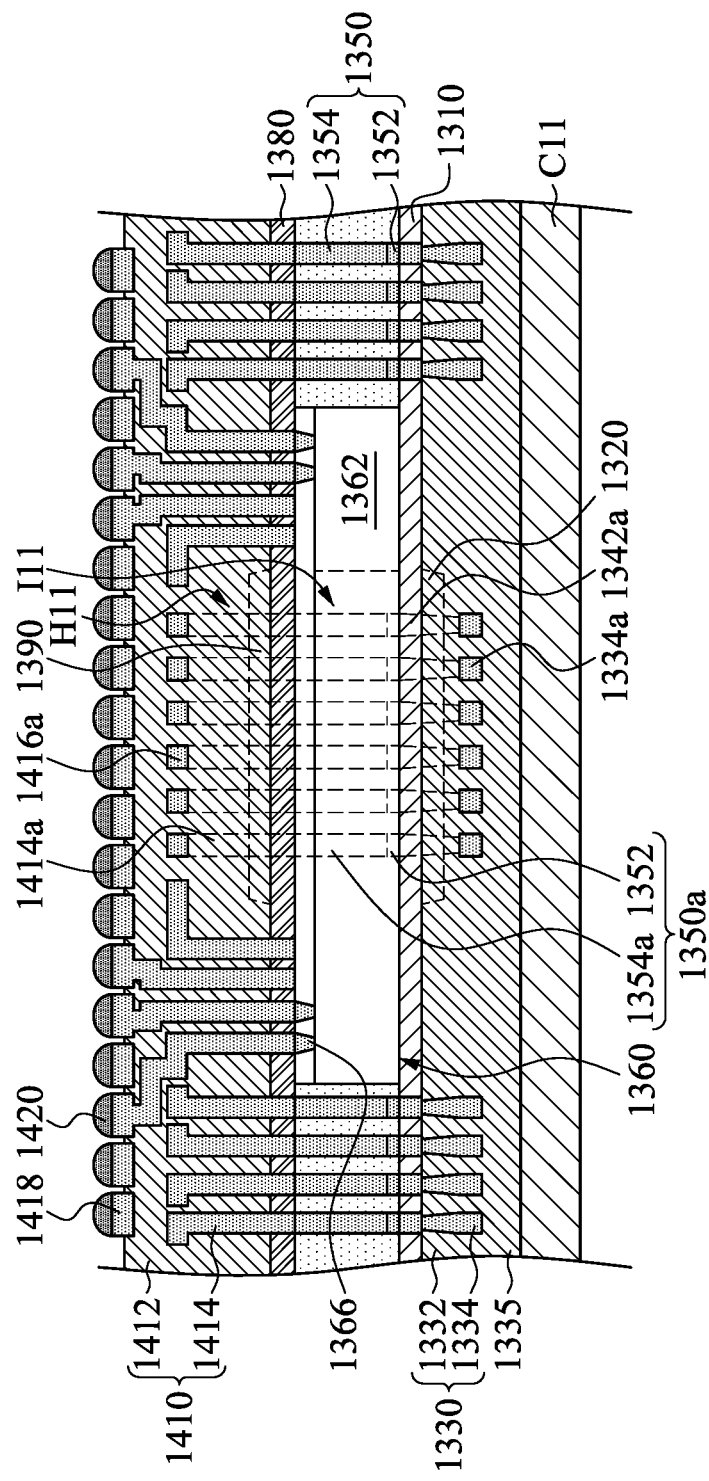

Reference is made to FIG. 107. External connectors 1420 are formed on contact pads 1418 of the second RDL 1410. The external connectors 1420 can include, for example, as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof. In some other embodiments, external connectors 1420 may be conductive balls such as solder balls. These solder balls may be arranged in a grid pattern of rows and columns. The external connectors 1420 may thus form a ball grid array (BGA). The contact pads 1418 of the second RDL 1410 under the respective external connectors 1420 can therefore be referred to as under-ball metallization (UBM) structures. By using the second RDL 1410, the pitch of conductive pillars 1366 of the semiconductor device 1360 can be fanned out to the pitch of the external connectors 1420. Afterwards, the package structure may be de-bonded from the carrier C11, and the adhesive layer (not shown) between the buffer layer 1335 and the carrier C11 is also cleaned from the package structure, and then, the package structure may be sawed into a plurality of package structures. A top view of one resulting structure is shown in FIG. 108.

Figure 108:
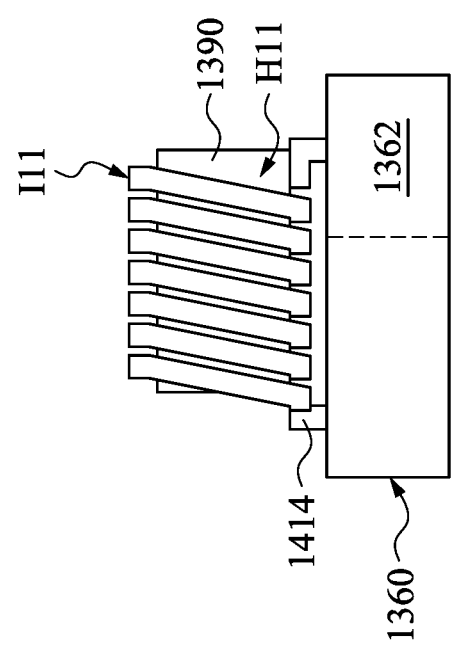

As shown in FIG. 108, the helical inductor I11 is electrically connected to the semiconductor device 1360 by the wiring structure 1414 of the second RDL 1410. Moreover, the magnetic film 1390 is located in the through hole H11 of the helical inductor I11, so as to increase the magnetic field and thus improve the inductance of the helical inductor I11. In embodiments as shown in FIG. 108, the VR die 1362 and the CPU die are incorporated together in the semiconductor device 1360. In some other embodiments, the CPU die and the VR die can be disposed in individual semiconductor devices.

Figure 109:
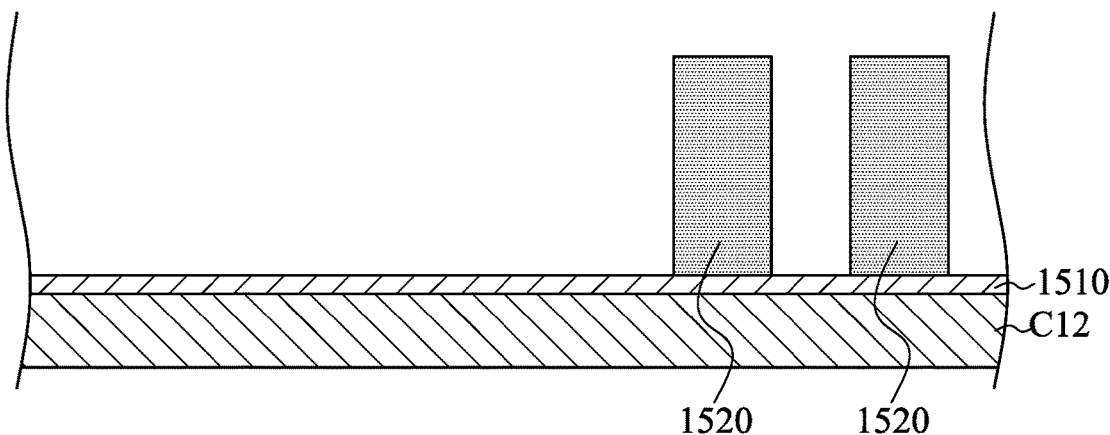

FIGS. 109-121 illustrate a method of forming a package structure in accordance with some embodiments of the present disclosure. Referring to FIG. 109, a buffer layer 1510 is formed on a carrier C12. The buffer layer 1510 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. The buffer layer 1510 is a substantially planar layer having a substantially uniform thickness, in which the thickness may be greater than about 2 µm, and may be in a range from about 2 µm to about 40 µm. In some embodiments, top and bottom surfaces of the buffer layer 1510 are also substantially planar. The carrier C12 may be a blank glass carrier, a blank ceramic carrier, or the like. In some embodiments, an adhesive layer (not shown) can be formed on the carrier C3, and the buffer layer 1510 is formed on the adhesive layer. The adhesive layer may be made of an adhesive, such as ultra-violet (UV) glue, light-to-heat conversion (LTHC) glue, or the like, although other types of adhesives may be used.

Figure 110:
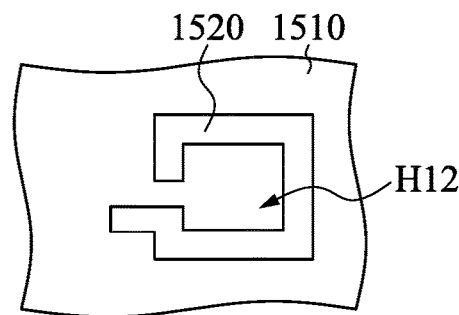

Thereafter, a first TIV 1520 is formed on the buffer layer 1510 and formed in a spiral pattern having a through hole H12 in a top view, as shown in FIG. 110. Formation of the first TIV 1520 may exemplarily include forming a blanket seed layer on the buffer layer 1510, applying a photoresist over the seed layer and patterning the photoresist to form an opening with a spiral pattern, forming a conductive feature in the opening through plating, removing the photoresist to expose portions of the seed layer, and removing the exposed portions of the seed layer using an anisotropic etching. The remaining portion of the seed layer and the overlying conductive feature can be collectively referred to as the first TIV 1520. The resulting structure is shown in FIGS. 109 and 110.

Figure 111:
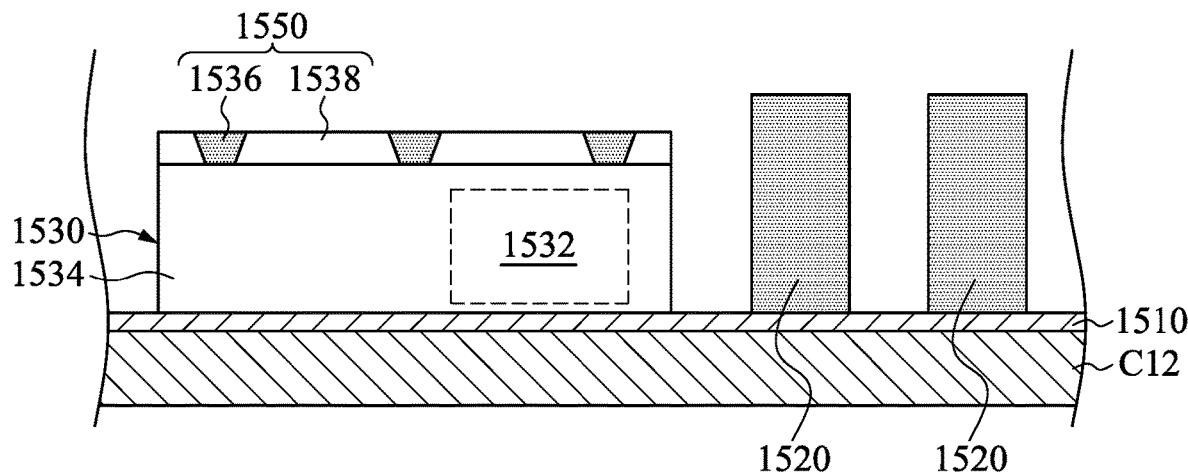

FIG. 111 illustrates placement of a first semiconductor device 1530 over the buffer layer 1510. The first semiconductor device 1530 may be adhered to the buffer layer 1510 through adhesive (not shown). In some embodiments, the first semiconductor device 1530 includes an unpackaged semiconductor device, i.e. device die. For example, the first semiconductor device 1530 may be a logic device die including logic transistors therein. In some exemplary embodiments, the first semiconductor device 1530 may be a central computing unit (CPU) die with a voltage regulator (VR) die 1532. In some other embodiments, the CPU die and the VR die may be disposed in individual semiconductor devices. The first semiconductor device 1530 includes a semiconductor substrate 1534 (a silicon substrate, for example) that is adhered to the buffer layer 1510, wherein the back surface of the semiconductor substrate 1534 is in contact with the adhesive on the buffer layer 1510.

In some exemplary embodiments, conductive pillars 1536 (such as copper posts) are formed as the top portions of the first semiconductor device 1530, and are electrically coupled to the devices such as transistors (not shown) in the first semiconductor device 1530. In some embodiments, a dielectric layer 1538 is formed on the top surface of the first semiconductor device 1530, with the conductive pillars 1536 having at least lower portions in the dielectric layer 1538. The top surfaces of the conductive pillars 1536 may be substantially level with the top surface of the dielectric layer 1538 in some embodiments. Alternatively, the dielectric layer is not formed, and the conductive pillars 1536 protrude from a top dielectric layer (not shown) of the first semiconductor device 1530.

Figure 112:
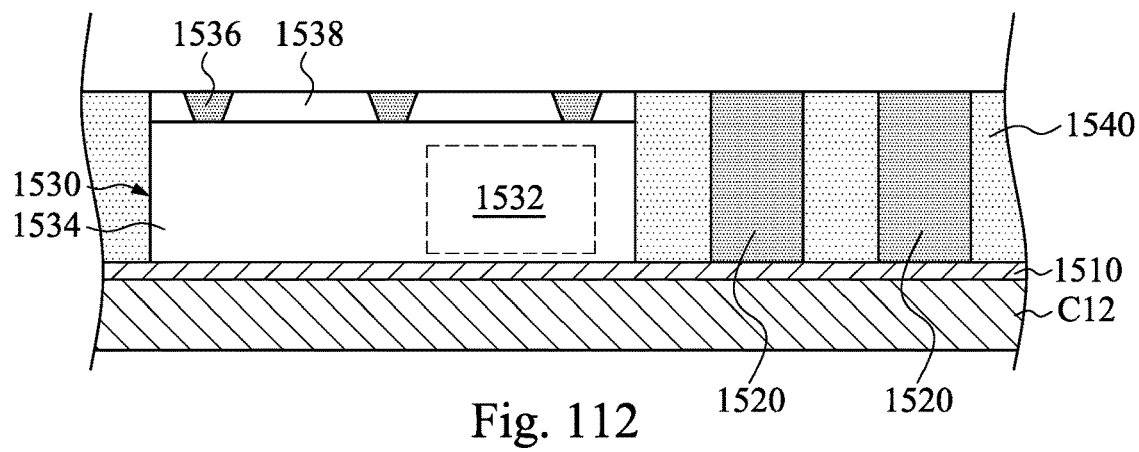

Reference is made to FIG. 112. A first molding material 1540 is molded on the first semiconductor device 1530 and the first TIV 1520. Thereafter, a grinding step is performed to thin the first molding material 1540, until the conductive pillars 1536 and the first TIV 1520 are exposed, and the resulting structure is shown in FIG. 112. The first molding material 1540 fills gaps between the first semiconductor device 1530 and the first TIV 1520, and may be in contact with the buffer layer 1510. Furthermore, the first molding material 1540 is filled into gaps between the conductive pillars 1536 when the conductive pillars 1536 are protruding metal pillars (this arrangement is not shown). In some embodiments, the first molding material 1540 includes a polymer-based material. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Due to the grinding, the first TIV 1520 penetrates through the molding material 1540. Further, due to the grinding, the top end of the first TIV 1520 is substantially level (coplanar) with the top ends of the conductive pillars 1536, and is substantially level (coplanar) with the top surface of the first molding material 1540. In other words, a top of the first TIV 1520 is substantially level with that of the first molding material 1540. As a result of the grinding, conductive residues such as metal particles may be generated, and left on the top surface of the structure shown in FIG. 112. Accordingly, after the grinding, a cleaning may be performed, for example, through a wet etching, so that the conductive residues are removed.

Figure 113:
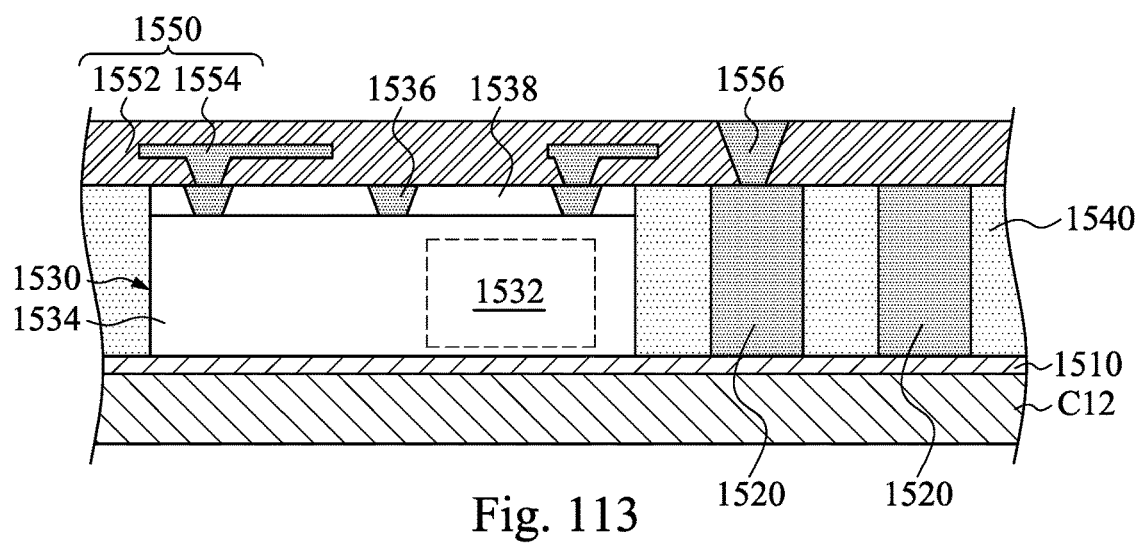

Next, referring to FIG. 113, a first redistribution layer (RDL) 1550 is formed over the first molding material 1540. The first RDL 1550 includes a dielectric structure 1552 and a wiring structure 1554 located in the dielectric structure 1552. The wiring structure 1554 is connected to the conductive pillars 1536 and the first TIV 1520. The wiring structure 1554 may also interconnect the conductive pillars 1536 and the first TIV 1520. The first RDL 1550 further includes a through-via 1556. The through-via 1556 penetrates through the dielectric structure 1552 and is present on the first TIV 1520, so that the through-via 1556 can be electrically connected to the first TIV 1520.

In some embodiments, the formation of one layer of the wiring structure 1554 includes forming a blanket copper seed layer, forming and patterning a mask layer over the blanket copper seed layer, performing a plating to form the wiring structure 1554, removing the mask layer, and performing a flash etching to remove the portions of the blanket copper seed layer not covered by the wiring structure 1554. In alternative embodiments, the first RDL 1550 is formed by depositing metal layers, patterning the metal layers, and filling gaps between separated portions of the wiring structure 1554 with the dielectric structure 1552. The wiring structure 1554 may include a metal or a metal alloy including aluminum, copper, tungsten, and/or alloys thereof. The dielectric structure 1552 in the embodiments may include a polymer such as polyimide, benzocyclobutene (BCB), polybenzoxazole (PBO), or the like. Alternatively, the dielectric structure 1552 may include non-organic dielectric materials such as silicon oxide, silicon nitride, silicon carbide, silicon oxynitride, or the like. Amount of the layers of the dielectric structure 1552 and the wiring structure 1554 can depend on the routing design of the respective package. The through-via 1556 may be formed by layers of the wiring structure 1554.

Figure 114:
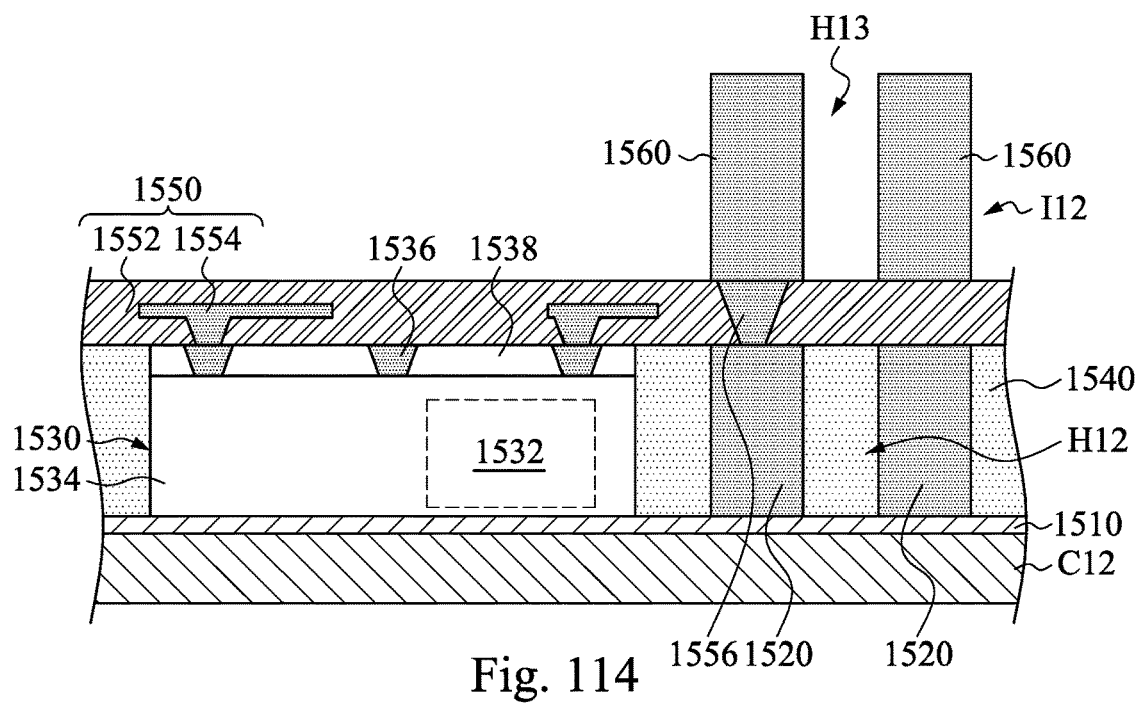

Reference is made to FIG. 114. A second TIV 1560 is formed on the first RDL 1550 and formed in a spiral pattern having a through hole H13 in a top view, as shown in FIG. 115. Formation of the second TIV 1560 may exemplarily include forming a blanket seed layer on the first RDL 1550, applying a photoresist over the seed layer and patterning the photoresist to form an opening with a spiral pattern, forming a conductive feature in the opening through plating, removing the photoresist to expose portions of the seed layer, and removing the exposed portions of the seed layer using an anisotropic etching. The remaining portion of the seed layer and the overlying conductive feature can be collectively referred to as the second TIV 1560. The resulting structure is shown in FIGS. 114 and 115.

The second TIV 1560 and the underlying first TIV 1520 are electrically connected by the through-via 1556 of the first RDL 1550. The first, second TIVs 1520, 1560 and the through-via 1556 can be collectively referred to as an inductor I12, especially a spiral inductor I12. The through hole H13 of the second TIV 1560 may be located above the through H12 of the first TIV 1520, so that the through holes H12 and H13 can collectively serve as a though hole of the inductor I12. Stated differently, the through holes H12 and H13 are vertically overlapped to form the through hole of the inductor I12. In this configuration, the inductor I12 penetrates through the first molding material 1540 and the first RDL 1550.

FIG. 116 illustrates placement of a second semiconductor device 1570 over the first RDL 1550. The second semiconductor device 1570 may be adhered to the first RDL 1550 through adhesive (not shown). In some embodiments, the second semiconductor device 1570 is an unpackaged semiconductor device, i.e. device die, such as a logic device die or a memory device die. For example, the second semiconductor device 1570 may be a logic device die including logic transistors therein. The second semiconductor device 1570 includes a semiconductor substrate 1574 (a silicon substrate, for example) that is adhered to the first RDL 1550.

In some exemplary embodiments, conductive pillars 1576 (such as copper posts) are formed as the top portions of the second semiconductor device 1570, and are electrically coupled to the devices such as transistors (not shown) in the second semiconductor device 1570. In some embodiments, a dielectric layer 1578 is formed on the top surface of the second semiconductor device 1570, with the conductive pillars 1576 having at least lower portions in the dielectric layer 1578. The top surfaces of the conductive pillars 1576 may be substantially level with the top surface of the dielectric layer 1578 in some embodiments. Alternatively, the dielectric layer is not formed, and the conductive pillars 1576 protrude from a top dielectric layer (not shown) of the second semiconductor device 1570.

Figure 117:
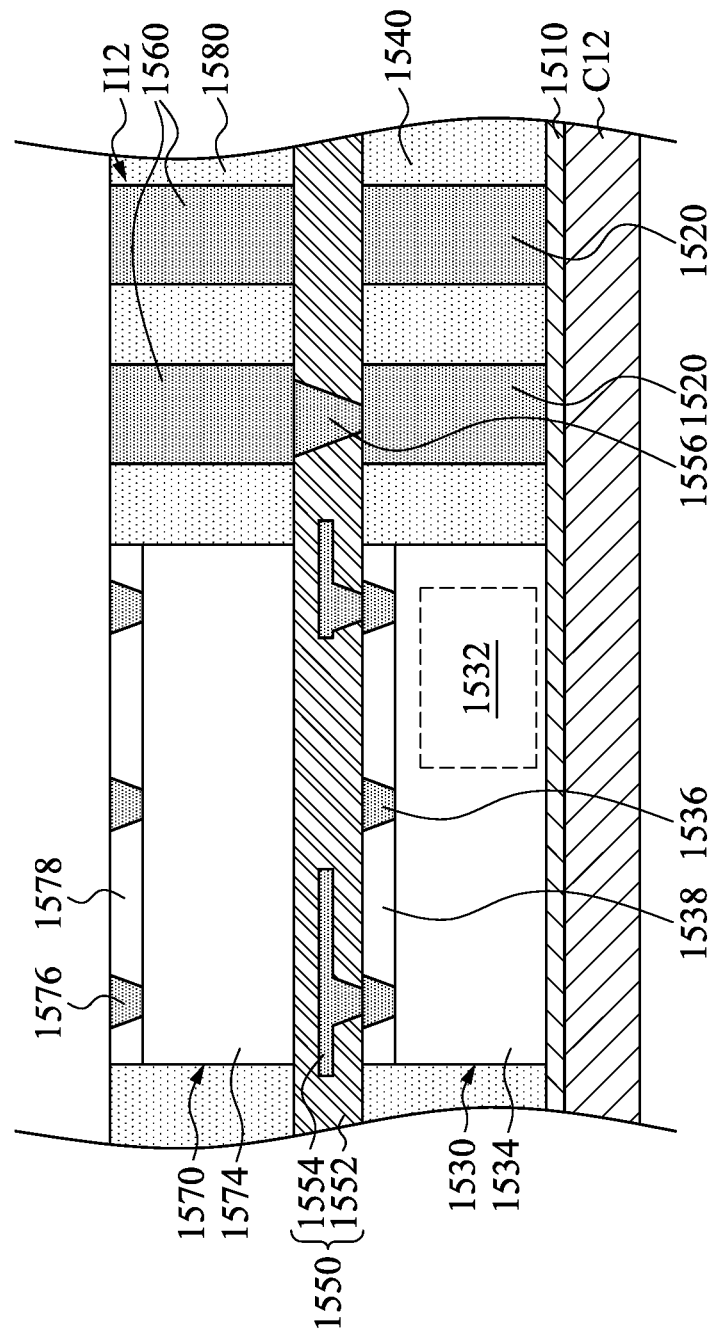

Reference is made to FIG. 117. A second molding material 1580 is molded on the second semiconductor device 1570 and the second TIV 1560. Thereafter, a grinding step is performed to thin the molding material 1580, until the conductive pillars 1576 and the second TIV 1560 are exposed, and the resulting structure is shown in FIG. 117. The second molding material 1580 fills gaps between the second semiconductor device 1570 and the second TIV 1560, and may be in contact with the first RDL 1550. Furthermore, the second molding material 1580 is filled into gaps between the conductive pillars 1576 when the conductive pillars 1576 are protruding metal pillars (this arrangement is not shown). In some embodiments, the molding material 1580 includes a polymer-based material. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Due to the grinding, the inductor I12 penetrates through the second molding material 1580. In this configuration, the inductor I12 penetrates through the first and second molding materials 1540 and 1580 and the first RDL 1550. Further, due to the grinding, the top end of the second TIV 1560 is substantially level (coplanar) with the top ends of the conductive pillars 1576, and is substantially level (coplanar)

with the top surface of the second molding material 1580. In other words, a top of the inductor I12 is substantially level with that of the second molding material 1580. As a result of the grinding, conductive residues such as metal particles may be generated, and left on the top surface of the structure shown in FIG. 117. Accordingly, after the grinding, a cleaning may be performed, for example, through a wet etching, so that the conductive residues are removed.

Figure 118:
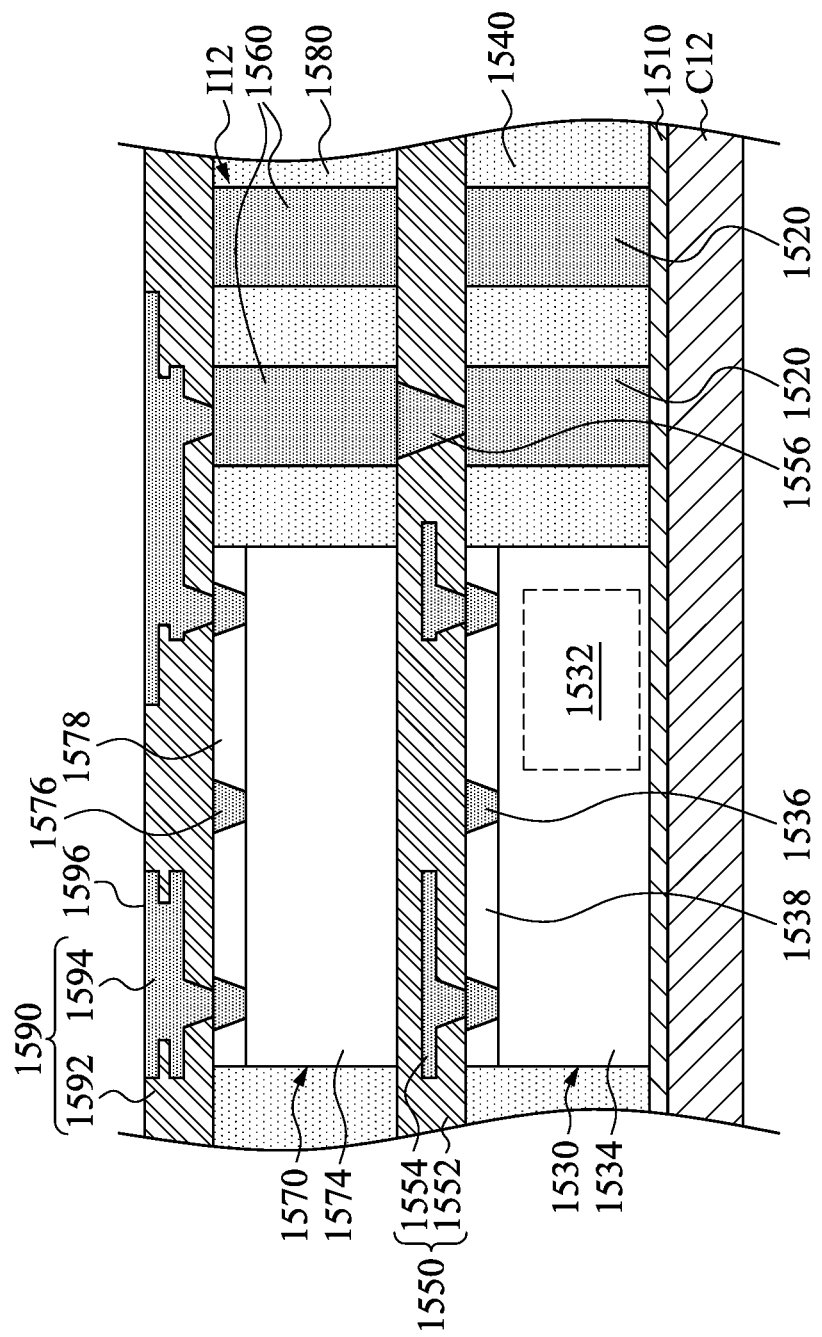

Next, referring to FIG. 118, a second redistribution layer (RDL) 1590 is formed over the second molding material 1580. The second RDL 1590 includes a dielectric structure 1592 and a wiring structure 1594 located in the dielectric structure 1592. The wiring structure 1594 is connected to the conductive pillars 1576 and the second TIV 1560. The wiring structure 1594 may also interconnect the conductive pillars 1576 and some TIVs (not shown) in the second molding material 1580 that do not serve as the inductor I12. In some embodiments, the conductive pillars 1576 and the inductor I12 are not electrically connected by the wiring structure 1594. In alternative embodiments, the conductive pillars 1576 and the inductor I12 are electrically connected by the wiring structure 1594. The second RDL 1590 further includes a contact pad 1596 located on one side of second the second RDL 1590 opposite to the second molding material 1580. The contact pad 1596 is electrically connected to the second semiconductor device 1570 by the wiring structure 1594.

In some embodiments, the formation of one layer of the wiring structure 1594 includes forming a blanket copper seed layer, forming and patterning a mask layer over the blanket copper seed layer, performing a plating to form the wiring structure 1594, removing the mask layer, and performing a flash etching to remove the portions of the blanket copper seed layer not covered by the wiring structure 1594. In alternative embodiments, the second RDL 1590 is formed by depositing metal layers, patterning the metal layers, and filling gaps between separated portions of the wiring structure 1594 with the dielectric structure 1592. The wiring structure 1594 may include a metal or a metal alloy including aluminum, copper, tungsten, and/or alloys thereof. The contact pad 1596 and the wiring structure 1594 and may have substantially the same material. For example, the contact pad 1596 may also include a metal or a metal alloy including aluminum, copper, tungsten, and/or alloys thereof. The dielectric structure 1592 in these embodiments may include a polymer such as polyimide, benzocyclobutene (BCB), polybenzoxazole (PBO), or the like. Alternatively, the dielectric structure 1592 may include non-organic dielectric materials such as silicon oxide, silicon nitride, silicon carbide, silicon oxynitride, or the like. Amount of the layers of the dielectric structure 1592 and the wiring structure 1594 can depend on the routing design of the respective package.

Figure 119:
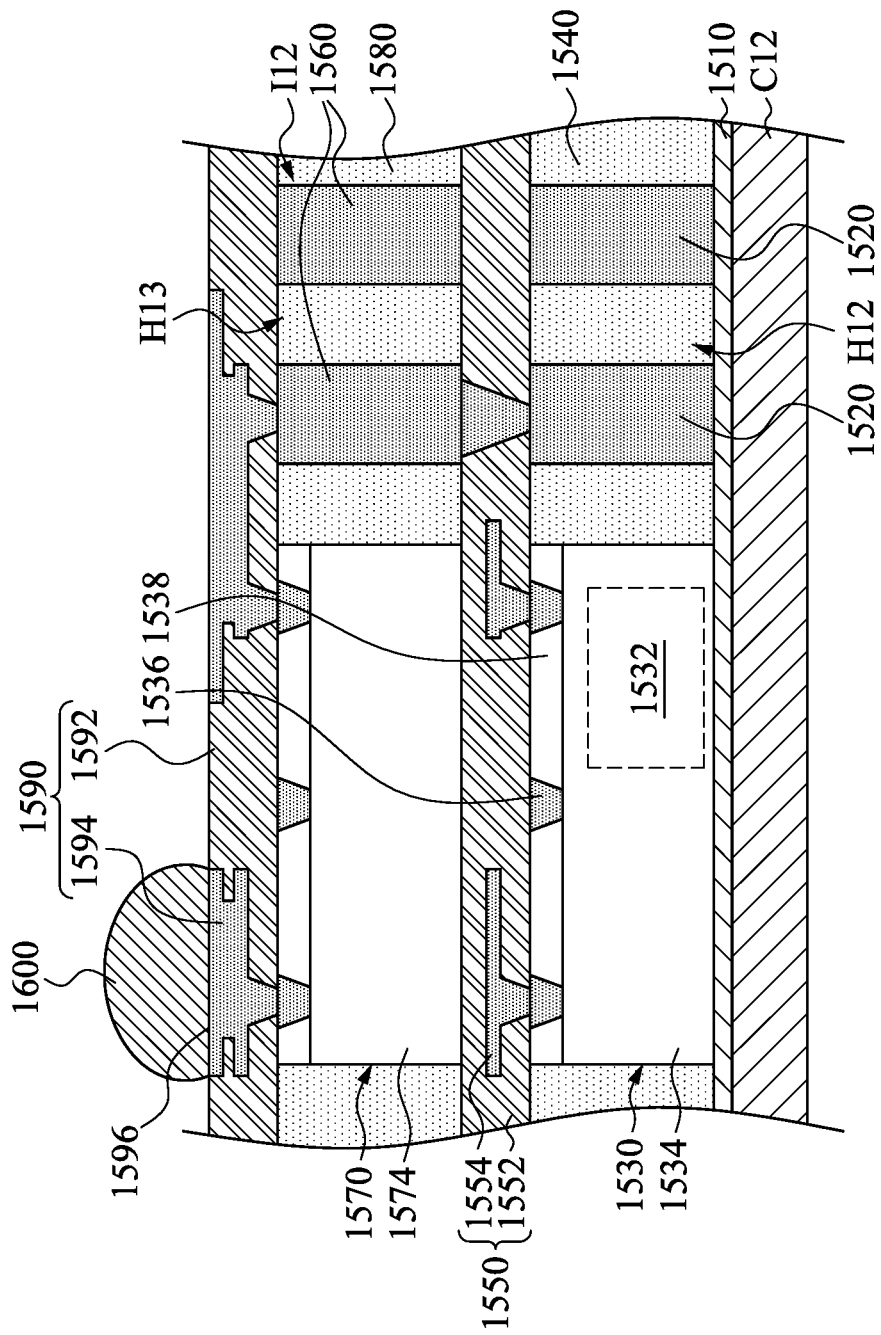
Figure 120:
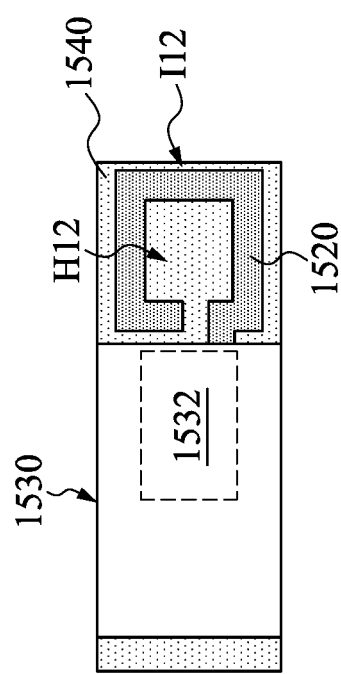

Reference is made to FIG. 119. External connector 1600 is formed on the contact pad 1596 of the second RDL 1590. The external connector 1600 can include, for example, as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof. In some other embodiments, external connectors 1600 on the contact pads 1596 may be conductive balls such as solder balls. These solder balls may be arranged in a grid pattern of rows and columns. The external connectors 1600 may thus form a ball grid array (BGA). The contact pads 1596 of the second RDL 150 under the respective external connectors 160 can therefore be referred to as under-ball metallization (UBM) structures. Afterwards, the package structure may be de-bonded from the carrier C12, and the adhesive layer (not shown) between the buffer layer 1510 and the carrier C12 is also cleaned from the package structure, and then, the package structure may be sawed into a plurality of package structures. A top view of one resulting structure is shown in FIG. 120. A top view of the resulting structure that the buffer layer 1510, the first TIV 1520, the first semiconductor device 1530 and the first molding material 1540 are not shown is illustrated in FIG. 121.

Figure 121:
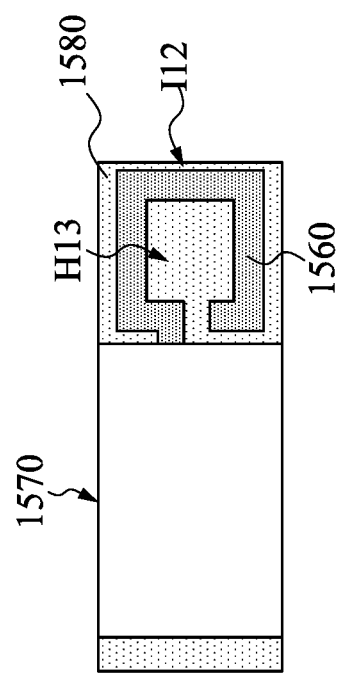

As shown in FIGS. 119 to 121, the inductor I12 includes vertically arranged first and second TIVs 1520 and 1560 that respectively penetrate through the first and second molding materials 1540 and 1580. The through hole H12 of the first TIV 1520 is filled by the first molding material 1540, and the through hole H13 of the second TIV 1560 is filled by the second molding material 1580. The inductor I12 is electrically connected to the first semiconductor device 1530. For example, the inductor I12 and the conductive pillars 1536 of the first semiconductor device 1530 can be electrically connected by the wiring structure 1554 of the first RDL 1550. The first TIV 1520 and the first semiconductor device 1530 are together molded in the first molding material 1540, and the second TIV 1560 is molded in the second molding material 1580, so it may be beneficial to scale down the package structure incorporating with the inductor I12 which is formed by at least the first and second TIVs 1520 and 1560. In the depicted embodiments, the first semiconductor device 1530 is a CPU die with a VR die 1532. In some other embodiments, the second semiconductor device 1570 may be a CPU die with a VR die, and the inductor I12 is electrically connected to the second semiconductor device 1570 by the wiring structure 1594 of the second RDL 1590.

In some embodiments, the inductor includes the TIV that penetrates through the molding material molding the semiconductor device, and therefore, this inductor is advantageous to scale down the package structure incorporating it. In some embodiments, the inductor is connected to the conductive feature exposed on the RDL or protruding with respect to the RDL, and therefore, it is advantageous to reduce a resistance of a current path between the inductor and the semiconductor device. The Q factor of the inductor can thus be improved, and the power conversion efficiency of the voltage regulation vie can thus be increased as well.

According to some embodiments, a package structure includes a first redistribution layer, a first molding material, a semiconductor device and an inductor. The first molding material is located on the first redistribution layer. The semiconductor device is molded in the first molding material. The inductor penetrates through the molding material and electrically connected to the semiconductor device.

According to some embodiments, a package structure includes a first redistribution layer, a semiconductor device, a molding material and an inductor. The semiconductor device is located on the first redistribution layer. The molding material molds the semiconductor device. The inductor includes a plurality of through-vias and a conductive feature. The through-vias penetrate through the molding material. The conductive feature extends laterally over a surface of the first redistribution layer to connect the through-vias.

According to some embodiments, a method of forming a package structure includes forming an inductor including at least one through-via over a carrier, placing a semiconductor device over the carrier, molding the semiconductor device and the through-via in a molding material, and forming a first redistribution layer on the molding material, wherein the inductor and the semiconductor device are electrically connected by the first redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a first redistribution layer;
a first molding material extending along a top surface of the first redistribution layer;
a second molding material extending along a bottom surface of the first redistribution layer;
a first semiconductor die penetrating through the first molding material;
an inductor penetrating through the first and second molding materials and electrically connected to the first semiconductor die,
wherein the first redistribution layer includes a first dielectric structure and a first conductive feature in the first dielectric structure and the first conductive feature is electrically coupled to the first semiconductor die and the inductor; and
a second semiconductor die penetrating through the second molding material, wherein a bottom surface of the second semiconductor die is substantially level with a bottom surface of the inductor.

2. The package structure of claim 1, further comprising a second redistribution layer that extends along a top surface of the first molding material and comprises:
a first contact pad in contact with the inductor; and
a second contact pad in contact with the first semiconductor die, wherein an area of a top surface of the first contact pad is greater than an area of a top surface of the second contact pad.

3. The package structure of claim 1, wherein the first redistribution layer comprises a wiring structure in the first dielectric structure, and the first conductive feature and the inductor are electrically connected by the wiring structure.

4. The package structure of claim 1, further comprising a second redistribution layer that extends along a top surface of the first molding material and comprises:
a second dielectric structure; and
a second conductive feature in the second dielectric structure, wherein the second conductive feature is exposed on one side of the second redistribution layer opposite to the first molding material.

5. The package structure of claim 1, wherein a top surface of the inductor is substantially level with a top surface of the first molding material.

6. The package structure of claim 1, wherein the inductor is a spiral inductor penetrating through the first and second molding materials.

7. The package structure of claim 1, wherein the first conductive feature has a bottom surface coplanar with a bottom surface of the first dielectric structure.

8. The package structure of claim 1, wherein the bottom surface of the inductor is substantially level with a bottom surface of the second molding material.

9. The package structure of claim 1, further comprising a buffer layer extending along a bottom surface of the second molding material and the bottom surface of the inductor.

10. The package structure of claim 1, wherein the inductor does not overlap the first semiconductor die.

11. The package structure of claim 1, wherein the first semiconductor die overlaps with the second semiconductor die.

12. A package structure, comprising:
a first redistribution layer;
a semiconductor die on the first redistribution layer;
a molding material embedding the semiconductor die; and
an inductor comprising first, second, and third through-vias and a conductive feature, wherein the first and second through-vias align with each other in a first direction, the first and third through-vias align with each other in a second direction transverse to the first direction, the first, second, and third through-vias penetrate through the molding material and extend in a third direction transverse to the first and second directions, the conductive feature has a U-shaped cross-section and includes first and second portions embedded in the first redistribution layer, and each of the first and second portions of the conductive feature extends from a respective one of the first and second through-vias.

13. The package structure of claim 12, wherein the inductor is a spiral inductor.

14. The package structure of claim 12, wherein the first redistribution layer comprises:
a dielectric structure; and
a wiring structure in the dielectric structure,
wherein the conductive feature further includes a third portion connecting between the first and second portions and extending laterally over a surface of the dielectric structure.

15. The package structure of claim 12, further comprising:
a second redistribution layer, the molding material being located between the first redistribution layer and the second redistribution layer, wherein the conductive feature of the inductor is located in the first redistribution layer, the second redistribution layer or a combination thereof, and the inductor is a helical inductor.

16. The package structure of claim 12, wherein the inductor has a through hole therein, and the package structure further comprises:
a magnetic film in the through hole and in the first redistribution layer.

17. A package structure, comprising:
a first redistribution layer comprising a first dielectric structure and a first conductive feature in the first dielectric structure;
a second redistribution layer comprising a second dielectric structure and a second conductive feature in the second dielectric structure;
a molding compound extending between the first and second redistribution layers;
a semiconductor die embedded in the molding compound; and
an inductor comprising first, second and third through-vias penetrating through the molding compound and being a helical inductor, wherein the first conductive feature of the first redistribution layer is electrically coupled to the semiconductor die and the inductor, in contact with tops of the first and second through-vias, and spaced apart from the third through-via, and the second conductive feature of the second redistribution layer is in contact with bottoms of the second and third through-vias and spaced apart from the first through-via.

18. The package structure of claim 17, wherein the first conductive feature has a bottom surface coplanar with a bottom surface of the first dielectric structure.

19. The package structure of claim 17, further comprising a dielectric layer extending between the molding compound and the second redistribution layer.

20. The package structure of claim 17, further comprising a dielectric layer extending along a bottom surface of the molding compound and a bottom surface of the semiconductor die.

* * * * *